(12) United States Patent
Nishi

(10) Patent No.: US 6,700,667 B2
(45) Date of Patent: *Mar. 2, 2004

(54) EXPOSURE APPARATUS AND METHOD

(75) Inventor: Kenji Nishi, Yokohama (JP)

(73) Assignee: Nikon Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/347,572

(22) Filed: Jul. 6, 1999

(65) Prior Publication Data

US 2002/0135776 A1 Sep. 26, 2002

Related U.S. Application Data

(63) Continuation of application No. 08/955,297, filed on Oct. 21, 1997, now abandoned.

(30) Foreign Application Priority Data

Oct. 21, 1996 (JP) .............................. 8-277913
Nov. 11, 1996 (JP) .............................. 8-298756

(51) Int. Cl.[7] .................................................. G01B 9/02
(52) U.S. Cl. ................................................... 356/509
(58) Field of Search ............................ 356/363, 500, 356/498, 508, 509, 510

(56) References Cited

U.S. PATENT DOCUMENTS

| | | | |
|---|---|---|---|
| 5,151,749 A | 9/1992 | Tanimoto et al. | 356/375 |
| 5,363,196 A | * 11/1994 | Cameron | 356/500 |
| 5,464,715 A | * 11/1995 | Nishi et al. | 430/22 |
| 5,523,574 A | 6/1996 | Hamada et al. | 250/492.2 |
| 5,523,843 A | 6/1996 | Yamane et al. | 356/363 |
| 5,563,708 A | 10/1996 | Nakai | 356/363 |
| 5,646,413 A | * 7/1997 | Nishi | 250/548 |
| 5,757,160 A | 5/1998 | Kreuzer | 318/649 |
| 5,764,361 A | 6/1998 | Kato et al. | 356/358 |
| 5,790,253 A | * 8/1998 | Kamiya | 356/363 |
| 5,796,469 A | 8/1998 | Ebinuma | 355/53 |

FOREIGN PATENT DOCUMENTS

| | | |
|---|---|---|
| JP | U-59-98446 | 7/1984 |
| JP | 8-203797 | 8/1996 |

* cited by examiner

*Primary Examiner*—Frank G. Font
*Assistant Examiner*—Andrew H Lee
(74) *Attorney, Agent, or Firm*—Morgan, Lewis & Bockius LLP

(57) ABSTRACT

A scanning exposure apparatus and method thereof for maintaining a desired shape of a shot area exposed on a photosensitive substrate where an angle formed by the mirrors of interferometric systems for measuring the position of a stage and/or the angle formed by the running direction of a wafer stage and a reference mark plate is changed. A reticle on a reticle minute drive stage is scanned relative to an illuminated region and a wafer on a Zθ-axis drive stage is scanned relative to an exposure region in synchronization with the scanning of the reticle. Thus, a shot area SA on the wafer is exposed to light carrying a pattern image of the reticle. The angle of rotation of a mirror facing in the non-scanning direction of the Zθ-axis drive stage is calculated based on measurement values of two interferometers. The angle of rotation of a mirror facing in the non-scanning direction of the reticle minute drive stage is calculated based on measurement values of two interferometers. Thus, a relative rotation angle between the wafer and the reticle during scanning exposure is corrected, based on the angles of rotation of the mirrors. A plurality of reference marks also are formed on a reference mark plate, and corresponding alignment marks are formed on the reticle. With the reticle minute drive stage and Zθ-axis drive stage being moved in corresponding scanning directions, positional deviations between the reference marks and alignment marks are measured, and the scanning direction of the reticle is corrected based on these positional deviations.

29 Claims, 15 Drawing Sheets

(a)

(b)

EXPOSURE APPARATUS AND METHOD

This is a continuation of Application No. 08/955,297, filed Sep. 21, 1997, now abandoned.

This Application claims the benefit of Japanese Patent Application Nos. HEI 08-277913 filed Oct. 21, 1996 and HEI 08-298756 filed Nov. 11, 1996, which are hereby incorporated by reference.

BACKGROUND OF THE INVENTION

1. Field of the Invention

The present invention relates to an exposure apparatus and method for transferring a mask pattern onto a photosensitive substrate, in a photolithography process, used in the manufacture of semiconductor devices, image pickup devices (such as CCD), liquid crystal display devices, thin-film magnetic heads. The invention relates more particularly to a scanning exposure type exposure apparatus and method that operates in a step-and-scan mode.

2. Discussion of the Related Art

In the manufacture of semiconductor devices, a step-and-repeat type (one-time exposure type) reduction projection exposure apparatus ("stepper") has been widely used as an exposure apparatus for transferring a pattern of a reticle as a mask onto each of shot areas of a wafer (or a glass plate) coated with a photo-resist. The industry desires the ability for transference of a large area of a circuit pattern with high accuracy, without increasing the burden on the optical projection system. To accomplish this goal a step-and-scan type projection exposure apparatus has been developed wherein the reticle and the wafer are scanned in synchronization with each other, wherein a part of the pattern on the reticle is projected on the wafer through the optical projection system, so that an image of the pattern on the reticle is sequentially transferred onto each shot area on the wafer.

In a conventional aligner, as a prototype of the scanning exposure apparatus, a pattern of the entire area of the reticle is transferred onto the entire area of the wafer. This provides a non-reverse image at a magnification of 1.0 in a one-time scanning exposure operation using a unit-type stage system.

However, in the step-and-scan type exposure apparatus the optical projection system normally projects an image at a certain reduction ratio or magnification that is smaller than 1.0. Therefore a reticle stage and a wafer stage must be driven independent of each other and at a speed ratio that is dependent upon the reduction ratio of the optical system. Since a stepping mode is employed to position one shot area after another in an exposure region, the driving mechanism of the stage system tends to be complicated and to require highly sophisticated control (refer to Japanese laid-open patent publication No. 7-176468, U.S. Pat. No. 5,646,414 for example).

In the conventional step-and-scan type projection exposure apparatus, therefore, the speed and position of each stage are controlled based on measurement values of laser interferometers, as shown in FIG. 10. Referring to FIG. 10(a1) and (a2), a mirror 52X for measuring displacement along the X-axis and a mirror 52Y for measuring displacement along the Y-axis are fixed on a wafer stage 51 on which a wafer W is mounted. A mirror 55X for measuring displacement along the X-axis and a mirror 55Y for measuring displacement along the Y-axis are fixed on a reticle stage 54 on which a reticle R is mounted. If the rectangular coordinate system of the plane on which the wafer W is moved is defined by the X-axis and Y-axis, and the reticle and wafer are scanned during scanning exposure in a direction (Y-direction) parallel with the Y-axis, two measuring laser beams 53Y1, 53Y2 or 56Y1, 56Y2 are incident upon a corresponding one of the Y-axis mirrors 52Y, 55Y of the scanning direction. Also, one measuring laser beam 53X or 56X is incident upon the corresponding X-axis mirror 52X, 55X for the non-scanning direction, so that the position (Y-coordinate) of the stage in the scanning direction is measured by the corresponding two-axis laser interferometric system. The position (X-coordinate) of the stage in the non-scanning direction is measured by the corresponding one-axis laser interferometric system.

In this case, the two-axis laser interferometric system for the scanning direction includes a laser interferometer for measuring yawing. The Y-coordinate in the scanning direction is represented by the average of measurement values of the two-axis laser interferometric system. The angle of rotation of each of the wafer stages 51, on which wafer W rests and on the reticle stage 54 reticle R rests, is measured based on a difference between the Y-coordinates at which the two laser beams are incident upon the corresponding Y-axis mirror. During a scanning exposure operation, the wafer stage 51 and reticle stage 54 are moved in synchronization with each other so that the relationship between the X-coordinate and Y-coordinate of the wafer stage 51 and those of the reticle stage 54 match the projection scale (reduction ratio) of the optical projection system, so that the relative rotation angle of these stages is maintained to a fixed value. Although the optical projection system normally used in the conventional apparatus is adapted to project a reverse image of the reticle pattern on the wafer and thus the wafer stage 51 and reticle stage 54 are scanned in opposite directions, it is assumed, for the sake of simplicity, that a non-reverse image of the reticle pattern is projected and the wafer and reticle stages are both scanned in the Y-direction.

If the reflecting surfaces of the mirrors extend parallel with the X-axis and Y-axis with high degree of accuracy, a scanning exposure operation is performed such that the wafer W on the wafer stage 51 is moved in the Y-direction relative to a slit-like exposure region 58. The reticle R on the reticle stage 54 is then moved in the Y-direction relative to a slit-like illuminated region 57 in synchronization with the movement of the wafer W so that an image of a pattern of the reticle R is transferred onto one of shot areas on the wafer W. The thus exposed shot area SAa has an accurate rectangular shape, as shown in FIG. 10(a3). The shot array formed on the wafer W is in the form of a grid in which the shot areas are arranged along the X-axis and the Y-axis, as shown in FIG. 10(a4).

However, if the mirrors 52X, 52Y are rotated clockwise by an angle θ due to yawing of the wafer stage 51, as shown in FIG. 10(b1), the wafer W is scanned in a direction parallel with the reflecting surface of the mirror 52X (direction that is inclined by the angle θ with respect to the original Y-axis), as indicated by the arrow 60b. The stepping of the wafer W in the non-scanning direction is conducted in a direction parallel with the reflecting surface of the mirror 52Y, as indicated by the arrow 61b. In this case, the rotation of the wafer stage 51 is detected based on the inclination of the mirror 52Y. The reticle stage 54 is also rotated by the angle θ in accordance with the rotation of the wafer stage 51, whereby the reticle R is scanned in the rotated direction, as indicated by the arrow 59b, as shown in FIG. 10(b2), while it is being rotated through angle θ. Accordingly, the shot area (on which the pattern image of the reticle R is transferred) exposed on the wafer W in the scanning exposure operation is rotated, but has an accurate rectangular shape, as represented by shot area Sab, as shown in FIG. 10(b3). The shot array (shown in FIG. 10(b4)) formed on the wafer W is also in the form of a grid (which will be called "rectangular grid") in which the shot areas are arranged in orthogonal directions.

In the conventional step-and-scan type projection exposure apparatus, as described above, the coordinate positions of the wafer stage and reticle stage are measured by the respective laser interferometric systems. Where the X-axis and Y-axis mirrors of the laser interferometric systems have a good orthogonal relationship with each other the exposed shot area has a rectangular shape, even if the wafer stage is rotated due to yawing and the obtained shot array is in the form of a rectangular grid.

However, if the stage or the mirrors of the laser interferometric systems is/are deformed by heat due to changes in atmospheric temperature or an increase in the temperature caused by irradiation with exposure light, and the orthogonal relationship between these mirrors has deteriorated due to such deformation, the exposed shot area may no longer maintain a rectangular shape and the shot array may no longer have a rectangular grid-like shape. This problem is mainly caused because the position of the stage in the scanning direction is conventionally measured by the two-axis laser interferometric system and the angle of rotation of the stage is calculated based on a difference in the measurement values of the two-axis interferometric system. In the examples of FIG. 10, the laser beams emitted by the laser interferometers for measuring yawing of the wafer and reticle stages are incident upon the mirrors 52Y, 55Y for measuring displacement in the scanning direction.

More specifically, FIG. 10 (c1) depicts the case in which the mirror 52X of the wafer stage for measuring displacement in the non-scanning direction, which is not intended for detecting yawing, is inclined by an angle θ. In this case, the wafer W is scanned in a direction parallel with the reflecting surface of the inclined mirror 52X, as indicated by the arrow 60c. However, the reticle R, on reticle stage 54, is scanned in the Y-direction, as shown in FIG. 10(c2), since no change in the angle of rotation of the wafer stage is detected. As a result, the shot area SAc, formed on the wafer W, is in the form of a parallelogram, as shown in FIG. 10(c3), and the shot array is also in the form of a parallelogram, as shown in FIG. 10(c4).

FIG. 10(d1) shows the case in which the mirror 52Y of the wafer stage for measuring displacement in the scanning direction and detecting yawing is inclined by an angle θ. In this case, the wafer W is scanned in the Y-direction. However, the reticle R is scanned in a direction that is inclined by the angle θ as indicated by the arrow 59d, as shown in FIG. 10(d2), while it is being rotated by an angle θ with respect to the original Y-axis, since a change in the angle of rotation of the wafer stage is detected. As a result, the shot area SAd formed on the wafer W assumes a shape formed by rotating a parallelogram by 90°, as shown in FIG. 10(d3), and the shot array also assumes a similar shape, as shown in FIG. 10(d4).

An error in the shot array, as shown in FIG. 10(c4) or (d4), which is a linear error (first-order error), may be substantially corrected at the time of exposure by performing so-called enhanced global alignment (EGA). EGA calculates the shot array by statistic processing and conducting stepping of the wafer stage based on the calculated shot array.

However, the shot area is deformed. For example, in the shot areas SAc, SAd an image formed on the wafer W becomes equivalent to an image that is laterally shifted by approximately D·θ in the non-scanning direction during scanning exposure. D represents the Y-direction width of the slit-like exposure region 58 of FIG. 10(a1) and θ (measured in rads) represents the angle of rotation of the mirror, resulting in a deterioration of the image.

Even if the shot region that is deformed, as in the shot area SAc or SAd, is subjected to overlap exposure by a one-time exposure-type apparatus, such as a stepper in a so-called mix-and-match mode, corrections for the thus deformed shot areas cannot be made in the one-time exposure-type apparatus. Thus, the deformed shot area involves a distortion error that results in reduced matching accuracy.

The shape of the exposed shot area is undesirably distorted not only when inclination of a mirror of the laser interferometric system is changed, but also when the mirror is deflected or warped along the scanning direction.

In a conventional method for reducing such deterioration of the image a reference mark plate, on which certain reference marks are formed, is fixed on the wafer stage. Relative rotation angles between the reference marks of the reference mark plate and alignment marks on the reticle are measured periodically (upon replacement of wafers, for example). The angle of rotation of the reticle is then corrected based on the results of the measurements. If an angle formed by the reference mark plate and the running direction of the wafer stage, which is determined by the mirror of the laser interferometer, is changed due to thermal deformation of the wafer stage, the rotation angle of the reticle may not be accurately corrected, thereby causing deformation of the exposed shot area.

Where the EGA type alignment is performed, the positions of the alignment marks (wafer marks) affixed on certain shot areas on the wafer need to be detected by means of an alignment sensor. In order to position each shot area on the wafer with respect to the pattern image of the reticle with high accuracy, based on the results of detection of the alignment sensor, a base line parameter is periodically calculated. The base line parameter is a spacing between a reference point (such as the center of detection) of the alignment sensor and a reference point (such as the center of exposure) of the image transferred on the wafer. The calculation is made using the reference mark plate, and is then stored. The results of the alignment sensor are corrected based on the base line parameter. The periodic measurement of the base line parameter is called an "interval base line check". The base line parameter is substantially varied if the angle formed by the reference mark plate and the running direction of the wafer stage that is determined by the mirror of the laser interferometer is changed due to thermal deformation, for example, thus causing an increased overlap error.

Accordingly, there is a need for an improved exposure apparatus and method of operation thereof to overcome the above enumerated problems.

SUMMARY OF THE INVENTION

A first object of the present invention is to provide a scanning exposure apparatus that is able to maintain a desired shape of a shot area, exposed on a photosensitive substrate, even when the angle formed by mirrors of interferometric systems for measuring the position of a stage is changed.

A second object of the present invention is to provide a scanning exposure apparatus that is able to maintain a desired shape of a shot area, exposed on a photosensitive substrate, even when the mirror of the interferometric system is deflected or curved.

A third object of the present invention is to provide an exposure method that can prevent distortion of the exposed shot area on the wafer, or form the shot array on the wafer into a rectangular grid-like shape, even if a relative angle between the running direction of the wafer stage and the reference mark plate used for detecting the rotation angle of the reticle is changed.

A fourth object of the present invention is to provide an exposure method in which the baseline parameter of the alignment sensor can be measured with a high accuracy, even if the relative angle between the running direction of the wafer stage and the reference mark plate used for measuring the base line amount is changed.

A fifth object of the present invention is to provide an exposure method in which the relative angle between the running direction of the wafer stage and the reference marks used for measuring the base line amount of the alignment sensor is less likely to be changed, whereby the base line amount can be measured with high accuracy.

With reference to FIG. 1 and according to the first aspect of the present invention, a scanning exposure apparatus is provided. The apparatus has a mask stage 9–11 that moves a mask 12 onto which a pattern to be transferred is formed, and a substrate stage 1–4 that moves a photosensitive substrate 5. The substrate 5 on the substrate stage is scanned in a predetermined scanning direction while the mask is being illuminated by an exposure light. The mask 12 on the mask stage includes at a least one-axis interferometric system 13Y1, 7Y disposed on the side of the substrate for measuring the position of the substrate in the Y-scanning direction, a two-axis interferometric system 13X1, 13X2, 7X disposed on the side of the substrate for measuring the position of the substrate stage in a X-non-scanning direction that is perpendicular to the scanning direction at two points of the substrate stage which are spaced apart in the scanning direction, and a rotation angle correcting means 22D, 44R, 44L for correcting a relative rotation angle of the substrate stage and the mask stage based on measurement values of the two-axis interferometric system.

According to the present invention, the two-axis interferometers 13X1, 13X2 are configured to oppose mirror 7X of the non-scanning direction of the substrate stage for moving the substrate 5, so as to determine the coordinate of the stage in the non-scanning direction, based on the average of measurement values of the two-axis interferometers. At the same time, the yawing amount (angle of rotation) of the substrate stage in the non-scanning direction is obtained by calculating the difference between these measurement values. The mask 12 is rotated based on the yawing amount. The angle of rotation of the mask stage may be also calculated from a difference of the measurement values of a two-axis interferometric system disposed in one of either the scanning or the non-scanning direction.

If the angle of the mirror 7X for detecting the position of the substrate stage in the non-scanning direction is changed, as shown in FIG. 3(c1)–(c4), the substrate 5 and mask 12 are scanned while being inclined at the same angle. Therefore, the shot area SA3, exposed on the substrate 5, experiences a rotation but still retains its rectangular shape. If the angle of mirror 7Y for detecting the position of the substrate stage in the scanning direction is changed, as shown in FIG. 3(d1)–(d4), the substrate 5 and mask 12 are scanned without being inclined and, therefore, the shot area SA4 exposed on the substrate 5 retains its rectangular shape. According to the present invention, the substrate 5 and mask 12 are always scanned in the same direction and the shot area exposed on the substrate 5 maintains a desired or target shape.

Even if the shot area has the desired shape, the shot array is not always in the form of a rectangular grid (in which the shot areas are arranged in orthogonal directions), as shown in FIG. 3(c4) and (d4). For the shot array to take on the form of a rectangular grid-like shape, it is desirable that a one-axis interferometric system 13Y2, 7Y be further disposed on the side of the substrate that cooperates with a one-axis interferometric system 13Y1, 7Y to measure the position of the substrate stage in the scanning direction. The measurements are taken at two points along the substrate stage spaced in the non-scanning direction. Moving direction correcting means 22A, 22B are provided for correcting the moving direction of the substrate stage. The correction is based on the difference between the measurement values of the two-axis interferometric system 13X1, 13X2, 7X, that measures the position of the substrate stage in the non-scanning direction, and the difference between the measurement values of the two-axis interferometric system 13Y1, 13Y2, 7Y, that measures the position of the substrate stage in the scanning direction.

If the stepping direction of the substrate stage in the non-scanning direction is corrected using the difference between the yawing amount measured in the non-scanning direction and the yawing amount measured in the scanning direction, the shot array takes on a rectangular grid-like shape, as indicated by the dotted line in FIGS. 3(c4) or (d4).

Analysis will now relate to when one of the mirrors 21X, 21Y positioned on one side of the mask stage, as shown in FIG. 4, is inclined and its orthogonal relationship is altered. In this case, there is also a possibility that the exposed shot area does not take on a rectangular shape if the position of the mirror 21Y, for detecting displacement of the mask stage in the scanning direction, is measured by a two-axis interferometric system and the control of angle of rotation of the mask stage is based on the difference between the measurement values of the two-axis interferometric system, as in the conventional case.

FIGS. 4(a2), (b2) and FIGS. 5(a2), (b2), respectively, depict the case where two-axis interferometers are configured to oppose mirror (21Y) in the scanning direction of the mask stage and a one-axis interferometer is disposed to oppose mirror (21X) in the non-scanning direction. FIGS. 4(a1) and (a2) depict the case where the position of the substrate stage, in the non-scanning direction, is measured by a two-axis interferometric system in the same manner as in the scanning exposure apparatus according to the first aspect of the present invention. FIGS. 5(a1) and (a2) depict the case where the position of the substrate stage in the scanning direction is measured by a two-axis interferometric system, as in the conventional case.

In these cases, if the mirror 21Y of the mask stage is inclined by the angle θ with respect to the mask 12, as shown in FIG. 4(a2) and FIG. 5(a2), the mirror 21Y is brought parallel with the substrate stage. Therefore, the mask 12 is scanned in the direction indicated by the arrow 37a, 38a, respectively, while being rotated or inclined with respect to the scanning direction of the substrate 5. Accordingly, the exposed shot area SA5, SA7 takes on the shape of a parallelogram rotated 90°. If the mirror 21X is inclined by the angle θ with respect to the mask 12, as shown in FIG. 4(b2) or FIG. 5(b2), the mask 12 is scanned with the mirror 21Y being parallel with the substrate stage. Therefore, the scanning direction of the mask 12 is inclined, with respect to the scanning direction of the substrate 5 as indicated by the arrow 37b, 38b, respectively, and the exposed shot area SA6, SA8 has the form of a parallelogram.

To prevent such deformations of the shot area, a scanning exposure apparatus according to the second aspect of the present invention is provided which has a mask stage 9–11 that moves a mask 12 on which a pattern to be transferred is formed. A substrate stage 1–4 moves a photosensitive substrate 5, wherein the substrate on the substrate stage is scanned in a predetermined scanning direction (Y-direction) while the mask 12 is being illuminated by an exposure light. The mask 12, on the mask stage, is scanned in the predetermined scanning direction in synchronization with the scanning of the substrate so that the pattern on mask 12 is successively formed on substrate 5.

The scanning exposure apparatus includes a two-axis interferometric system 13X1, 13X2, 7X disposed along one side of the substrate for measuring a position of the substrate stage, in a non-scanning direction (X-direction) perpendicular to the scanning direction, at two points on the substrate stage, which are spaced apart along the scanning direction. The apparatus also includes a two-axis interferometric system 14X1, 14X2, 21X disposed along one side of the mask for measuring a position of the mask stage, in the non-scanning direction (X-direction) perpendicular to the scanning direction, at two points on the mask stage, which are spaced apart along the scanning direction. The apparatus further includes rotating angle correcting means 22D, 44R, 44L for correcting a relative rotation angle between the substrate stage and the mask stage based on measurement values of the two-axis interferometric system along one side of the substrate, and the two-axis interferometric system on the side of the mask.

In summary, the scanning exposure apparatus according to the first aspect of the present invention corrects the relative rotation angle between the substrate stage and the mask stage based on measurement values of the two-axis interferometric system disposed on the side of the substrate for measuring displacement of the substrate stage in the non-scanning direction, so that the substrate stage and mask stage are moved or scanned in parallel, even if the angle formed by mirrors of the interferometric systems on the side of the substrate is altered. Accordingly, the shot area exposed on the photosensitive substrate can advantageously maintain a desired shape (i.e., a rectangular shape). This results in an avoidance of alteration of an image due to distortion of the shape of the shot area and reduces the matching error between the shot area and the exposure apparatus of the one-time exposure type.

The above exposure apparatus further includes a one-axis interferometric system, disposed on the side of the substrate, for measuring a position of the substrate stage in the scanning direction at two points spaced apart in the non-scanning direction. Also included is moving direction correcting means for correcting the moving direction of the substrate stage, based on the difference between of measurement values of the two-axis interferometric system for measuring the position of the substrate in the non-scanning direction. A difference in the measurement values of the two-axis interferometric system for measuring the position of the substrate in the scanning direction, and the stepping direction of the substrate stage in the non-scanning direction, may be corrected so that the shot array formed on the photosensitive substrate has a rectangular grid-like shape. This will further reduce the matching error.

According to the second aspect of the present invention, the position of mirror 7X in the non-scanning direction of the substrate stage is measured by a two-axis interferometric system, and the position of mirror (21X) in the non-scanning direction of the mask stage is measured by a two-axis interferometric system, as shown in FIG. 7. In this arrangement the yawing amount of the substrate stage is obtained from the difference of the measurement values at two points along the mirror 7X and the angle of rotation of the mask stage is obtained from the difference of the measurement values at two points along the mirror 21X. Accordingly, even if the mirror 21Y, in the scanning direction or the mirror 21X, in the non-scanning direction along one side of the mask stage, is inclined with respect to the mask 12, as shown in FIG. 7(*a*2) or (*b*2), the scanning direction of the mask 12 is parallel to the scanning direction of the substrate 5. Thus, the exposed shot area SA13, SA14 has a rectangular shape even if shot rotation occurs.

In summary, the scanning exposure apparatus according to the second aspect of the present invention corrects the relative rotation angle between the substrate stage and the mask stage based on measurement values of the two-axis interferometric system disposed on the side of the substrate, for measuring the position of the substrate stage in the non-scanning direction, and measurement values of the two-axis interferometric system disposed on the side of the mask for measuring the position of the mask stage in the non-scanning direction. In this arrangement the substrate stage and mask stage can be moved in parallel for scanning of the substrate and mask, even if the angle formed by the mirrors of the interferometric systems on the side of the mask is altered. Accordingly, the shot area exposed on the photosensitive substrate can advantageously maintain a desired shape (such as a rectangular shape).

According to the third aspect of the present invention, a scanning exposure apparatus is provided, having a mask stage 9–11, which moves a mask 12, onto which a pattern to be transferred is formed, and a substrate stage 1–4, which moves a photosensitive substrate 5. The substrate 5, on the substrate stage, is scanned in a predetermined scanning direction (Y-direction) while the mask 12 is being illuminated by an exposure light. The mask 12 on the mask stage is scanned in the direction (Y-direction), corresponding to the predetermined scanning direction, in synchronization with the scanning of the substrate so that a pattern on the mask 12 is successively formed on the substrate 5.

The scanning exposure apparatus includes a first two-axis interferometric system 14Y1, 14Y2, 21Y for measuring a position of one of either the substrate stage or the mask stage, in the scanning direction at two points that are spaced apart in a non-scanning direction perpendicular to the scanning direction. Also included is a second two-axis interferometric system 14X1, 14X2, 21X, for measuring a position of one of either the substrate stage or the mask stage in the non-scanning direction at two points that are spaced apart in the scanning direction, a mirror deflection amount calculating means 22A for detecting an angle of rotation of the corresponding substrate stage or mask stage based on a difference of measurement values of the first two-axis interferometric system, and for calculating an amount of deflection of a mirror 21X for the second two-axis interferometric system based on the detected angle of rotation and a difference of measurement values of the second two-axis interferometric system.

According to the third aspect of the invention, when the two-axis interferometric system 14Y1, 14Y2, 21Y is disposed for measuring the position of the mask stage in the scanning direction and the two-axis interferometric system 14X1, 14X2, 21X is disposed for measuring the position of the mask stage in the non-scanning direction, the mask 12 is scanned along a curve if the mirror 21X, of the interferometric system for the non-scanning direction is deflected or warped, as shown in FIG. 9. This may cause distortion of the exposed shot area. In view of this problem, a difference of the measurement values of the two-axis interferometric system for the scanning direction is maintained at a fixed value when the mask stage is moved in the scanning direction, so as to prevent the occurrence of yawing of the mask stage. In this state, a difference in the measurement values of the two-axis interferometric system, for the non-scanning direction, is monitored so as to measure the curved shape or deflection of the mirror 21X, for the non-scanning direction. In actual scanning exposure operations, the measurement values of the two-axis interferometric system are corrected by the thus measured amount of deflection of the mirror 21X, so that the mask stage can be linearly moved in the scanning direction and a shot area approaching that of a rectangular shape is exposed.

In a preferred embodiment, the scanning exposure apparatus of the present invention further includes measuring means 6, 19, 20 for measuring a positional relationship between the mask 12 and the substrate stage when a difference in measurement values of a two-axis interferometric system for measuring the position of one of the substrate stage and the mask stage, in a non-scanning direction perpendicular to the scanning direction, exceeds a predetermined threshold value. If the difference in the measurement values of the two-axis interferometric system exceeds the predetermined threshold value, it is probably because the angle of inclination of the mirror for the interferometric system is altered due to thermal deformation. Since the positional relationship between the mask 12 and the substrate 5 can be corrected by re-measuring the positional relationship between them, an error in the shape of the exposed shot area can be reduced. Therefore, the amount of deflection of the mirror can also be measured again, since the deflection amount of the mirror is also capable of being altered.

In summary, the scanning exposure apparatus according to the third aspect of the present invention detects the angle of rotation of one of the substrate stage or mask stage based on a difference of the measurement values of the first two-axis interferometric system for the relevant stage. The amount of deflection of a mirror for the second two-axis interferometric system is calculated based on the detected angle of rotation and a difference of the measurement values of the second two-axis interferometric system. Thus, the deflection amount of the mirror can be accurately detected even upon the occurrence of yawing in the one stage case. In the actual scanning exposure operation, therefore, the stage can be moved in a desired direction for accurate scanning with the deflection amount of the mirror being corrected or canceled. The shot area exposed on the photosensitive substrate can advantageously maintain a desired shape.

The above scanning exposure apparatus further includes measuring means for measuring the positional relationship between the mask and the substrate stage. When a difference of the measurement values of the two-axis interferometric system, for measuring the position of one of the substrate stages and the mask stages in a non-scanning direction perpendicular to the scanning direction, exceeds a predetermined threshold value an error or errors in the shape of a shot area on the photosensitive substrate is advantageously reduced.

The fourth aspect of the present invention, as depicted in FIGS. 10, 11, 13, and 14, provides scanning exposure method for sequentially transferring a pattern on a mask 12 onto each shot area on a photosensitive substrate 5, by scanning the mask 12 and the substrate 5 in synchronization with each other in their corresponding scanning directions while a part of the pattern on the mask 12 illuminated by an exposure light is projected on the substrate on a substrate stage 1–4. A plurality of measurement marks 29A, 29D are formed on the mask 12 along the scanning direction thereof, and a reference mark member 6 on which a plurality of reference marks 35A, 35D are formed, is disposed on the substrate stage, the reference marks having substantially the same positional relationship with the plurality of measurement marks. The exposure method includes a first step of successively measuring a positional deviation of each of the plurality of measurement marks 29A on the mask 12 from a corresponding one of the plurality of reference marks 35A, 35D on the reference mark member while moving the substrate stage in the scanning direction thereof, and detecting a relative rotation angle $\theta 1$ between a direction of an array of the plurality of reference marks 35A, 35D and a running direction of the substrate stage, based on results of the measurement. A second step of the method is successively measuring a positional deviation of each of the plurality of measurement marks 29A, 29D on the mask from a corresponding one of the reference marks 35A, 35D on the reference mark member 6 while moving the mask 12 and the substrate 5 in synchronization with each other in the corresponding scanning directions, and detecting a relative rotation angle $\theta 2$ between the scanning direction of the mask 12 and the scanning direction of the substrate stage, based on results of the measurement. A stepping direction of the substrate stage is determined based on information of the relative rotation angle $\theta 1$, and the scanning direction of the mask 12 is determined based on information of the relative rotation angle $\theta 2$.

According to the fourth aspect of the present invention, the relative rotation angle $\theta 1$, detected when the substrate stage is scanned while the mask 12 is fixed, is a relative angle formed between the direction of the array of the reference marks 35A, 35D, i.e., the longitudinal direction of the reference mark plate 6, and the running direction of the substrate stage during scanning exposure. When the substrate stage is being scanned along the reference mark plate 6, the relative rotation angle $\theta 2$ detected when the mask 12 is moved in the corresponding scanning direction in synchronization with the substrate stage there is a rotation error observed in the scanning directions of the substrate and mask stages. Even if the angle between the substrate stage, and the reference mark member 6 is altered due to thermal deformation of the stage the substrate stage is stepped from one shot area to the next in the direction of the array of the reference marks on the reference mark member 6, or a direction perpendicular to this direction so that the shot array formed on the substrate 5 has a rectangular grid-like shape. Furthermore, the substrate stage is scanned along the reference mark plate 6 and the mask 12 is scanned along the reference mark plate 6, whereby a rectangular shot area can be formed.

In summary, in the exposure method according to the fourth aspect of the present invention, the stepping direction of the substrate stage is determined depending upon the relative rotation angle $\theta 1$ between the direction in which a plurality of reference marks are arranged on the reference mark plate (longitudinal direction of the reference mark plate) and the running direction of the substrate stage (wafer stage). Therefore, even if the relative angle between the running direction of the substrate stage and the reference mark plate is changed, the shot array on the substrate can be formed into a rectangular grid-like shape. Additionally, since the relative rotation error of the mask is determined depending upon the relative rotation angle $\theta 2$ between the scanning direction of the mask and the scanning direction of the substrate stage, the distortion of the exposed shot area on the substrate may be reduced by correcting this relative rotation error.

A scanning exposure method according to the fifth aspect of the present invention includes the same first and second steps as in the scanning exposure method according to the third aspect of the invention. In this exposure method, an angle of rotation of the mask 12 is corrected based on a difference between the relative rotation angle θ1 and the relative rotation angle θ2, the angles being obtained in the first and second steps.

According to the fifth aspect of the present invention, the relative rotation angle θ2, measured when the mask 12 and substrate 5 are moved in the corresponding scanning directions in synchronization with each other, is represented by Δθ+θ1, where Δθ represents a relative rotation error of the mask 12 with respect to the reference mark member (6). Namely, the relative rotation error Δθ of the mask 12 with respect to the reference mark member 6 is represented by θ2−θ1. Even when the angle between the substrate stage and the reference mark member 6 is changed due to thermal deformation of the stage, the relative rotation error Δθ is measured according to the present invention, and the rotation angle of the mask 12 is corrected by −Δθ. Thus, the rotation angle of the mask 12 matches the reference mark plate 6. Consequently, the exposed shot area on the substrate 5 has a rectangular shape.

In summary, in the exposure method according to the fifth aspect of the present invention, the angle of rotation of the mask is corrected based on the relative rotation angle θ1 and the relative rotation angle θ2. Therefore the distortion of the exposed shot area on the substrate can be reduced even if the relative angle between the running direction of the substrate stage and the reference mark plate is changed.

A scanning exposure method according to the sixth aspect of the present invention includes the same first step as the scanning exposure method according to the fourth aspect of the invention. In the second step of the sixth exposure method, a positional deviation of each of the plurality of measurement marks 35A on the mask 12 from a corresponding one of the plurality of reference marks 29A, 29D on the reference mark member 6 while scanning the mask 12 in the scanning direction is successively measured. A relative rotation angle θ3 between a direction of an array of the plurality of measurement marks 29A, 29D and a running direction of the mask 12 is detected based on results of the measurement. In a scanning exposure operation, a position of the substrate stage is corrected based on information of the relative rotation angle θ1, and a position of the mask is corrected based on information of the relative rotation angle θ3.

According to the sixth aspect of the invention, the relative rotation angle θ1 detected in the first step is an angle of inclination of the running direction of the substrate stage with respect to the reference mark member 6. The relative rotation angle θ3 detected in the second step is an angle of inclination of a pattern of the mask 12 with respect to the running, direction of the mask 12. Once the scanning exposure process has begun, the position of the substrate stage is gradually shifted so that the substrate stage is scanned along the reference mark member 6. The scanning direction of the substrate stage becomes parallel with the longitudinal direction of the reference mark member 6, and the position of the mask 12 is gradually shifted so that the mask 12 is scanned along the pattern of the mask 12. This results in a reduction in the distortion of the exposed shot region on the substrate 5.

In summary, in the exposure method according to the sixth aspect of the present invention, the rotation angle θ3 of the running direction of the mask with respect to the direction of the array of the measurement marks is detected in addition to the relative rotation angle θ1. The position of the substrate stage during scanning exposure is corrected based on the information of the relative rotation angle θ1, while the position of the mask during scanning exposure is corrected based on the information of the relative rotation angle θ3. Accordingly, the distortion of the exposed shot region on the substrate can be reduced even if a relative angle between the running direction of the substrate stage and the reference mark plate is changed.

The seventh aspect of the present invention provides a scanning exposure method for sequentially transferring a pattern on a mask 12 onto each shot area on a photosensitive substrate 5 by scanning the mask 12 and the substrate 5 in synchronization. The sequence involves the transfer in corresponding scanning directions while a part of the pattern on the mask 12, illuminated by exposure light, is projected on the substrate 5, on a substrate stage 1–4, through a optical projection system 8. An off-axis alignment system 34 is provided in the vicinity of the optical projection system 8 for detecting a positioning mark on the substrate. A plurality of measurement marks 29A, 29D are formed on the mask along the scanning direction thereof, while a reference mark member 6, on which first and second reference marks 35A, 37A are formed, is provided on the substrate stage.

The first and second reference marks are spaced apart from each other by a distance corresponding to a spacing between a reference point in an exposure field of the optical projection system 8 and a reference point of the off-axis alignment system 34. The scanning exposure apparatus method includes the steps of moving the mask 12 in the scanning direction thereof while the second reference mark 37A on the reference mark member is observed by the off-axis alignment system 34, and successively measures a positional deviation of each of the plurality of measurement marks 29A, 29D on the mask from the first reference mark 35A on the reference mark member 6. Calculating the spacing (base line parameter) between the reference point in the exposure field of the optical projection system 8 and the reference point of the off-axis type alignment system 34 is then performed. Based on an average value of the positional deviation of each of the plurality of measuring marks 29A, 29D from the first reference mark 35A, a relative rotation error of the mask 12, with respect to the scanning direction thereof, is calculated based on the positional deviation of each measurement mark and a shift of the second reference mark 27A observed by the alignment system.

According to the seventh aspect of the present invention, a positional deviation ΔB2 of the second reference mark 37A observed by the off-axis alignment system 34 is measured at the same time as the measurement of the relative rotation error θ3 between the direction in which the measurement marks 29A, 29D are arranged on the mask 12, which is the direction of a transferred image of the mask pattern, and the running direction of the mask 12, based on the reference mark member 6. The base line amount of the alignment system 34 is then calculated based on these measurement values. Thus, the base line parameter can be measured with high accuracy on the basis of the reference mark member 6, even if the angle of the reference mark member 6 relative to the substrate stage is changed due to deformation of the substrate stage.

In summary, in the exposure method according to the seventh aspect of the present invention, the relative rotation error between the direction of the array of the measurement marks on the mask and the running direction of the mask can be measured using the first reference marks on the reference mark member (reference mark plate). Furthermore, since the base line parameter of the alignment system is measured using the first and second reference marks on the reference mark member (reference mark plate), the base line parameter can be measured with a high accuracy even when the relative angle between the running direction of the substrate stage and the reference mark member is changed.

The eighth aspect of the present invention provides a scanning exposure method for sequentially transferring a pattern on a mask 12 onto each shot area on a photosensitive substrate 5. The method includes scanning the mask 12 and the substrate 5 in synchronization in corresponding scanning directions, while a part of the pattern on the mask 12 illuminated by exposure light is projected on the substrate 5, on a substrate stage 1–4, through an optical projection system 8. An off-axis alignment system 34 is provided in the vicinity of the optical projection system 8, for detecting positioning marks on the substrate, and a plurality of measurement marks 29A, 29D are formed on the mask 12 along the scanning direction thereof. A reference mark member 6 is provided on the substrate stage 1–4, the reference mark member 6 having a plurality of first reference marks 35A, 35D corresponding to the plurality of measurement marks on the mask, and a plurality of second reference marks 37A, 37D that are spaced from the respective first reference marks by a distance corresponding to a spacing between a reference point in an exposure field of the optical projection system 8 and a reference point in the alignment system 34. The scanning exposure apparatus method further includes the steps of measuring a positional deviation of one of the plurality of measurement marks 29A, 29D on the mask from a corresponding one of the first reference marks 35A, 35D on the reference mark member 6, and at the same time measuring positional deviations of the second reference marks 37A, 37D by the off-axis alignment system 34. These steps are performed while moving the mask 12 and the substrate 5 in synchronization in the corresponding scanning directions. The first step is repeated with respect to each of the plurality of first reference marks 35A, 35D on the reference mark member 6. A second step of correcting a relative rotation error between the corresponding scanning directions of the mask 12 and the substrate 5, based on the positional deviation obtained with respect to each of the plurality of first and second reference marks is performed. A further step is correcting a relative rotation angle between a direction of an array of the first and second reference marks on the reference mark member 6 and the scanning direction of the substrate stage.

According to the eighth aspect of the present invention, the base line parameter of the off-axis alignment system 34 is measured at the same time as the second step of the exposure method according to the third aspect of the present invention is executed. Based on the results of the measurement, the scanning direction of the substrate stage is corrected on the basis of the reference mark member 6. The scanning direction of the mask 12 is corrected in relation to the corrected scanning direction of the substrate stage. Accordingly, even where the relative angle between the running direction of the substrate stage and the reference mark plate for measuring the rotation angle of the mask 12 and base line parameter of the off-axis alignment system 34 is changed, the distortion of the exposed shot area can be reduced, and the base line parameter of the alignment system 34 can be measured with a high accuracy.

In summary, in the exposure method according to the eighth aspect of the present invention, the relative rotation angle between the corresponding scanning directions of mask and substrate is corrected, and the relative rotation angle between the direction in which the first and second reference marks are arranged on the reference mark member and the scanning direction of the substrate stage is also corrected, based on positional deviations obtained with respect to the respective first and second reference marks on the reference mark member. Accordingly, the distortion of the exposed shot area on the substrate can be advantageously reduced.

The ninth aspect of the present invention provides an exposure method for sequentially transferring a pattern on a mask 12 onto each area on a photosensitive substrate 5. The method involves scanning the mask 12 and the substrate 5 in synchronization in their corresponding scanning directions while a part of the pattern on the mask illuminated by exposure light is projected on the substrate on a substrate stage 1–3, 4A through an optical projection system 8.

An off-axis alignment system 34 is provided in the vicinity of the optical projection system 8, for detecting positioning marks on the substrate 5, and a mirror 41X for measuring a coordinate position is fixed to the substrate stage. At the same time, a plurality of measurement marks 29A, 29D are formed on the mask 12 along the scanning direction thereof, a plurality of first reference marks 35A, 35D corresponding to the plurality of measurement marks on the mask are formed on an upper face of the mirror 41X, and a plurality of second reference marks 37A, 37D are formed with a spacing from the respective first reference marks. The spacing corresponds to a spacing between a reference point in an exposure field of the optical projection system 8 and a reference point of the alignment system 34.

The scanning exposure apparatus method includes the steps of measuring a positional deviation of one of the plurality of measurement marks 29A, 29D on the mask 12 from a corresponding one of the first reference marks 35A, 35D on the mirror 41X. At the same time positional deviations of the second reference marks 37A, 37D are measured by the alignment system 34 while moving the mask 12 and the substrate 5 in synchronization in the corresponding scanning directions. The first step is repeated with respect to each of the plurality of first reference marks 35A, 35D on the mirror 41X. The method further includes a second step of correcting a relative rotation error between the corresponding scanning directions of the mask 12 and the substrate 5, based on the positional deviation obtained with respect to each of the plurality of first and second reference marks, and correcting the spacing (base line amount) between the reference point in the exposure field of the optical projection system 8 and the reference point of the alignment system 34.

According to the ninth aspect of the present invention, upon measurement of the base line parameter, the scanning direction of the mask 12 is corrected based on the first reference marks 35A, 35D on the mirror 41X that also serves as a reference mark plate. Since the mirror (41X) serves both as a mirror for a laser interferometer and the reference mark plate, and the running direction of the substrate stage is parallel to the reflecting surface of the mirror 41X, the angle of inclination of the reference marks with respect to the running direction of the substrate stage is unlikely to change. Accordingly, the base line parameter can be measured with high accuracy and the exposed shot area is less likely to be distorted.

It is to be understood that both the general description above, and the following detailed description are explanatory and are intended to provide further explanation of the invention as claimed.

BRIEF DESCRIPTION OF THE DRAWINGS

The accompanying drawings, which are included to provide a further understanding of the invention are incorporated in and constitute a part of this specification, illustrate embodiments of the invention and together with the description serve to explain the principles of the invention. In the drawings.

DETAILED DESCRIPTION OF THE PREFERRED EMBODIMENTS

Figure 1:
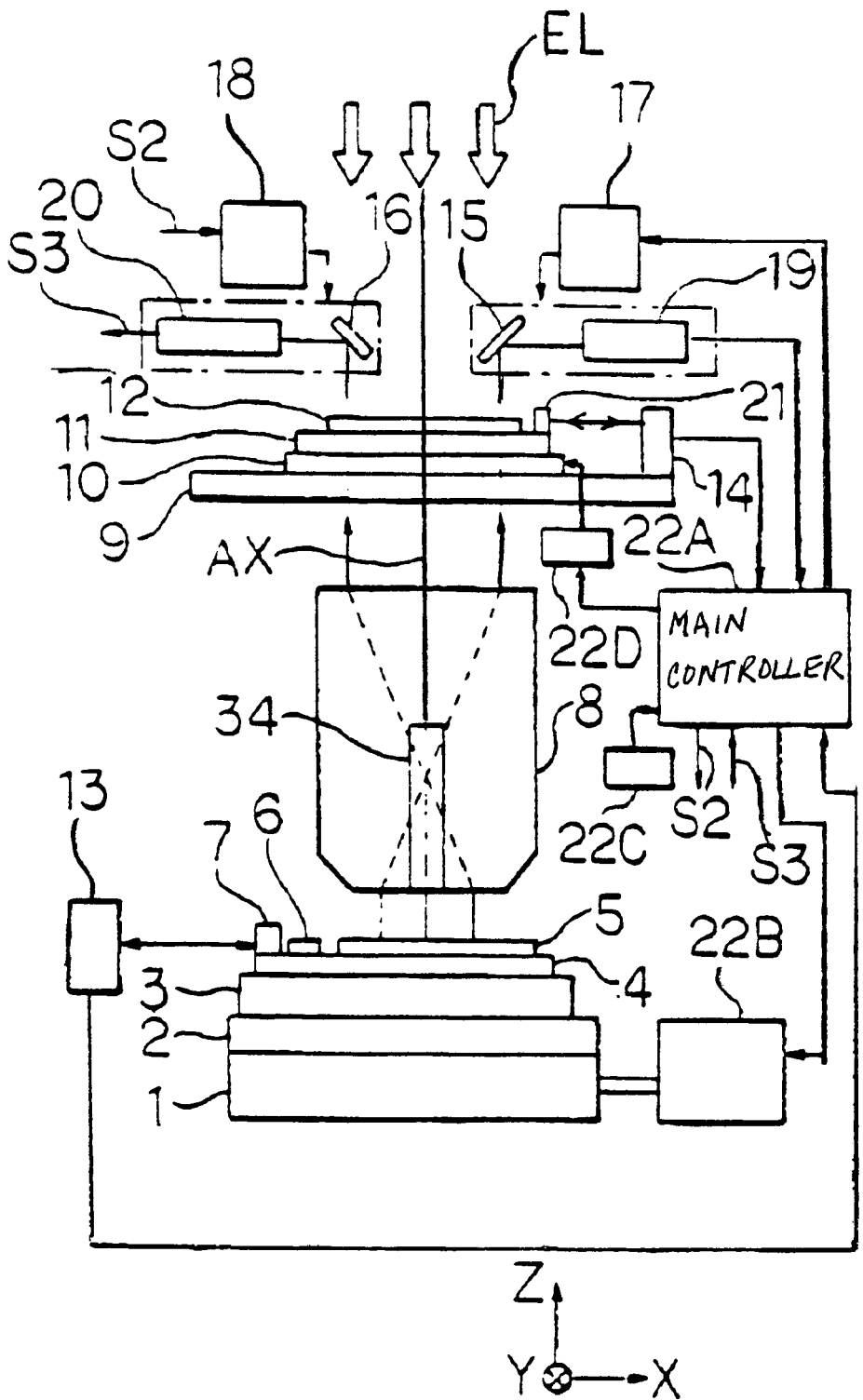
FIG. 1 is a schematic view illustrating one embodiment of the scanning exposure apparatus of the present embodiment.

An embodiment of the scanning exposure apparatus of the present invention will now be described in detail, referring to the drawings. This embodiment of the present invention is applied to a step-and-scan type projection exposure apparatus.

Referring to FIG. 1 illustrating the projection exposure apparatus of the present embodiment, a pattern formed on a reticle 12 is illuminated by exposure light EL emitted by an illumination optical system (not shown), through a rectangular illuminated region hereinafter referred to as "slit-like illuminated region"). An image of the pattern is projected onto a wafer 5 coated with a photo-resist, via a optical projection system 8. In this state, the reticle 12 is scanned at a fixed speed V in the front or rear direction, perpendicular to the plane of the sheet of FIG. 1. The wafer 5 is scanned at a fixed speed V/M (1/M is a projection magnification of the optical projection system 8) in the rear or front direction, perpendicular to the plane of the sheet of FIG. 1, in synchronization with the scan of the reticle 12. The projection magnification (1/M) maybe ¼ or ⅕, for example.

In the following description, Z-axis indicates the direction parallel to the optical-axis AX of the optical projection system 8, and Y-axis indicates the scanning direction, perpendicular to the plane of the sheet of FIG. 1, of the reticle 12 and wafer 5 as designed in the plane perpendicular to the Z-axis. X-axis indicates the non-scanning direction, parallel to the plane of the sheet of FIG. 1, that is perpendicular to the above scanning direction. However, it is to be understood that the actual scanning direction may deviate from the Y-direction, parallel to the Y-axis due to inclination of mirrors of interferometric systems for measuring coordinates of a stage system.

Figure 2:
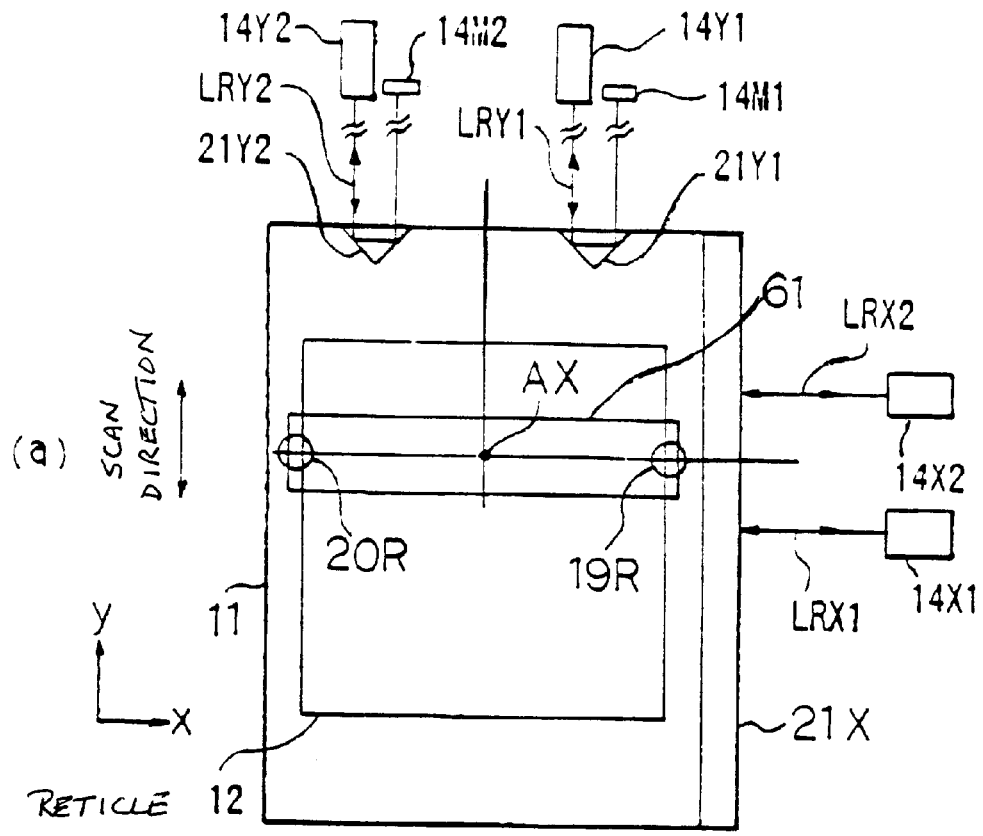
FIG. 2(a) is a plan view illustrating the location of interferometers on one side of a reticle stage of the projection exposure apparatus of FIG. 1.
FIG. 2(b) is a plan view illustrating the location of interferometers on one side of a wafer stage of the projection exposure apparatus of FIG. 1.
Figure 2:
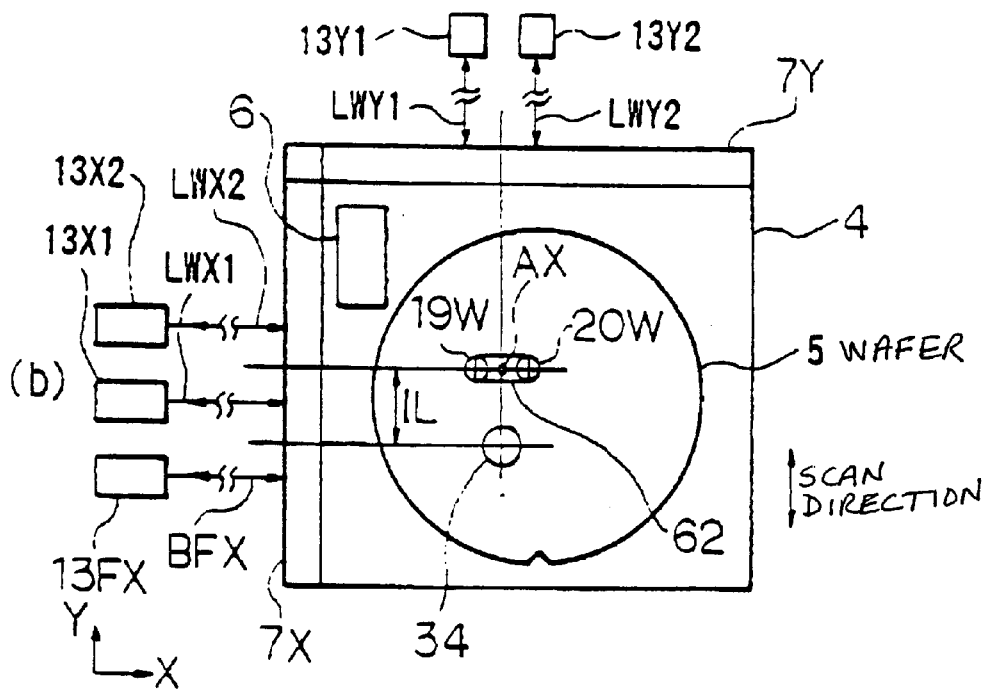

The stage systems of the reticle 12 and wafer 5 of the present embodiment now will be described. First, a reticle Y-axis drive stage 10 is mounted on a reticle support 9 such that the stage 10 can be freely driven in the Y-direction. A reticle minute drive stage 11 is mounted on the reticle Y-axis drive stage 10. The reticle 12 is supported or held on the reticle minute drive stage 11 by a vacuum chuck, for example. The reticle minute drive stage 11 serves to control the position of the reticle 12 with a high accuracy only for a minute in each of the X-direction, Y-direction and rotating direction (θ-direction). The reticle support 9, reticle Y-axis drive stage 10, and reticle minute drive stage 11 constitute a reticle stage. Mirrors 21 are disposed on the reticle minute drive stage 11. The positions of the reticle minute drive stage 11 in the X-direction, Y-direction, and θ-direction are constantly monitored by an interferometer 14 disposed on the reticle support 9. The actual apparatus employs interferometers 14X1, 14X2, 14Y1, 14Y2 having four axes, as shown in FIG. 2(a), which are generally called interferometer 14. Positional information obtained by the interferometer 14 is fed to a main control system 22A for controlling the operations of the whole apparatus. The main control system 22A directs a reticle drive device 22D to control the operations of the reticle Y-axis drive stage 10 and reticle minute drive stage 11.

A wafer Y-axis drive stage 2 is mounted on a wafer support 1 such that the Y-axis drive stage 2 can be freely driven in the Y-direction. A wafer X-axis drive stage 3 is mounted on the wafer Y-axis drive stage 2 such that the stage 3 can be freely driven in the X-direction. Furthermore, Zθ-axis drive stage 4 is disposed on the wafer X-axis drive stage 3 and the wafer 5 is held onto the Zθ-axis drive stage 4 by vacuum suction. The Zθ-axis drive stage 4 serves to control position in the Z-direction, the angle or inclination, and the minute rotation angle of the wafer 5. The wafer support 1, wafer Y-axis drive stage 2, wafer X-axis drive stage 3, and Zθ-axis drive stage 4 constitute a wafer stage. Mirrors 7 are fixed on the Zθ-axis drive stage 4. The position of the Zθ-axis drive stage 4 in the X-direction, Y-direction, and θ-direction are constantly monitored by an interferometer 13 disposed outside of the wafer stage. Positional information obtained by the interferometer 13 is also fed to the main control system 22A. The actual apparatus employs interferometers 13X1, 13X2, 13Y1, 13Y2 having four axes, as shown in FIG. 2(b), which are generally referred to as interferometer 13. The main control system 22A directs a wafer drive device 22B to control the positioning operations of the wafer Y-axis drive stage 2, wafer X-axis drive stage 3, and Zθ-axis drive stage 4.

As will be described later in further detail, a reference mark plate 6, on which certain reference marks are formed, is fixed in the vicinity of the wafer 5 on the Zθ-axis drive stage 4 so that a wafer coordinate system defined by coordinates measured by the interferometer 13 on the side of the wafer stage reflects or corresponds to a reticle coordinate system defined by coordinates measured by the interferometer 14 on one side of the reticle stage. The reference marks include light-emitting reference marks that are illuminated from the bottom or rear side of the mark plate 6 by illumination light led to the inside of the Zθ-axis drive stage 4 and having the same waveband exposure light EL.

In the present embodiment, reticle alignment microscopes 19, 20 are disposed above the reticle 12 so as to observe the reference marks on the reference mark plate 6 and alignment marks on the reticle 12 at the same time. In this case, deflecting mirrors 15, 16, which are freely movable, are disposed for guiding detection light beams from the reticle 12 toward the respective alignment microscopes 19, 20. Once an exposure sequence is started, these deflecting mirrors 15, 16 are retracted from their operating positions by respective mirror drive devices 17, 18 in response to a command from the main control system 22A. Furthermore, an off-axis type alignment sensor 34 is disposed on one side face of the optical projection system 8, as view in the Y-direction, so as to detect the position of alignment marks (wafer marks) on the wafer 5. A console 22C is connected to the main control system 22A, and is used for entering commands of an operator or displaying measurement data.

Referring next to FIGS. 2(a) and (b), the construction of interferometric systems (interference type length measuring devices) for the stage systems of the present embodiment will be now described. FIG. 2(a) is a plan view illustrating the reticle minute drive stage 11 of FIG. 1, and FIG. 2(b) is a plan view illustrating the Zθ-axis drive stage 4 on the side of the wafer stage of FIG. 1. In FIG. 2(a), the reticle 12 is held onto the reticle minute drive stage 11 by a vacuum suction and exposure light is incident upon the slit-like illuminated region 31 on the reticle 12, which region extends in the X-direction.

Since the reticle 12, driven by reticle minute drive stage 11, is scanned in the Y-direction. The mirror 21X, formed from a plane parallel glass plate and extending in the Y-scanning direction, is installed on one end face of the reticle minute drive stage 11 that faces in +X-direction, and the reflecting surface of the mirror 21X is irradiated with measuring laser beams (measuring beams) LRX1, LRX2 emitted by the interferometers 14X1, 14X2, such that the laser beams LRX1, LRX2 are substantially parallel with each other and are spaced a distance L1 from each other in the Y-direction. Each of the interferometers 14X1, 14X2 includes a reference mirror, a receiver for receiving interference light of laser beams from the mirror 21X and the reference mirror, and a signal processor for processing a photoelectric conversion signal from the receiver. Thus, the interferometer 14X1, 14X2 are adapted to detect the X-coordinates of the reflecting surface of the mirror 21X by processing photoelectric conversion signals from the respective receivers. The mirror 21X is formed with a sufficiently large length to prevent the measuring beams LRX1, LRX2 from failing to be incident upon the mirror 21X during acceleration, exposure, and deceleration of the reticle 12. Furthermore, the measuring beams L1X1, LRX2 are equally spaced in the Y-direction from the line passing through the center (optical-axis AX of the optical projection system 8) of the slit-like illuminated region 31. In this arrangement, where measurement values of the interferometers 14X1 and 14X2 are represented as "XR1" and "XR2", receptively, the position (X-coordinate) XR of the reticle 12 in the non-scanning direction is obtained by calculating the average value of these measurement values according to equation (1) below. The angle $\theta_{RX}$ of rotation of the reticle 12, as viewed in the non-scanning direction, is obtained by dividing a difference between the above measurement values by the above spacing L1, according to equation (2) as follows.

$$XR = (XR1 + XR2) \quad (1)$$

$$\theta_{RY} = (XR1 - XR2)/L1 \quad (2)$$

In one end portion of the reticle minute drive stage 11 that faces in +Y-direction, corner cubes 21Y1, 21Y2 serving as mirrors are fixed at positions that are spaced a distance L2 from each other in the X-direction. These corner cubes 21Y1, 21Y2 are irradiated with measuring beams LRY1, LRY2, which are respectively emitted by the interferometers 14Y1, 14Y2 and extend parallel to each other in the scanning direction. Fixed plane mirrors 14M1, 14M2 are also disposed for reflecting the respective measuring beams LRY1, LRY2 reflected by the corner cubes 21Y1, 21Y2 and for returning the beams to the interferometers 14Y1, 14Y2. The interferometers 14Y1, 14Y2 detect Y-coordinates of the corner cubes 21Y1, 21Y2, respectively, by a double-path interference method. The corner cubes 21Y1, 21Y2 can be used as mirrors for detecting displacement in the scanning direction, since the reticle 12 moves in the X-direction within arrow range. The positions of the corner cubes 21Y1, 21Y2 can be accurately detected as long as the measuring beams LRY1, LRY2 are received by the incident faces of the corner cubes 21Y1, 21Y2.

The measuring beams LRY1, LRY2 are also spaced apart from each other in the X-direction such that the beams LRY1, LRY2 are symmetrical with each other wit respect to the center (optical-axis AX) of the illuminated region 31. The position (Y-coordinate) of the reticle 12 in the scanning direction is obtained by calculating the average of measurement values YR1, YR2 of the interferometers 14Y1, 14Y2, according to equation (3) below. The angle $\theta_{RY}$ of rotation of the reticle, as viewed in the scanning direction, is obtained by dividing a difference between these measurement values YR1, Y2 by the above spacing L2, according to equation (4) below. In addition, a difference between the rotation angle $\theta_{RY}$, as viewed in the scanning direction, and the rotation angle $\theta_{RX}$, viewed in the non-scanning direction, provide an orthogonal error $\Delta\omega R$ between the mirror 21X and the corner cubes 21Y1, 21Y2, as indicated in equation (5) as follows.

$$YR=(YR1+YR2)/2 \tag{3}$$

$$\theta_{RY}=(YR1-YR2)/L2 \tag{4}$$

$$\Delta\omega R=(YR1-YR2)/L2-(XR1-XR2)/L1 \tag{5}$$

In the present embodiment, the angle of rotation (yawing amount) of the reticle 12 is normally corrected based on the rotation angle $\theta_{RX}$, as viewed in the non-scanning direction, which is obtained according to equation (2). To this end, two actuators 44R and 44L are installed on one end face of the reticle minute drive stage 11 that faces in the Y-direction. These actuators 44R, 44L are driven independently of each other to displace the reticle minute drive stage 11 relative to the reticle Y-axis drive stage 10, of FIG. 1 so as to control the rotation angle of the reticle minute drive stage 11, and hence the reticle 12. The operations of the actuators 44R, 44L are controlled by the reticle drive device 22D of FIG. 1. To monitor or detect the amount of deflection of the mirror 21X, however, the rotation angle of the reticle 12 is controlled based on the rotating angle $\theta_{RY}$, as view in the scanning direction, which is obtained according to equation (4). This will be described in detail later.

Referring to FIG. 2(a), the mirror 21X and interferometers 14X1, 14X2 constitute a two-axis laser interferometric system for detecting displacement in the non-scanning direction. The corner cubes 21Y1, 21Y2, fixed plane mirrors 14M1, 14M2, and interferometers 14Y1, 14Y2 constitute a two-axis laser interferometric system for detecting displacement in the scanning direction. The X-coordinate XR measured by the interferometers 14X1, 14X2 and the Y-coordinate YR measured by the interferometers 14Y1, 14Y2 are defined in a coordinate system referred to as coordinate system (XR, YR) of the reticle stage.

Although this coordinate system may differ to some extent from an ideal rectangular coordinate system designed with orthogonal X-axis and Y-axis, the reticle 12 is driven based on the coordinates system (XR, YR) of the reticle stage.

Referring next to FIG. 2(b), the wafer 5 is held on the Z$\theta$-axis drive stage 4 by a vacuum suction, for example, and the reference mark plate 6 is fixed in the vicinity of the wafer 5. Two rows of light-emitting reference marks 46A–46F are formed on the reference mark plate 6 along the scanning direction, whereas two rows of alignment marks 45A–45F corresponding to the reference marks 46A–46F are formed on the reticle 12. By detecting both of the reference and alignment marks with the alignment microscopes 19, 20 of FIG. 1, the coordinate system of the reticle stage is aligned or coordinated with the coordinate system of the wafer stage. Details of this arrangement are disclosed in Japanese laid-open Patent Publication No. 7-176469, for example.

An image of a part of the pattern of the reticle 12 is projected on a slit-like exposure region 32 on the wafer 5; which region is in a conjugate relationship with the slit-like illuminated region 31 on the reticle 12. The wafer 5 is moved in the Y-direction relative to the exposure region 32 so that the pattern of the reticle 12 is transferred onto one shot area SA on the wafer 5. Mirror 7X is formed from a plane parallel glass plate and, extending in the scanning direction (Y-direction), is disposed at one end portion of the Z$\theta$-axis drive stage 4 that faces in the X-direction. Mirror 7Y is formed from a plane parallel glass plate and, extending in the non-scanning direction (X-direction), is disposed at one end portion of the Z$\theta$-axis drive stage 4 that faces in the Y-direction. Thus, such that the mirror 7X and mirror 7X extend in orthogonal directions. The reflecting surface of the mirror 7X is irradiated with measuring laser beams LWX1, LWX2 emitted by the interferometers 13X1, 13X2, such that the laser beams LWX1, LWX2 extend substantially parallel with each other and are spaced a distance L3 from each other in the Y-direction. The reflecting surface of the mirror 7Y is irradiated with measuring laser beams LWY1, LWY2 emitted by the interferometers 13Y1 and 13Y2, such that the laser beams LWY1, LWY2 extend substantially parallel with each other and are spaced a distance L4 from each other in the X-direction.

The mirrors 7X, 7Y are formed with a sufficiently large length to prevent the measuring beams from failing to be incident upon the mirrors 7X, 7Y during the scanning exposure of the wafer 5 or stepping of the wafer stage. Furthermore, the measuring beams LWX1, LWX2 are equally spaced apart in the Y-direction from the line passing through the center (optical-axis AX) of the slit-like exposure region 32. In this arrangement, the position (X-coordinate) XW of the wafer 5, in the non-scanning direction, is obtained by calculating the average of measurement values XW1, XW2 of the interferometers 13X1, 13X2, according to equation (6) below. The position (Y-coordinate) YW of the wafer 5 in the scanning direction is obtained by calculating the average of measurement values YW1, YW2 of the interferometers 13Y1, 13Y2, according to equation (7) below. Also, the yawing amount (rotation angle) $\theta_{WX}$ of the wafer 5 is obtained by dividing a difference of the measurement values XW1, XW2 by the above spacing L3, according to equation 8 and the rotation angle $\theta_{WY}$ is obtained by dividing a difference of the measurement values YW1, YW2 by the spacing L4. In addition, an orthogonal error $\Delta\omega R$ of the mirrors 7X, 7Y is obtained from a difference between the rotation angle $\theta_{WY}$ and the yawing amount $\theta_{WX}$, as indicated in equation (9) below.

$$XW=(XW1+XW2)/2 \tag{6}$$

$$YW=(YW1+YW2)/2 \tag{7}$$

$$\theta_{WX}=(XW1-XW2)/L3 \tag{8}$$

$$\Delta\omega W=(YW1-YW2)/L4-(XW1-XW2)/L3 \tag{9}$$

In FIG. 2(b), the mirror 7X and interferometers 13X1, 13X2 constitute a two-axis laser interferometric system, for detecting displacement in the non-scanning direction. The mirror 7Y and interferometers 13Y1, 13Y2 constitute a two-axis laser interferometric system for detecting displacement in the scanning direction. The X-coordinate XW measured by the interferometers 13X1, 13X2, and the y-coordinate YW measured by the interferometers 13Y1, 13Y2 are defined in a coordinate system related to coordinate system (XW, YW) of the wafer stage. Although this coordinate system may differ to some extent from an ideal rectangular coordinate system designed with orthogonal X-axis and Y-axis, the scanning and stepping of the wafer 5 are conducted based on the coordinate system (XW, YW) of the wafer stage. Where correction, based on the orthogonal error $\Delta\omega W$ represented by equation (9), is not made. Stepping of the Z$\theta$-axis drive stage 4 of the wafer 5 in the scanning direction is performed in a directional parallel to the reflecting surface of the mirror 7X (i.e., in the direction in which the X-coordinate XW does not change) and stepping in the non-scanning direction is performed in a direction parallel to the reflecting surface of the mirror 7Y (i.e., in the direction in which the Y-coordinate YW does not change).

Basic operations of the projection exposure apparatus of the present embodiment when performing alignment, scanning exposure, and stepping will now be describe. Initially, reticle alignment is conducted using the reference mark plate 6 of FIG. 2(b). More specifically, the wafer Y-axis drive stage 2 and wafer X-axis drive stage 3, as shown in FIG. 1, are driven so that the reference marks 46A, 46B on the reference mark plate 6 are moved into the slit-like exposure region 32 of the optical projection system 8 and brought to rest. The reticle Y-axis drive stage 10 is driven so that the alignment marks 45A, 45B on the reticle 12, of FIG. 2(a), are moved into the illuminated region 31. Positional deviations of the alignment marks 45A, 45B from the corresponding reference marks 46A, 46B are then detected by the alignment microscopes 19, 20, of FIG. 1, and the reticle Y-axis drive stage 10 and reticle minute drive stage 11 are driven so that the positional deviations of the alignment marks 45A and 45B are made symmetrical with each other with respect to the images of the reference marks 46A, 46B. In this manner, the position and rotation angle of the reticle 12 are adjusted on the basis of the reference mark plate 6. In this condition, measurement values of the 4-axis interferometer 14 on the side of the reticle stage and measurement values of the 4-axis interferometer 13 on the side of the wafer stage are reset (or set to 0), for example. This reset corrects any offset of the origins of the coordinate system (XR, YR) of the reticle stage determined by equations (1) and (3) and the coordinate system (XW, YW) of the wafer stage determined by equations (6) and (7).

Before the actual exposure operation, the scanning direction of the Z$\theta$-axis drive stage 4 of the wafer stage during scanning exposure is made parallel to the direction in which the reference marks are arranged on the reference mark plate 6. To this end, the direction of the array of the reference marks 46A, 46C, 46E mechanically may be made parallel wit the reflecting surface (running face) of the mirror 7X. Where mechanical adjustment errors are still present, the scanning direction of the Z$\theta$-axis drive stage 4 may be correct by a software program so that each time the Y-coordinate YW of the wafer stage changes, by a predetermined number of steps, the X-coordinate XW changes only by an amount corresponding to the change in the Y-coordinate. In the following description a coordinate system with the Y-axis extending in the scanning direction corrected in this manner will be referred to as coordinate system (XW, YW) of the wafer stage.

The wafer stage and the reticle stage are then moved in synchronization in the same manner as in a scanning exposure operation, with no exposure light incident on these stages, while positional deviations, between the reference marks 46C–46F on the reference mark plate 6 and the corresponding alignment marks 45C–45F on the reticle 12, are successively determined by the alignment microscopes 19, 20 (RA microscopes). Based on the average value of these positional deviations, the angle formed by the scanning direction of the reticle 12 and the scanning direction of the wafer 5, angle of rotation of the axis of the scanning direction between the coordinate system (XR, YR) of the reticle stage and the coordinate system (XW, YW) of the wafer stage, is detected. When the reticle 12 is scanned after detection of the rotational angle, the scanning direction of the reticle 12 is made parallel to the direction of the any of the reference marks on the reference mark plate 6, by a software program by driving the reticle Y-axis drive stage 10 and the reticle minute drive stage 11. Thus, while the Y-coordinate YR is shifted by a given distance, the X-coordinate XR is laterally shifted by an amount corresponding to the change of the Y-coordinate.

In the following description, the coordinate system with the Y-axis extending in the scanning direction thus corrected will be referred to as coordinate system (XR, YR) of the reticle stage. Consequently, the axis of the scanning direction in the coordinate system (XW, YW) of the wafer stage is paralleled with that in the coordinate system (XR, YR) of the reticle stage, on the basis of the reference mark plate 6. Thus, the reticle 12 and wafer 5 are scanned in parallel directions in scanning exposure operations.

In this case, movement of each stage is based on its guide face. When the projection exposure apparatus is assembled and adjusted, the parallelism between the guide face of the reticle Y-axis drive stage 10 and the guide face of the wafer Y-axis drive stage 2 is mechanically controlled to be equal to or less than several hundreds of a micron ($\mu$) rad. Furthermore, the mirrors and reference mark plate 6 are fixed in position with respect to these guide faces so as to reduce the amount of software correction made by driving each stage in the non-scanning direction during scanning exposure, thus assuring improved control accuracy. When the reticle 12 is actually mounted on the thus adjust reticle minute drive stage 11, with the reticle 12 positioned based on its outline or contour, only the alignment marks 45A–45F on the reticle 12 may be largely rotated with respect to each mirror and reference mark plate 6. In some cases, a positional deviation between the contour of the reticle 12 and a pattern to be transferred may be as large as approximately 0.5 mm.

When the positional deviation between the contour of the reticle 12 of FIG. 2(a) and the pattern to be transferred is large, positional deviations between the alignment marks 45A—45F of the reticle 12 and the reference marks 46A–46F are measured as if the reticle 12 or reference mark plate 6 were largely rotated or offset relative to the other. Since the reference mark plate 6 is fixed in accordance with the directions in which the mirrors 7X, 7X extend, the correction is made by rotating or shifting the reticle minute drive stage 11. If the reticle minute drive stage 11 is rotated in this case, the mirror 21X is also rotated with the stage 11. Thus the mirror 21X is inclined with respect to the running direction of the reticle 12. Even with the mirror 21X thus inclined, the alignment marks 45A–45F on the reticle 12 are arranged substantially parallel with the reference marks 46A–46F on the reference mark plate 6. The running direction of the reticle 12 and that of the wafer 5 are, therefore, controlled to be generally parallel with each other during scanning exposure.

Subsequently, wafer alignment is performed so as to determine an array of shot areas of the wafer 5 on the coordinate system (XW, YW) of the wafer stage. As one example of the alignment, coordinates of wafer marks of a certain number of shot areas (sample shots) selected from the wafer 5 are measured using the alignment sensor 34 of FIG. 1, and coordinates of all of shot areas arranged on the wafer 5 are calculated by statistically processing the measurement results according to EGA (enhanced global alignment) method. Also, a so-called base line check is conducted, using the reference mark plate 6, so as to calculate a spacing (based line parameter) between the center of detection of the alignment sensor 34 and the reference point in the exposure region 32 of the optical projection system 8. The base line check stores this spacing value in the main control system 22A. Based on the relationship among the coordinates of respective shot areas arranged on the wafer 5, base line parameter of the alignment sensor 34, coordinate system (XW, YW) of the wafer stage, and the coordinate system (XR, YR) of the reticle stage, a shot area on the wafer 5 that is to be exposed is positioned at the scanning start position. The reticle 12 is also positioned at the corresponding position.

After the wafer alignment, scanning exposure operations are performed based on the coordinate system (XW, YW) of the wafer stage and coordinate system (XR, YR) of the reticle stage, which are determined upon reticle alignment as described above. The corrections made to the coordinate systems are accomplished by the software program, on the basis of the reflecting surfaces of the respective mirrors 7X, 7Y, 21X and corner cubes 21Y1, 21Y2. The shape of each shot area and the shot array are influenced by shifts or changes in the positions of these mirrors and others relative to the reticle 12 and wafer 5. In the present embodiment, scanning exposure and stepping are performed as described below, so that accurate, rectangular short areas, and a rectangular grid-like shot array can be formed even in the situation described above.

Suppose $(XR_0, YR_0)$ represent coordinates of the coordinate system (XR, YR) of the reticle stage when the shot area to be exposed and the reticle are positioned, with respect to each other, by wafer alignment. $(XW_0, YW_0)$ represent coordinates of the coordinate system (XW, YW) of the wafer stage obtained by the same alignment. With the projection magnification of the optical projection system 8 set to 1/M, synchronization errors ΔX, ΔY in the scanning direction and non-scanning direction between the reticle minute drive state 11, and the Zθ-axis drive stage 4, after the wafer alignment, are represented by the equations (10), (11) below. Reticle minute drive stage 11 position reticle 12 and drive stage 4 positions wafer. However, it should be noted that these synchronization errors are those calibrated on the reticle 12. While the optical projection system 8, ash shown in FIG. 1, is a reversal projection system, measurements of the interferometers on one side of the reticle stage, and measurements of the interferometers on one side of the wafer stage, are implemented in reverse directions, as show in FIG. 2. Therefore the synchronization errors may be obtained simply by calculating differences of the moving amounts as corrected by the magnification.

$$\Delta X = (XW - XW_0) \cdot M - (XR - XR_0) \quad (10)$$

$$\Delta Y = (YW - YW_0) \cdot M - (YR - YR_0) \quad (11)$$

In the present embodiment, a difference between the angle of rotation $\theta_{WX}$, as viewed in the non-scanning direction of the Zθ-axis drive stage 4 as represented by equation 8 and the angle of rotation $\theta_{RX}$, as view in the non-scanning direction of the reticle minute drive stage 11 as represented by equation (2) is defined as a synchronization error Δθ in the rotating direction, as indicated by the following equation 12.

$$\Delta\theta = \theta_{WX} - \theta_{RX} \quad (12)$$

$$= (XW1 - XW2)/L3 - (XR1 - XR2)/L1$$

In the scanning exposure operation, the reticle Y-axis drive stage 10 and wafer Y-axis drive stage 2, as shown in FIG. 1, start to accelerate. After these stages 10, 2 reach predetermined scanning speeds, synchronization control is performed by driving the reticle minute drive stage 11 so that each of the above-indicated synchronization errors ΔX, ΔY and Δθ becomes zero. After the lapse of a predetermined time in this state, the illuminated region 31 on the reticle 12 starts being irradiated with exposure light and an exposure operation is performed.

When the wafer 5 is stepped to the next shot area to expose this area to exposure light, the stepping direction of the Zθ-axis drive stage in the non-scanning direction is corrected by the orthogonal error ΔωW represented equation (9). Thus, the rectangular grid-like shot array (in which the shot areas are arranged in orthogonal directions) is maintained even if the orthogonal relationship between the mirrors 7X, 7Y on the wafer stage deteriorates.

When the orthogonal error ΔωW, represented by equation (9), or the orthogonal error ΔωR, represented by equation 5, changes such that it exceeds a predetermined allowed value, there may be a problem in the accuracy of the base line parameter of the off-axis type alignment sensor 34, or its mechanical stability. Where the orthogonal error ΔωW or ΔωR changes such that it exceeds the allowed value, the reticle alignment and measurement of the base line parameter is performed again upon replacement of wafers. In this manner, the overlap accuracy between the pattern of the reticle and each shot area of the wafer can be improved.

Specific examples of the shape and array of shot areas obtained as a result of scanning exposure with the projection exposure apparatus of the present embodiment now will be described.

Figure 3:
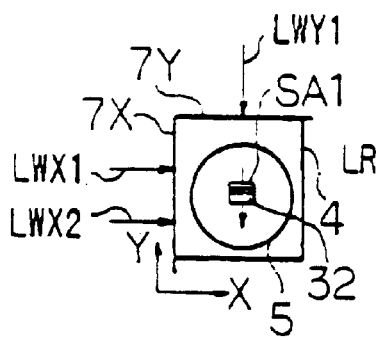
FIGS. 3(a1)–(d4) are explanatory views illustrating the shape of shot areas and shot arrays when the inclination of a mirror on the side of the wafer stage is changed in the present invention.
Figure 3:
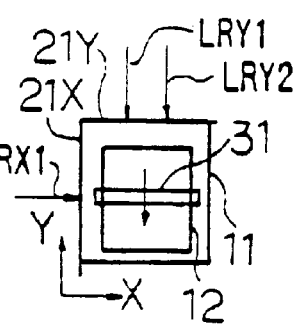
Figure 3:
Figure 3:
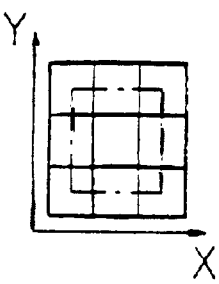
Figure 3:
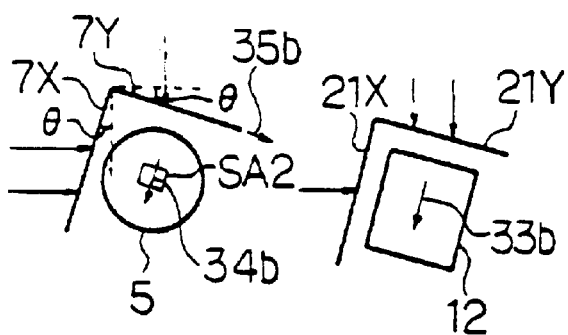
Figure 3:
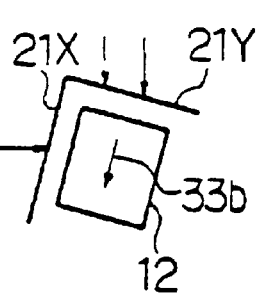
Figure 3:
Figure 3:
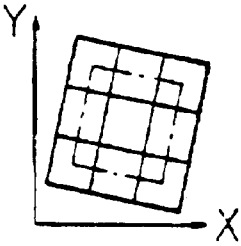
Figure 3:
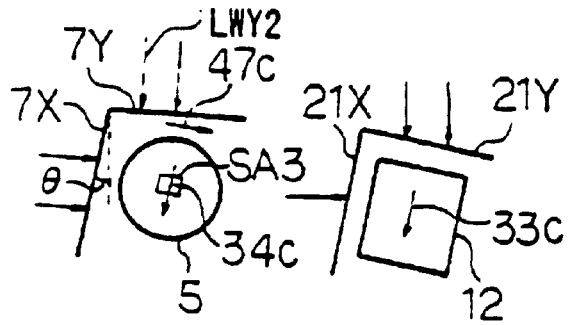
Figure 3:
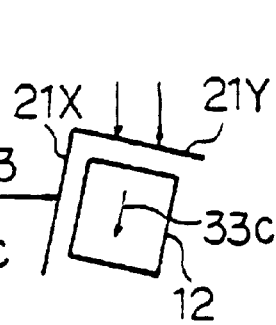
Figure 3:
Figure 3:
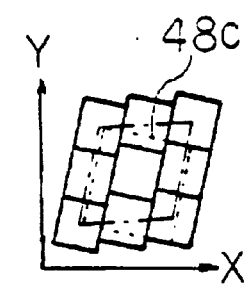
Figure 3:
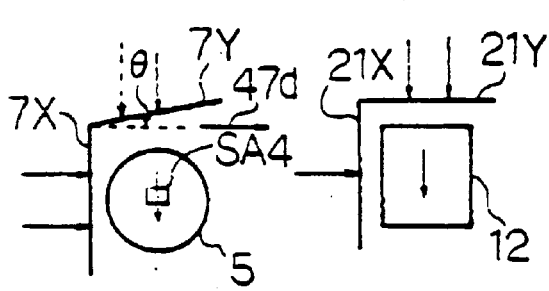
Figure 3:
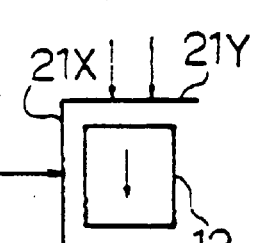
Figure 3:
Figure 3:
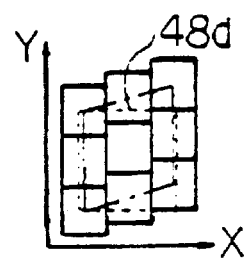

Referring to FIGS. 3(a2) and (d4), the first case will be described in which the mirrors on one side of the reticle stage, as shown in FIGS. 2(a) and (b), are maintained in a stable orthogonal relationship with each other, and inclination of the mirrors 7X, 7Y on the side of the wafer stage is changed.

FIGS. 3(a1)–(d1) show simplified forms of the mirrors 7X, 7Y on the Zθ-axis drive stage 4, on which the wafer 5 of FIG. 2(b) is mounted. FIGS. 3(a2)–(d2) show simplified forms of the mirror 21X and corner cubes 21Y1, 21Y2 on the reticle minute drive stage 11, on which the reticle 12 of FIG. 2(a) is mounted, wherein the corner cubes 21Y1, 21Y2 are represented as a single mirror 21Y. For easier understanding, assuming that a non-reverse image is projected on the wafer by the optical projection system 8, of FIG. 1, the mirror 7Y on the wafer stage is fixed on its side facing in +Y-direction, and the mirror 21X on the reticle stage is fixed on its side facing the X-direction, contrary to those of FIGS. 2(a), 2(b). In this arrangement, the wafer 5 and reticle 12 are scanned in the same direction (the Y-direction or +Y-direction). This also applies to FIGS. 4–7.

In FIGS. 3(a1) and (d4), it is also assumed that the contour or outline of the pattern area of the reticle 12 is in parallel with the reflecting surface of the mirror 21X or 21Y. Also, a single measuring beam LWY1 is incident upon the mirror 7Y for detecting displacement of the wafer stage in the scanning direction. Also, a single measuring beam LRX1 is incident upon the mirror 21X for detecting displacement of the reticle stage in the non-scanning direction. This means that the angle of rotation of the mirror 7Y for the scanning direction is not monitored on the side of the wafer stage and the angle of rotation of the mirror 21X, for the non-scanning direction, is not monitored on the side of the reticle stage. Although the angle of rotation of the mirror 21X, for the non-scanning direction, is normally monitored on the side of the reticle stage as described above, the same result is obtained by monitoring the rotation angle of either of the mirrors 21X, 21Y if these mirrors 21X, 21Y are maintained in a stable orthogonal relationship with each other. For this reason, only the angle of rotation of the mirror 21Y, for detecting displacement of the reticle stage in the scanning direction, is monitored in FIGS. 3($a$1) and ($d$4). In this case, the angle of rotation of the reticle minute drive stage 11 is corrected so that a synchronization error $\Delta\theta'$ is controlled to be zero, instead of the synchronization error $\Delta\theta$ of equation 8. This error, $\Delta\theta'$ is represented by the following equation (13), which is a difference between the rotation angle $\theta_{WX}$ of equation 8 and the rotation angle $\theta_{RY}$ of equation (4).

$$\Delta\theta' = \theta_{WK} - \theta_{RY} \tag{13}$$

As shown in FIG. 3($a$1), if the mirrors 7X, 7Y of the Z$\theta$-axis drive stage 4 on the side of the wafer stage are kept in good orthogonal relationship during scanning exposure and the mirror 7X is parallel with the Y-axis of an ideal rectangular coordinate system (and the mirror 7Y is parallel with the X-axis of the same system), scanning is performed in the scanning exposure operation so that each of the synchronization error $\Delta X$ of equation (10), synchronization error $\Delta Y$ of equation (11), and synchronization error $\Delta\theta'$ of equation (13) is controlled to be zero. Thus, the reticle minute drive stage 11 and reticle 12 are moved parallel with the Y-axis for scanning, relative to the illumination area 31. A shot area SA1 on the wafer 5 is also moved parallel with the Y-axis for scanning, relative to the exposure region 32, and therefore, has an accurate rectangular shape as shown in enlargement in FIG. 3($a$3). In addition, since the stepping direction of the Z$\theta$-axis drive stage 4 on the side of the wafer stage is parallel with the X-axis and Y-axis upon shifting from one shot area tot he next shot area, the shot array formed on the wafer 5 has a rectangular grid-like shape, as shown in FIG. 3($a$4).

Referring next to FIG. 3($b$1), if the mirrors 7X, 7Y on the side of the wafer stage are maintained in a stable orthogonal relationship during scanning exposure, and the Z$\theta$-axis drive stage 4 is rotated clockwise by an angle $\theta$, the wafer is scanned in the direction as indicated by the arrow 34$b$ while being inclined by the angle $\theta$ with respect to the Y-axis. Since the reticle minute drive stage 11 is also scanned while being rotated clockwise by the angle $\theta$, the shot area SA2 on the wafer 5 is rotated, as shown in FIG. 3($b$3), but has an accurate rectangular shape. Furthermore, the stepping direction of the Z$\theta$-axis drive stage 4 on the wafer stage is in the direction as indicated by the arrow 34$b$ for the scanning direction and is parallel to the reflecting surface of the mirror 7Y as indicated by the arrow 35 for the non-scanning direction. Thus, the shot array formed on the wafer 5 is rotated, but has a rectangular grid-like shape, as shown in FIG. 3($b$4).

Where the angle of the mirror 7X for detecting displacement of the wafer stage in the non-scanning direction is changed by $\theta$, as shown in FIG. 3($c$1), the wafer 5 is scanned in the direction indicated by the arrow 34$c$, while being inclined by the angle $\theta$ with respect to the Y-axis. The reticle 12 is scanned in the direction indicated by the arrow 33$c$ in FIG. 3($c$2), while being inclined by the angle $\theta$ with respect tot he Y-axis. The exposed shot area SA3 on the wafer 5 still has a rectangular shape, as shown in FIG. 3($c$3). If the stepping of the Z$\theta$-axis drive stage 4 is carried out on the wafer side simply along the mirrors 7X, 7Y, however, the shot array on the wafer 5 losses its rectangular grid-like shape and is formed into a parallelogram, as shown in FIG. 3($c$4). In the present embodiment, the mirror 7Y is irradiated with an additional one-axis measuring bean LWY2, as indicated by a dotted line in FIG. 3($c$1), and the stepping direction of the Z$\theta$-axis drive stage 4 in the non-scanning direction is corrected by the orthogonal error $\Delta\omega W$ represented by equation (9). The stepping direction of the wafer 5, in the non-scanning direction, is rotated clockwise by the angle $\theta$, with respect to the mirror 7Y, as indicated by the arrow 47$c$ in FIG. 3($c$1). Accordingly, the shot array on the wafer 5 is rotated, but has a rectangular grid-like shape, as represented by a dotted-line grid 48$c$ in FIG. 3($c$4).

Where the angle of the mirror 7Y, for detecting displacement of the wafer stage in the scanning direction, is changed in the counterclockwise direction by an angle $\theta$, as shown in FIG. 3($d$1), as compared with that in FIG. 3($a$1), the wafer 5 is scanned in the Y-direction. Since the angle of inclination of the mirror 7X is not used for correcting the rotation angle of the reticle 12, the reticle 12 is also scanned in the Y-direction, as shown in FIG. 3($d$2). The exposed shot area SA4 on the wafer 5 still has a rectangular shape, as shown in FIG. 3($d$3). Also, if the stepping is carried out on the wafer side simply along the mirrors 7X, 7Y, the shot array on the wafer 5 has a shape formed by rotating a parallelogram by 90°, as shown in FIG. 3($d$4). In the present embodiment, the stepping direction of the wafer 5 in the non-scanning direction is corrected by the orthogonal error $\Delta\omega W$ as represented by the above equation (9), and is therefore, rotated clockwise by the angle $\theta$ with respect to the mirror 7Y, as indicated by the arrow 47$d$ in FIG. 3($d$1). Accordingly, the shot array on the wafer 5 assumes an accurate rectangular grid-like shape, as represented by a dotted-line grid 48$d$ in FIG. 3($d$4).

While the angle of rotation of the reticle 12 is corrected based on the angle of rotation of the mirror 21Y, the angle of rotation of the reticle 12 for measuring displacement of the reticle stage in the scanning direction, as in the above examples of FIGS. 3($a$1) and ($d$4), is normally controlled based on the angle of rotation of the mirror 21X for the non-scanning direction, in the present embodiment.

Figure 6:
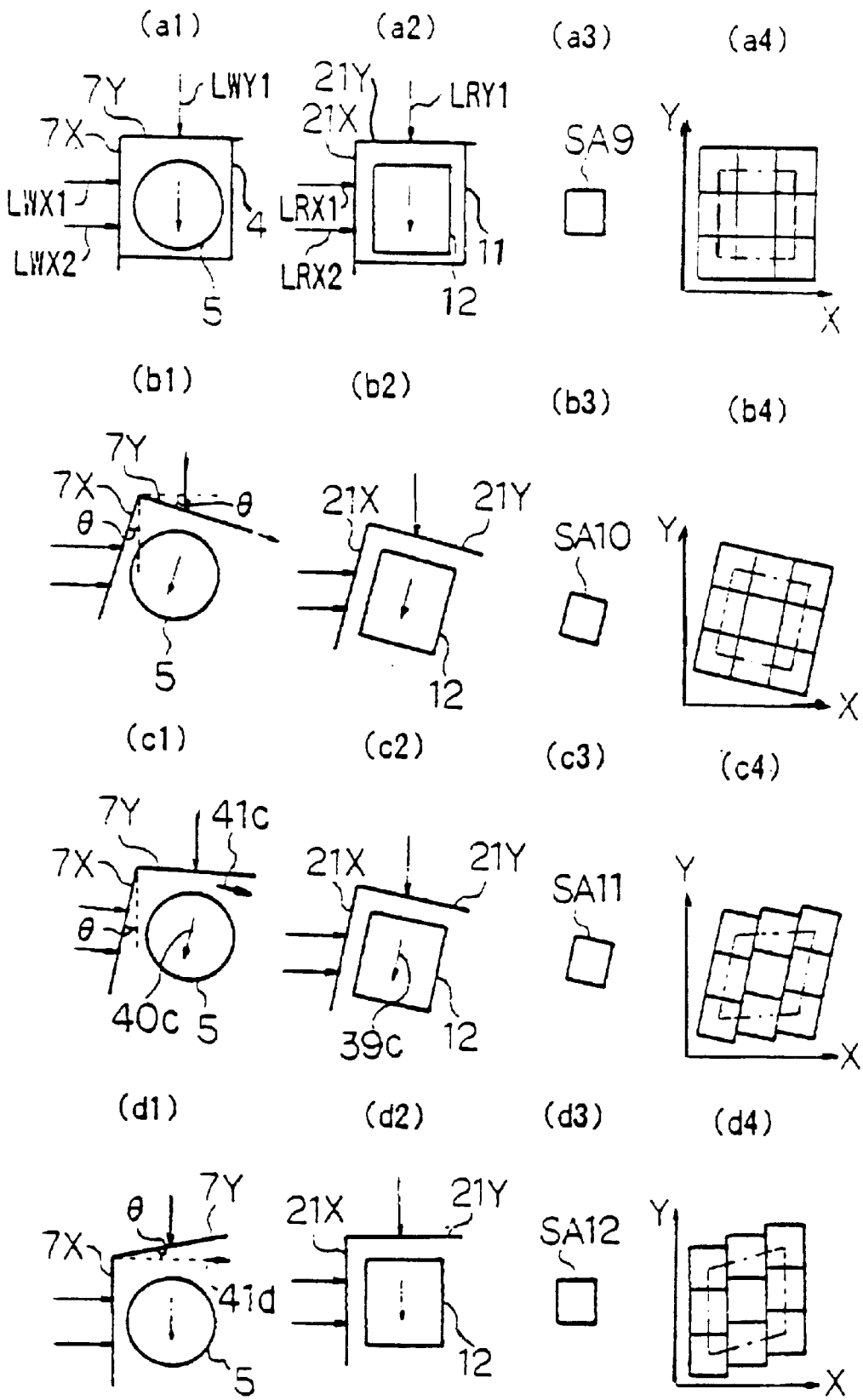
FIGS. 6(a1)–(d4) are explanatory views illustrating the shape of shot areas and shot arrays in the structure of FIGS. 3(a1) and (d4), wherein the angle of rotation of the mask stage is also measured by a two-axis interferometric system for measuring displacement in the non-scanning direction.
Figure 8:
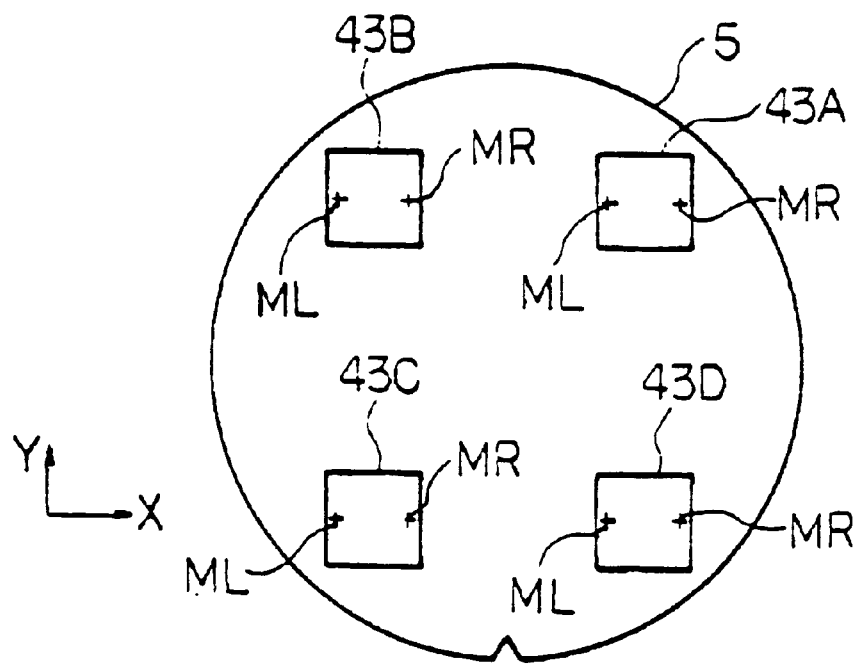
FIG. 8 is a plan view illustrating one example of wafer marks used in a multiple-point per shot EGA method.

FIGS. 6($a$1)–($d$4) illustrates the case where the angle of rotation of the reticle 12 is corrected based on the angle of rotation of the mirror 21X, for measuring displacement in the non-scanning direction. The apparatus of FIGS. 6($a$1)–($d$4) are identical with that of FIGS. 3($a$1)–($d$4), the angle of rotation of the reticle 12 is also corrected depending upon the angle of inclination of the mirror 7X for the non-scanning direction on the side of the wafer stage. If the mirrors 7X, 7Y on the wafer stage are maintained in a stable orthogonal relationship with each other, as shown in FIGS. 8($a$1), ($b$1), the scanning direction of the reticle 12 is parallel with the scanning direction of the wafer 5, as shown in FIGS. 6($a$2), ($b$2), and exposed shot areas SA9, SA10 have a rectangular shape, as shown in FIGS. 6($a$3), ($b$3). The shot array formed on each wafer 5 also has rectangular, grid-like shape, as shown in FIGS. 6($a$4), ($b$4).

When the mirror 7X, for the non-scanning direction on the side of the wafer stage is inclined, as shown in FIG. 6($c$1), and the scanning direction of the wafer 5 is inclined as indicated by the arrow 40*c*. The scanning direction of the reticle 12 is also inclined, as indicated by the arrow 39*c*, in FIG. 6(*c*2). Therefore, the exposed shot area SA11 has a rectangular shape, as shown in FIG. 6(*c*3). Also, when the mirror 7Y for the scanning direction on the side of the wafer stage is inclined, as shown in FIG. 6(*d*1), the scanning directions of the wafer 5 and reticle 12 are parallel with the Y-axis, as shown in FIG. 6(*d*2). The exposed shot area SA12 has a rectangular shape, as shown in FIG. 6(*d*3). Also, in these cases, if stepping of the wafer stage is conducted simply along the mirrors 7X, 7Y, the resulting shot array is not formed in to a rectangular grid-like shape, as shown in FIGS. 6(*c*4), (*d*4). In the present embodiment, however, the stepping direction of the wafer 5, in the non-scanning direction, is corrected by the orthogonal error $\Delta\omega W$ of equation (9) and the wafer 5 moves in steps in the direction of the arrow 41*c*, as shown in FIG. 6(*c*1). This provides a rectangular grid-like shot array.

Figure 4:
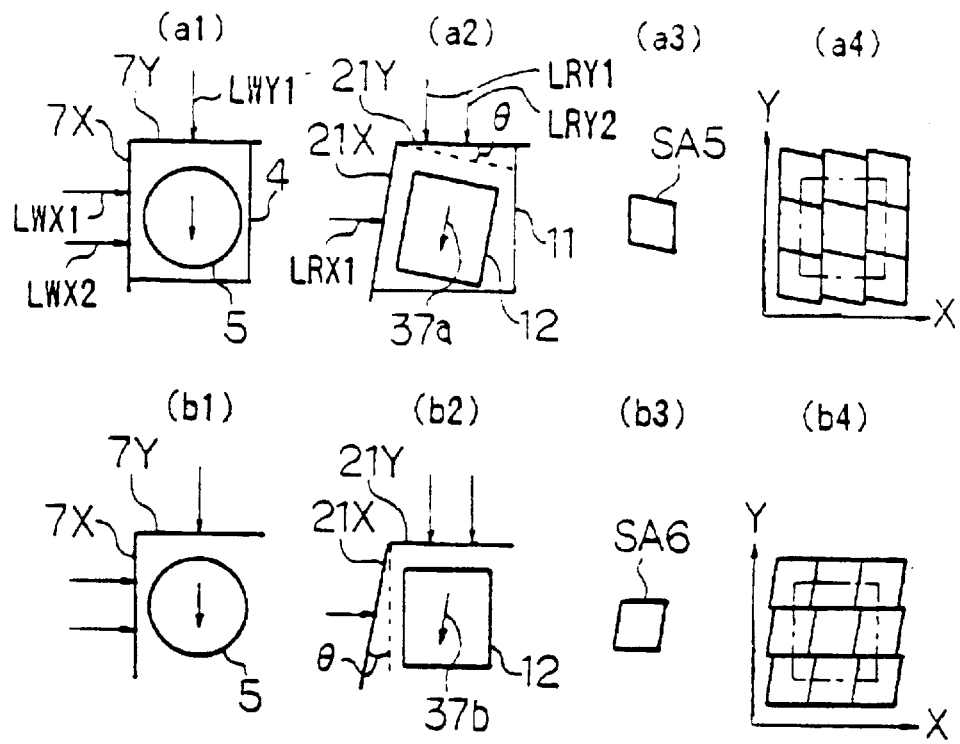
FIGS. 4(a1)–(b4) are explanatory views illustrating the shape of shot areas and shot arrays when the inclination of a mirror on one side of the mask stage is altered from the configuration depicted in FIGS. 3(a1) and (d4)
Figure 5:
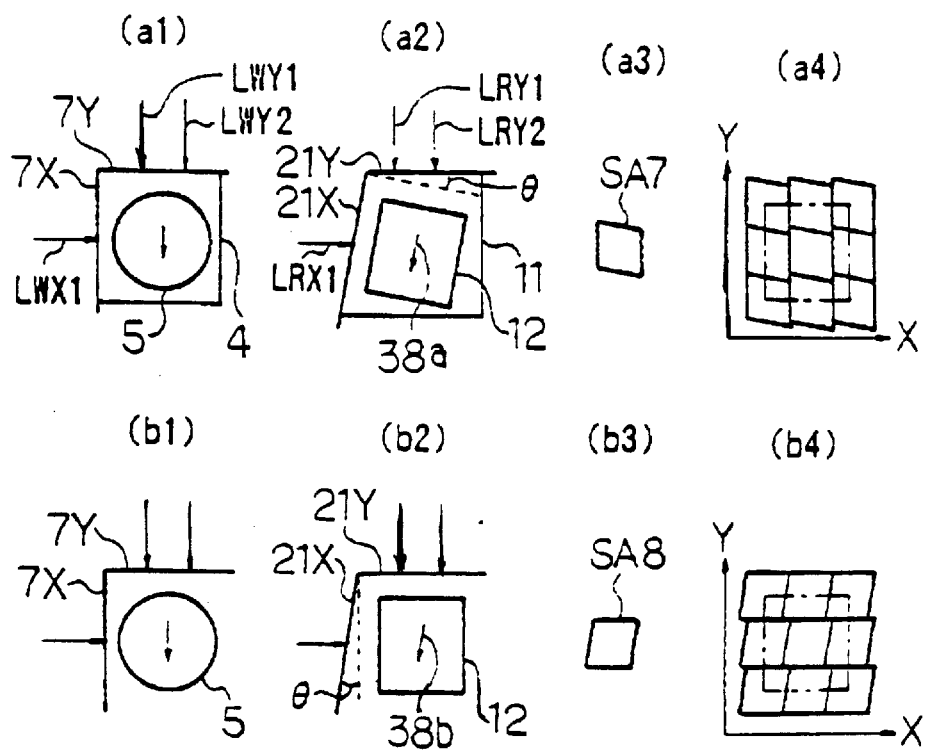
FIGS. 5(a1)–(b4) are explanatory views illustrating the shape of shot areas and shot arrays when the inclination of a mirror on one side of the mask stage, is altered from the configuration of the conventional apparatus.

FIGS. 4(*a*1)–(*b*4), FIGS 5(*a*1)–(*b*4) illustrate when one of the mirrors 21X, 21Y, on one side of the reticle stage, is inclined and their orthogonal relationship has deteriorated. For comparison, FIGS. 4(*a*1)–(*b*l 4) illustrates when the orthogonal relationship between the mirrors 21X, 21Y on the reticle stage has deteriorated in the present embodiment, while FIGS. 3 and 5, depict the conventional structure when the orthogonal relationship between mirrors on the reticle stage has deteriorated.

If the mirror 21Y, for detecting displacement of the reticle stage in the scanning direction, is inclined by an angle $\theta$, as shown in FIG. 4(*a*2), the reticle stage is rotated so that the mirror 21Y is perpendicular to the mirror 7X for the non-scanning direction on the side of the wafer stage. In this configuration, even if the wafer 5 is scanned parallel with the Y-axis, as shown in FIG. 4(*a*1), the reticle 12, which has been rotated, is scanned along the mirror 21X in the direction as indicated by the arrow 37*a*, so as not to change the coordinate of the reticle stage in the non-scanning direction. Therefore, the exposed shot area SA on the wafer 5 has a shape, as shown in FIG. 4(*a*3), formed by rotating a parallelogram 90°. If the mirror 21X, for detecting displacement of the reticle stage in the non-scanning direction, is inclined by the angle $\theta$, as shown in FIG. 4(*b*2), the mirror 21Y is kept perpendicular to the mirror 7X for the non-scanning direction on the side of the wafer stage. In this case, even if the wafer 5 is scanned parallel with the Y-axis as shown in FIG. 4(*b*1), the reticle 12 is obliquely scanned along the mirror 21, as indicated by the arrow 37*b* in FIG. 4(*b*2), and the exposed shot area SA6 on the wafer 5 takes on the shape of a parallelogram, as shown in FIG. 4(*b*3). Since the mirrors 7X, 7Y on the wafer stage have an orthogonal relationship with each other, the shot array formed on the wafer 5 has a rectangular grid-like shape and does not require correction, as shown in FIGS. (4(*a*4), (*b*4).

Figure 10:
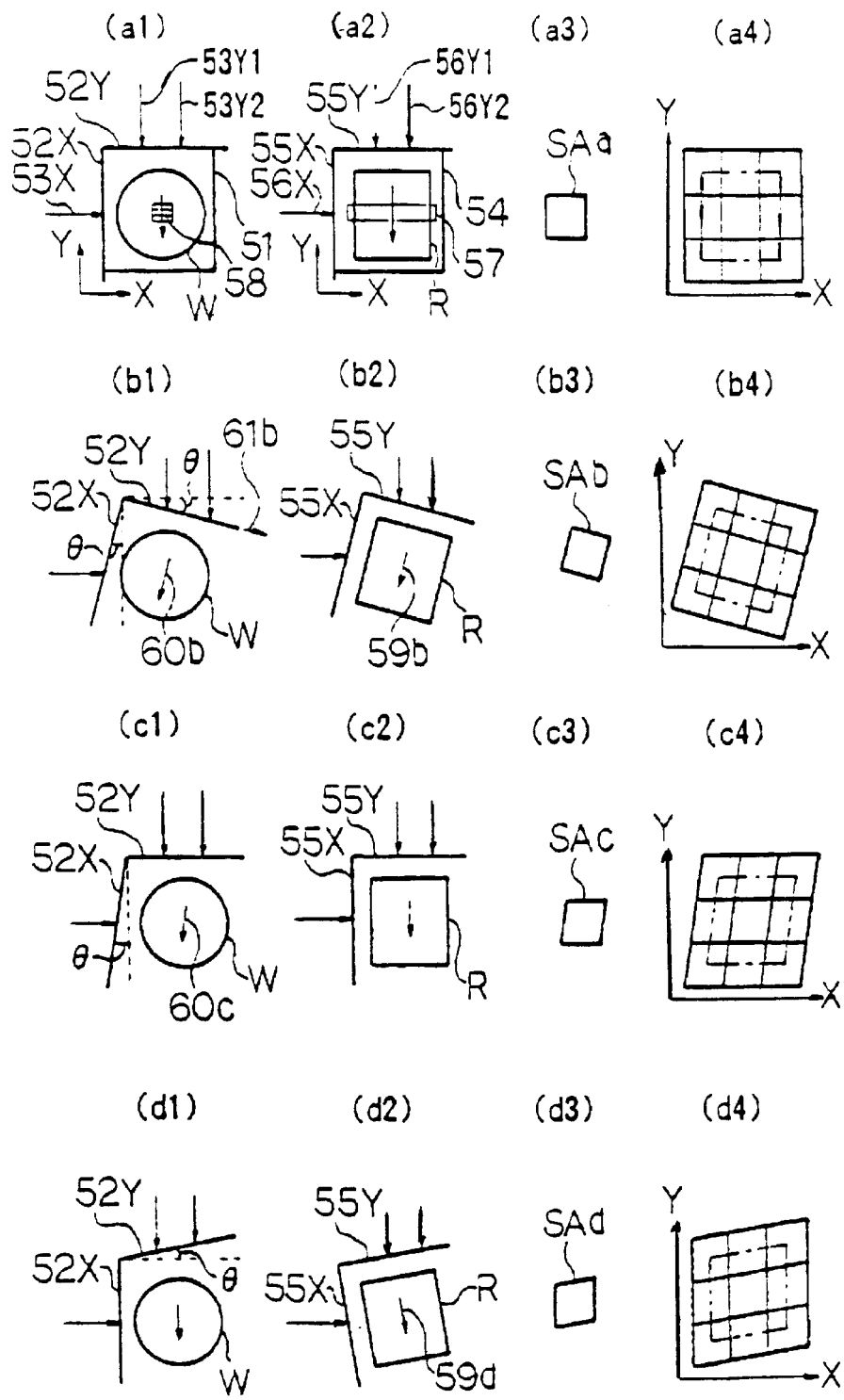
FIGS. 10(a1)–(d4) are views illustrating the shape of shot areas and shot arrays when the inclination of a mirror on the side of a wafer stage is changed in the conventional apparatus.
Figure 11:
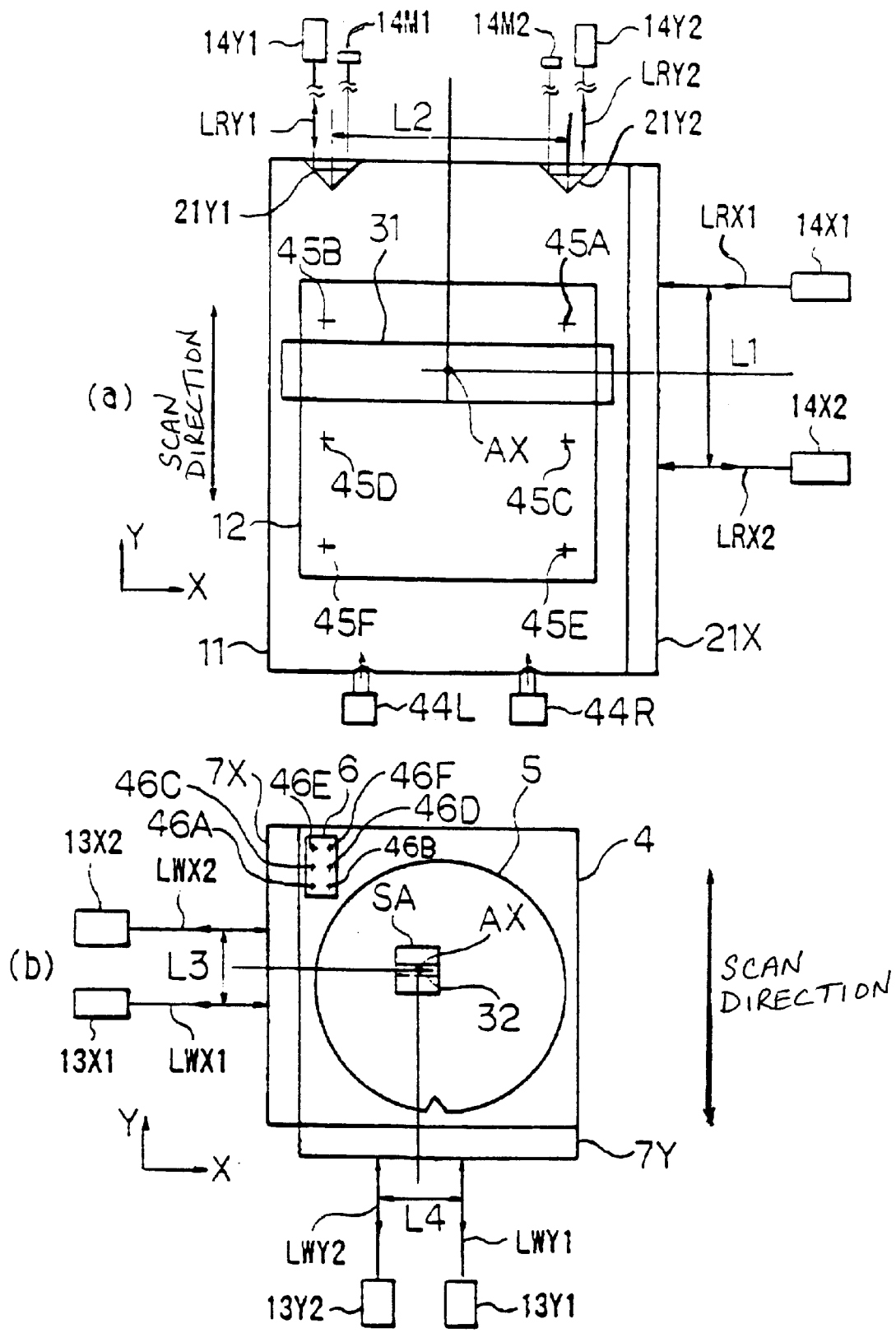
FIG. 11(a) is a plan view illustrating a reticle stage of the projection exposure apparatus of FIG. 1.
FIG. 11(b) is a plan view illustrating a wafer stage of the projection exposure apparatus of FIG. 1.

FIGS. 5(*a*1)–(*b*4) illustrates when the angle of rotation of the reticle 12 is corrected based on the angle of rotation of the mirror 6Y for the scanning direction on one side of the wafer stage in the conventional structure as shown in the structure of FIGS. 10(*a*1)–(*d*4). Also, in this case, the angle of rotation of the Z$\theta$-axis drive stage 4 is detected in the same manner, as shown in FIGS. 10(*a*1)–(*d*4), and the resulting shot area does not have a rectangular shape. If the mirror 21Y is inclined by an angle $\theta$, as shown in FIG. 5(*a*2), the wafer 5 is scanned parallel with the Y-axis, as shown in FIG. 5(*a*1). However, the reticle 12 is obliquely scanned along the mirror 21X while being rotated, as indicated by the arrow 38*a*. As a result, the exposed shot area SA7 has a shape of as shown in FIG. 5(*a*3) formed by rotating a parallelogram by 90°. If the mirror 21X, for the non-scanning direction on the side of the reticle stage is inclined by an angle $\theta$, as shown in FIG. 5(*b*2), the wafer 5 is scanned parallel with the Y-axis, as shown in FIG. 5(*b*1); the reticle 12 is obliquely scanned as indicated by the arrow 38*b*. As a result, the exposed shot area SA8 is in the shape of a parallelogram, as shown in FIG. 5(*b*3). In both of the above cases the shot array formed on the wafer also has a rectangular grid-like shape, as shown in FIGS. 5(*a*4), (*b*4).

As described above, if the angle of rotation of the reticle minute drive stage 11 (reticle 12) is corrected based on the angle of rotation of the mirror 21Y, for detecting displacement of the reticle stage in the scanning direction, the shot area obtained when the orthogonal relationship between the mirrors 21X, 21Y has deteriorated and does not have a rectangular shape. To avoid this the present embodiment is constructed as explained above, with reference to FIG. 2(*a*), such that the angle of rotation of the reticle minute drive stage 11 is corrected based on the angle of rotation of the mirror 21X, for detecting displacement of the reticle minute drive stage 11 in the non-scanning direction.

Figure 7:
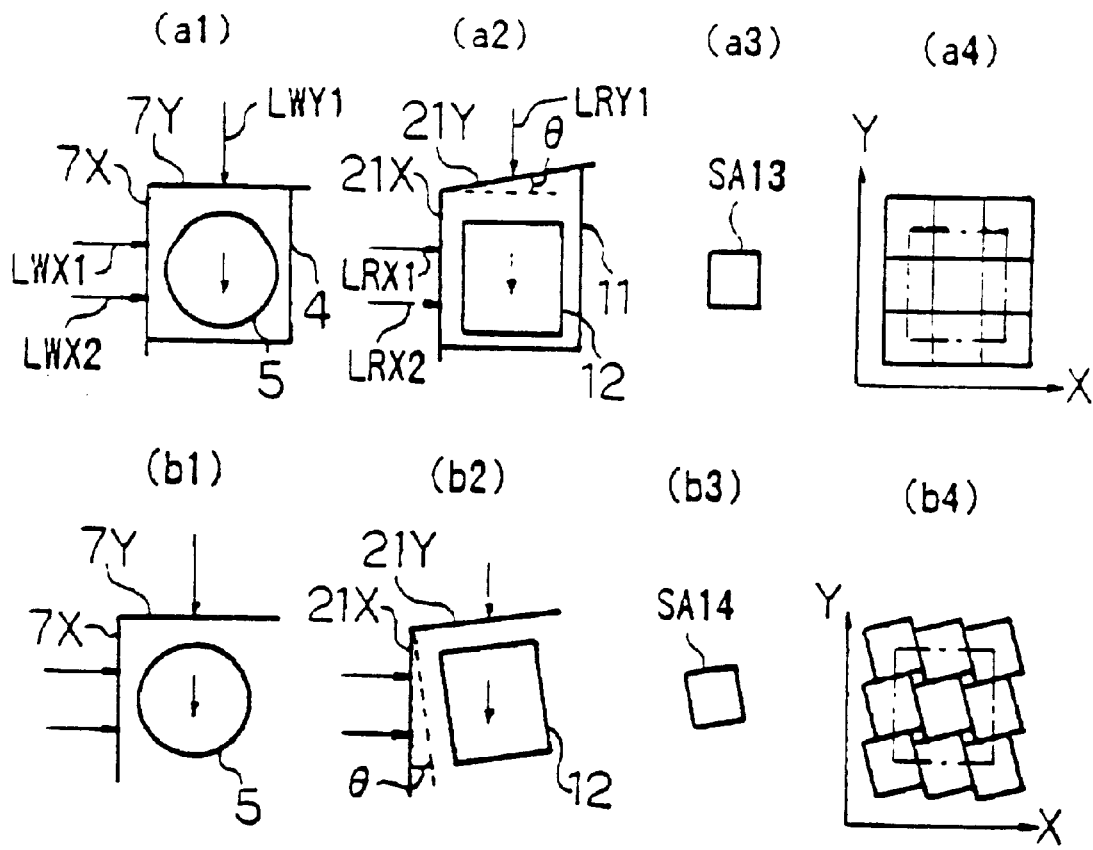
FIGS. 7(a1)–(b4) are explanatory views illustrating the shape of shot areas and shot arrays in the embodiment of the present invention in which the angles of rotation of the wafer stage and mask stage are measured by respective two-axis interferometric systems for measuring displacement in the non-scanning direction, when the inclination of a mirror on the side of the mask stage is changed.

FIGS. 7(*a*1)–(*b*4) illustrates when the angle of rotation of the reticle 12 is corrected based on the angle of rotation of the mirror 21X, for the non-scanning direction on the side of the reticle stage, as in the normal operation of the present embodiment. As illustrated in FIG. 7(*a*2), even if the mirror 21Y, for the scanning direction on the side of the reticle stage, is inclined by an angle $\theta$, this angle of inclination is not used for correcting the rotation of the reticle 12. If the wafer 5 is scanned in parallel with the Y-axis, as shown in FIG. 7(*a*1), the reticle 12 is also scanned in parallel with the Y-axis. The exposed shot area SA13 has a rectangular shape, as shown in FIG. 7(*a*3). If the mirror 21X of the reticle stage for the non-scanning direction is inclined by an angle $\theta$, as shown in FIG. 7(*b*2), the reticle 12 is rotated such that the mirror 21X is parallel with the mirror 7X of the wafer stage. If the wafer 5 is scanned parallel with the Y-axis, as shown in FIG. 7(*b*1), the reticle 12 is scanned parallel with the Y-axis even though it is rotated by the angle $\theta$. Therefore the exposed shot area SA14 is also rotate, but has a rectangular shape, as shown in FIG. 7(*b*3). In these cases that shot array formed on the wafer 5 is also in the form of a rectangular grid, as shown in FIGS. 7(*a*4), (*b*4).

In the present embodiment, the angle of rotation of the reticle 12 is corrected based on the angle of rotation of the mirror 7X for the non-scanning direction of the wafer stage. Therefore, even when one of the mirrors 7X, 7Y on the wafer stage is inclined and its orthogonal relationship has deteriorated, the scanning directions of the wafer 5 and reticle 12 are kept in parallel with each other, as shown in FIGS. 6(*a*)–(*d*4) or FIGS. 3(*a*1) and (*d*4). The exposed shot area on the wafer 5 remains rectangular. On the side of the reticle stage, the angle of rotation of the reticle 12 is also corrected based on the angle of rotation of the mirror 21X. Therefore, even when one of the mirrors 21X, 21Y on the reticle stage is inclined and its orthogonal relationship has deteriorated, the scanning directions of the wafer 5 and reticle 12 are kept in parallel with each other and the exposed shot area on the wafer 5 remains rectangular, as shown in FIGS. 7(*a*)–(*b*4). Since the stepping direction of the wafer stage in the non-scanning direction is corrected based on the orthogonal error $\Delta\omega W$ represented by equation (9), the shot array formed on the wafer has a rectangular grid-like shape even if the orthogonal relationship between the mirrors 7X, 7Y has deteriorated.

Even if the shot array is in the form of a rectangular grid, rotation of each shot area (shot rotation) occurs, as shown in FIG. 7(b4), when the mirror 21X of the reticle stage for the non-scanning direction, is inclined with respect to the pattern of the reticle 12. To prevent occurrence of the shot rotation, the exposure sequence may include a sequence for constantly monitoring the orthogonal error $\Delta\omega R$ of the mirrors of the reticle stage as represented by the above equation 5, and determining whether the orthogonal $\Delta\omega R$ is within a permissible error range for the shot rotation. If the orthogonal error $\Delta\omega R$ exceeds the permitted limit, the reference mark plate 6 on the wafer stage is moved again to the exposure region of the optical projection system 5. This occurs upon replacement of wafers or during shot exposure, so as to perform reticle alignment, whereby the coordinate system (XR, YR) of the reticle stage is re-established, and occurrence of the shot rotation can be avoided.

if there is a possibility that shot rotation has already occurred, the angle of rotation of each shot area on the wafer 5 may be actually measured by a so-called multiple-point per shot EGA method. In the multiple-point per shot EGA method, a plurality of two-dimensional wafer marks MR and ML are formed in each shot area on the wafer 5, as shown in FIG. 8. Upon alignment, four shot areas, may be selected as sample shots 1 for instance 43A–43D, from all shot areas on the wafer 5 and the coordinates of the plurality of wafer marks MR, ML in the sample shots are measured using the alignment sensor 34 of FIG. 1. By statistically processing the measurement results, the average shot rotation of the shot areas on the wafer 5 may be calculated from the average value of the results obtained, by dividing a deviation of Y-coordinates of wafer marks MR and ML by a spacing of these marks MR, ML in the X-direction. Accordingly, an alignment error can be reduced by rotating the reticle by an amount corresponding to the shot rotation before exposure of the wafer 5 aligned with the reticle.

Figure 9:
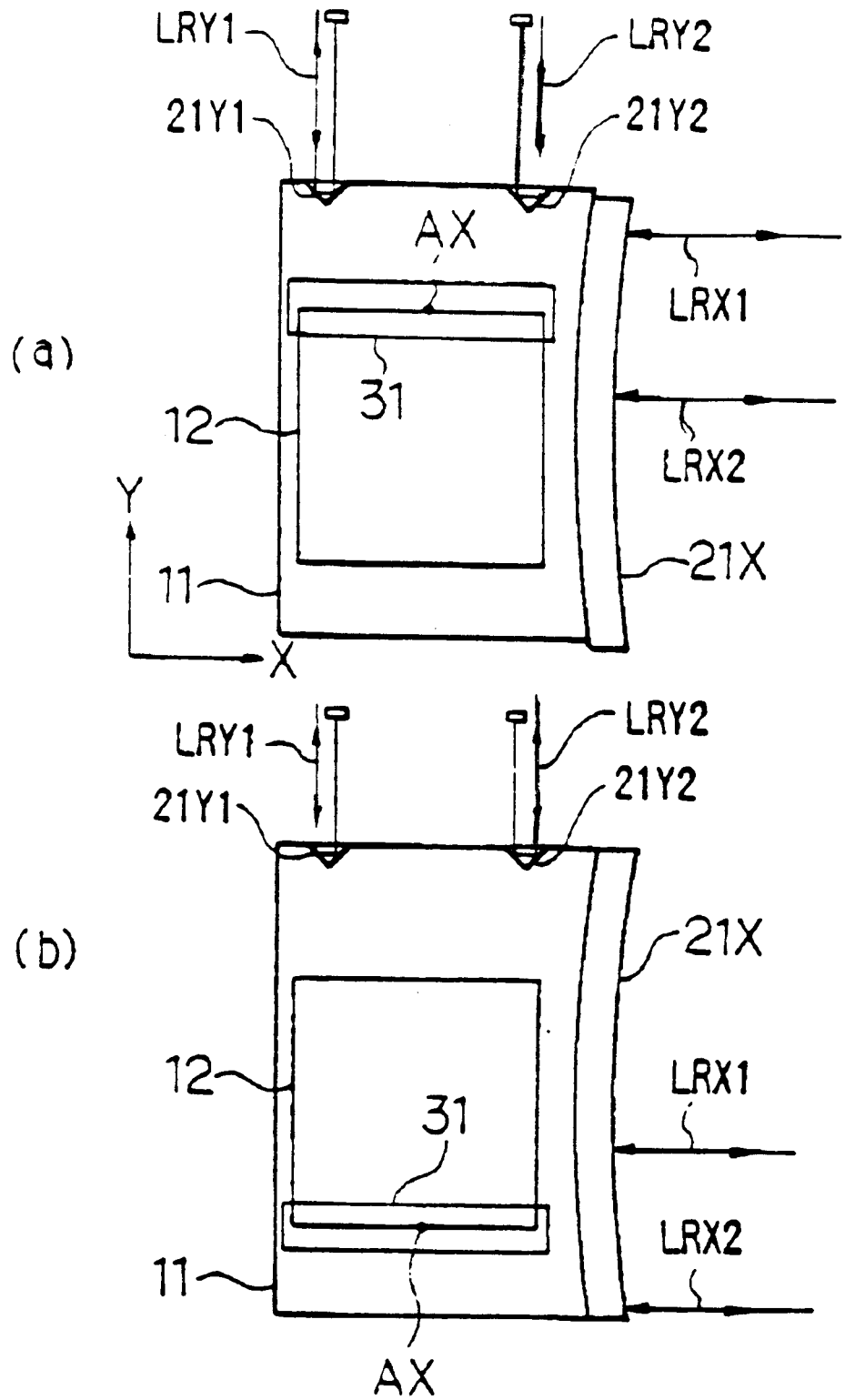
FIGS. 9(a) and (b) are views explaining methods of measuring the amount of deflection of a mirror 21X for the non-scanning direction of a reticle minute, drive stage 11.

Although the mirror 21X, for the non-scanning direction on the side of the reticle stage maybe deflected to a negligible extent in the illustrated embodiment, it may be desirable to correct the deflection or warp of the mirror 21X, for the non-scanning direction, fi the accuracy of positioning the stages is improved in the future and the scanning distance of the reticle stage is increased. Referring next to FIGS. 9(a)–(b), one example of the method of measuring and correcting the deflection of the mirror 21X will be now explained. In FIG. 9(a), illustrating the reticle minute drive stage 11 of FIG. 2(a), Y-coordinates YR1, YR2 of the corner cubes 21Y1, 21Y2 serving as mirrors for measuring displacement in the scanning direction are measured by the measuring beams LRY1, LRY2. X-coordinates, XR1, XR2 of two points on the mirror 21X, for the non-scanning direction, are measured by the measuring beams LRX1, LRX2. In this case, the rotation of the reticle minute drive stage 11 may be corrected based on the rotation angle $\theta_{RY}$ (=(YR1−YR2)/L2) of equation (4) as viewed in the scanning direction, rather than the rotation angle $\theta_{RX}$ of equation (2) as view in the non-scanning direction. While the rotation angle of the reticle minute drive stage 11 is fixed so that the rotation angle $\theta_{RY}$ is controlled to 0, the reticle minute drive stage 11 is moved in the Y-direction to the position, as shown in FIG. 9(b), until one of the X-coordinates XR1 of the mirror 21X for the non-scanning direction becomes equal to a predetermined value. During the movement of the reticle minute drive stage 11, a difference $\Delta XD$ between the X-coordinates XR1, XR2 of two points on the mirror 21X is calculated and stored each time the Y-coordinate YR(= (YR1+YR2)/2) of the reticle minute drive stage 11 reaches predetermined sample coordinates YRn (n=1, 2, . . . ). If XR1n, XR2n represent the X-coordinates XR1, XR2 at an "n" sample point (n=1, 2, 3, . . . ), the difference $\Delta XDn$ at "n" will be represented as follows:

$$\Delta XDN = XR1n - XR2n \tag{14}$$

Since the yawing of the reticle minute drive stage 11 is sequentially corrected in the above case, the difference $\Delta XDn$ is purely the information about deflection or warp of the mirror 21X. By integrating the difference $\Delta XDn$ obtained by the time when the reticle minute drive stage 11 reaches the Y-coordinate YRn and interpolating a defection amount based on those of adjacent Y-coordinates (YRn−1) at their intermediate Y-coordinate YR, the amount of deflection of the mirror 21X can be obtained at a function FD (YR) of the Y-coordinate YR and stored in the main control system 22A of FIG. 1. The amount of deflection of the mirror 21X may also be obtained as a function of the Y-coordinate YR using a spline function.

Since the number n of the difference $\Delta XDn$ is a finite number, interpolation between adjacent measurement points is needed. Although the interpolation may utilize proportional distribution where the sampling interval is small, curve approximation or a spline function may be used to accomplish the interpolation with improved accuracy where the sampling interval is large.

During the scanning exposure, the amount of deflection FD (YR) of the mirror 21X may be added to the X-coordinate XR (=XR1+XR2)/2) that is actually measured with the mirror 21X of the reticle minute drive stage 11, so as to obtain an accurate X-coordinate of the reticle minute drive stage 11 by canceling the amount of deflection of the mirror 21X. Since the reticle minute drive stage is linearly moved, using the X-coordinate thus corrected, the exposed shot area on the wafer has an accurate rectangular shape. The above-described method of measuring and correcting the mirror may be equally applied to the mirror on the side of the wafer stage.

While the position of the relevant stage is obtained from the average of measurement values of two interferometers and its rotating angle is obtained from a difference between these measurement values in the illustrated embodiment, the position may be obtained from measurement value of one of these interferometers and the rotation angle may be obtained from a difference between this position and a measurement value of the other interferometer. The two interferometers may have clearly distance functions. One of the interferometers is used for measuring the position and the other interferometer is for measuring the yawing. In addition, the two interferometers are not necessarily disposed symmetrically with respect to the exposure region or the like. Also, each of the laser interferometric systems may be of any type, such as single-path type, double-path type, or a type in which the optical path is returned many times. Furthermore, the method of measuring the deflection of the mirror on the side of the reticle stage may be equally applied to measurement of the deflection of a mirror on the side of the wafer stage.

While two-axis laser interferometric systems are respectively disposed for measuring displacement in the scanning direction and non-scanning direction on the side of the wafer stage in the illustrated embodiment, one-axis interferometric system may be disposed for measuring displacement in the scanning direction if there is no need to correct the shot array. Also, laser interferometric systems having three axes or more may be disposed for measuring displacement in the scanning and non-scanning direction so as to improve the averaging effect when the position and rotation angle of the wafer stage are calculated. Similarly, a one-axis laser interferometric system may be disposed for measuring displacement of the reticle stage in the scanning direction if there is no need to measure the amount of deflection of the mirror in the non-scanning direction. Also laser interferometric systems having three axes or more may be disposed for the scanning direction and non-scanning direction so as to improve the averaging effect when the position and rotation angle of the reticle stage are calculated.

A second embodiment of the scanning exposure apparatus and method thereof of the present invention will now be described, referring to FIG. 1 and FIGS. 11–16. In this embodiment, the present invention is applied to a step-and-scan type projection exposure apparatus.

Referring first to FIGS. 7(a)–(b4) illustrating the projection exposure apparatus of the present embodiment, a pattern formed on a reticle 12 is illuminated by exposure light EL emitted by an illumination opitcal system (not shown), through a rectangular illuminated region (hereinafter referred to as "slit-like illuminated region"). An image of the pattern accordingly is projected onto a wafer 5 coated with a photo-resist, via a optical projection system 8. In this state, the reticle 12 is scanned at a fixed speed V in the front direction, or rear direction perpendicular to the plane of the sheet of FIG. 1, and the wafer 5 is scanned at a fixed speed V/M (1/M is a projection magnification of the optical projection system 8) in the rear direction, or front direction perpendicular to the plane of the sheet of FIG. 1, in synchronization with the scan of the reticle 12. The projection magnification (1/M) may be ¼ or ⅕, for example.

In the following description, Z-axis indicates the direction parallel to the optical-axis AX of the optical projection system 8. Y-axis indicates the scanning direction, perpendicular to the plane of the sheet of FIG. 1, of the reticle 12 and wafer 5 as designed in the plane perpendicular to the Z-axis. X-axis indicates the non-scanning direction, parallel to the plane of the sheet of FIG. 1, that is perpendicular to the scanning direction. However, it is to be understood that the actual scanning direction may deviate from a direction Y-direction, parallel to the Y-axis due to inclination of mirrors of interferometric systems for measuring coordinates of a stage system.

The stage systems of the reticle 12 and wafer 5 of the present embodiment now will be described. First, a reticle Y-axis drive stage 10 is mounted on a reticle support 9 such that the stage 10 can be freely driven in the Y-direction, and a reticle minute drive stage 11 is mounted on the reticle Y-axis drive stage 10. The reticle 12 is supported or held on the reticle minute drive stage 11 by a vacuum chuck, for example. The reticle minute drive stage 11 serves to control the position of the reticle 12 with high accuracy, only by a minute distance in each of the X-direction, Y-direction, and rotating direction (θ-direction). The reticle support 9, reticle Y-axis drive stage 10 and reticle minute drive stage 11 constitute a reticle stage. Mirrors 21 are disposed on the reticle minute drive stage 11 and the positions of the reticle minute drive stage 11 in the X-directions. Y-direction and θ-direction are constantly monitored by an interferometer 14 disposed on the reticle support 9. The actual apparatus employs interferometers 14X1, 14X2, 14Y1, 14Y2 having four axes, as shown in FIG. 2(a), which will generally be referred to as interferometer 14. Positional information obtained by the interferometer 14 is fed to a main control system 22A for controlling the operations of the whole apparatus. The main control system 22A directs a reticle drive device 22D to control the operations of the reticle Y-axis drive stage 10 and reticle minute drive stage 11.

A wafer Y-axis drive stage 2 is mounted on a wafer support 1 such that the Y-axis drive stage 2 can be freely driven in the Y-direction and a wafer X-axis drive stage 3 is mounted on the wafer Y-axis drive stage 2 such that the stage 3 can be freely driven in the X-direction. Furthermore, Zθ-axis drive stage 4 is disposed on the wafer X-axis drive stage and the wafer 5 is held onto the Zθ-axis drive stage 4 by vacuum suction. The Zθ-axis drive stage 4 serves to control the position in the Z-direction, the angle of inclination, and the minute rotation angle of the wafer 5. The wafer support 1, wafer Y-axis drive stage 2, wafer X-axis drive stage 3, and Zθ-axis drive stage 4 constitute a wafer stage. Mirrors 7 are fixed on the Zθ-axis drive stage 4 and the positions of the Zθ-axis drive stage 4 in the X-direction, Y-direction and θ direction are constantly monitored by an interferometer 13 disposed outside of the wafer stage. Positional information obtained by the interferometer 13 is also fed to the main control system 22A. The actual apparatus employs interferometers 13X1, 13X2, 13FX, 13Y1, 13Y2 having five axes, as shown in FIG. 2(b), which are referred to as interferometer 13. The main control system 22A directs a wafer drive device 22B to control the positioning operations of the wafer Y-axis drive stage 2, wafer X-axis drive stage 3, and Zθ-axis drive stage 4.

As will be described later in further detail, a reference mark plate 6, on which certain reference marks are formed, is fixed in the vicinity of the wafer 5 on the Zθ-axis drive stage 4. Thus, a wafer coordinate system defined by coordinates measured by the interferometer 13 reflects or corresponds to a reticle coordinate system defined by coordinates measured by the interferometer 14. The reference marks include light-emitting reference marks that are illuminated from the bottom or rear side of the mark plate 6 by illumination light led to the inside of the Zθ-axis drive stage 4 and having the same waveband as the exposure light EL.

In the present embodiment, reticle alignment microscopes 19, 20 (which will be called "RA" microscopes) are disposed above the reticle 12, so as to observe the reference marks on the reference mark plate 6 and alignment marks on the reticle 12 at the same time. In this case, deflecting mirrors 15, 16, which are freely movable, are disposed for guiding detection light beams from the reticle 12 toward the respective RA microscopes 19, 20. Once an exposure sequence is started, these deflecting mirrors 15, 16 are retracted from their operating positions by respective mirror drive devices 17, 18, in response to a command from the main control system 22A. Furthermore, an off-axis type alignment sensor 34 is disposed on one side face of the optical projection system 8 as viewed in the Y-direction, so as to detect the position of alignment marks (wafer marks) on the wafer 5. An example of the alignment sensor 34 used in this embodiment detects deviations of the wafer marks from index marks inside the sensor 34, by an image pickup method, and supplies the deviations to the main control system 22. The alignment sensor 34 may be of a so-called two-beam interference type (LIA type) adapted to irradiate the wafer marks in the form of a diffraction grating with coherent light beams, or of a laser step alignment type (LSA type) adpated to scan the wafer marks in the form of dot rows with a laser beam incident upon the wafer through a slit. A console 22C is connected to the main control system 22A and is used for entering commands of an operator or displaying measurement data.

Referring next to FIGS 2(a) and (b), the construction of interferometric systems (interference type length measuring devices) for the stage systems of the present embodiment now will be described. FIG. 2(a) is a plan view illustrating the reticle minute drive stage 11 of FIG. 1, and FIG. 2(b) is a plan view illustrating the Zθ-axis drive stage 4 on the side of the wafer stage of FIG. 1. In FIG. 2(a), the reticle 12 is held onto the reticle minute drive stage 11 by a vacuum suction and exposure light is incident upon the slit-like illuminated region 61 on the reticle 12, which region extends in the X-direction.

Since the reticle 12 (reticle minute drive stage 11) is scanned in the Y-direction, the mirror 21X, which is formed from a plane parallel glass plate and extending in the Y-scanning direction, is installed on one end face of the reticle minute drive stage 11 that faces +X-direction. The reflecting surface of the mirror 21X is irradiated with measuring laser beams (measuring beams) LRX1, LRX2 emitted by the interferometers 14X1, 14X2, such that the laser beams LRX1, LRX2 are substantially parallel with each other and are spaced a distance L1 from each other in the Y-direction. Each of the interferometers 14X1, 14X2 includes a reference mirror, a receiver for receiving interference light of laser beams from the mirror 21X and the reference mirror, and a signal processor for processing a photoelectric conversion signal from the receiver. Thus, the interferometers 14X1, 14X2 are adapted to detect the X-coordinates of the reflecting surface of the mirror 21X by processing photoelectric conversion signals from the respective receivers. The mirror 21X is formed with a sufficiently large length to prevent the measuring beams LRX1, LRX2 from falling to be incident upon the mirror 21X during acceleration, exposure, and deceleration of the reticle 12. Furthermore, the measuring beams LRX1, LRX2 are equally spaced in the Y-direction from the line passing through the center (optical-axis AX of the optical projection system 8) of the slit-like illuminated region 61. In this arrangement, where measurement values of the interferometers 14X1 and 14X2 are represented as "XR1" and "XR2", respectively, the position (X-coordinate) XR of the reticle 12 in the non-scanning direction is obtained by calculating the average value of these measurement values according to equation (15) below. The angle $\theta_{RX}$ of rotation of the reticle 12, as viewed in the non-scanning direction, is obtained by dividing a difference between the above measurement values by the above spacing L1, according to equation (16) as follows.

$XR=(XR1+XR2)/2$ (15)

$\theta_{RX}=(XR1-XR2)/L1$ (16)

In one end portion of the reticle minute drive stage 11 that faces in +Y-direction, corner cubes 21Y1, 21Y2 serving as mirrors are fixed at positions that are spaced a distance L2 from each other in the X-direction. These corner cubes 21Y1, 21Y2 are irradiated with measuring beams LRY1, LRY2, which are respectively emitted by the interferometers 14Y1, 14Y2 and extend parallel with each other in the scanning direction. Fixed plane mirrors 14M1, 14M2 are also disposed for reflecting the respective measuring beams LRY1, LRY2 reflected by the corner cubes 21Y1, 21Y2, and returning the beams to the interferometers 14Y1, 14Y2. The interferometers 14Y1, 14Y2 detect Y-coordinates of the corner cubes 21Y1, 21Y2, respectively, by a double-path interference method. The corner cubes 21Y1, 21Y2 can be used as mirrors for detecting displacement in the scanning direction, since the reticle 12 moves in the X-direction within a narrow range. The positions of the corner cubes 21Y1, 21Y2 can be accurately detected as long as the measuring beams LRY1, LRY2 are received by the incident faces of the corner cubes 21Y1, 21Y2.

The measuring beams LRY1, LRY2 are also spaced apart from each other in the X-direction such that the beams LRY1, LRY2 are symmetrical with each other with respect to the center (optical-axis AX) of the illuminated region 61. The position (Y-coordinate) of the reticle 12 in the scanning direction is obtained by calculating the average of measurement values YR1, YR2 of the interferometers 14Y1, 14Y2, according to equation (17) below. The angle $\theta_{RY}$ of rotation of the reticle, as viewed in the scanning direction, is obtained by dividing a difference between these measurement values YR1, YR2 by the above spacing L2, according to equation (18) as follows.

$YR=(YR1+YR2)/2$ (17)

$\theta_{RY}=(YR1-YR2)/L2$ (18)

In additional, a difference between the rotation angle $\theta_{RY}$, as view in the scanning direction, and the rotation angle $\theta_{RX}$, as view in the non-scanning direction, provide an orthogonal error $\Delta\omega R$ between the mirror 21X and the corner cubes 21Y1, 21Y2, as indicated in equation (19) as follows.

$\Delta\omega R=(YR1-YR2)/L2-(XR1-XR2)/L1$ (19)

In a normal exposure operation of the present embodiment, the angle of rotation (yawing amount) of the reticle 12 is corrected based on the rotation angle $\theta_{RX}$, as viewed in the non-scanning direction, which is obtained according to equation (16). When the amount of deflection of the mirror 21X is measured, the reticle minute drive stage 11 is moved in Y-direction such that the rotation angle $\theta_{RY}$, as viewed in the scanning direction, is maintained at a fixed value, and a difference (XR1−XR2) of measurement values of the interferometers 14X1, 14X2 is sampled at regular intervals. Where $\Delta XDn$ represents a difference obtained at "n" sample points (n=1, 2, . . . ), this difference $\Delta XDn$ purely represents the information about deflection or warp of the mirror 21X, since the yawing of the reticle minute drive stage 11 is occasionally corrected. By integrating the differences $\Delta XDn$ obtained within the time it take the reticle minute drive stage 11 to reach each Y-coordinate YRn and interpolating a defection amount based on those of adjacent Y-coordinates (YRn−1, YRn) at their intermediate Y-coordinate YR, the amount of deflection of the mirror 21X can be obtained as a function of the Y-coordinate and stored in the main control system 22A of FIG. 1. The amount of deflection of the mirror 21X may be also obtained as a function of the Y-coordinate YR using a spline function.

In performing scanning exposure after the above measurement, the amount of deflection of the mirror 21X may be added to the X-coordinate XR (=(XR1+XR2)/2) that is actually measured with the mirror 21X of the reticle minute drive stage 11 so as to obtain an accurate X-coordinate of the reticle minute drive stage 11, which is not affected by the deflection of the mirror 21X. Since the reticle minute drive stage 11, is linearly moved using the thus corrected X-coordinate, the exposed shot area on the wafer has an accurate rectangular shape.

Referring to FIG. 11(a), the mirror 21X and interferometers 14X1, 14X2 constitute a two-axis laser interferometric system for detecting displacement in the non-scanning direction. The corner cubes 21Y1, 21Y2, fixed plane mirrors 14M1, 14M2, and interferometers 14Y1, 14Y2 constitute a two-axis laser interferometric system for detecting displacement in the scanning direction. The X-coordinate XR measured by the interferometers 14X1, 14X2 and the Y-coordinate YR measured by the interferometers 14Y1, 14Y2 are defined in a coordinate system referred to as coordinate system (XR, YR) of the reticle stage. Although this coordinate system may differ to some extent from an ideal rectangular coordinate system designed with orthogonal X-axis and Y-axis, the reticle 12 is driven based on the coordinates system (XR, YR) of the reticle stage.

Referring next to FIG. 11(b), the wafer 5 is held on the Zθ-axis drive stage 4 by a vacuum suction, for example, and the reference mark plate 6 is fixed in the vicinity of the wafer 5. An image of a part of the pattern of the reticle 12 is projected on a slit-like exposure region 62 on the wafer 5, which region is in a conjugate relationship with the illuminated region 61 on the reticle 12. The wafer 5 is moved in the Y-direction relative to the exposure region 62 so that the pattern of the reticle 12 is transferred onto one shot area on the wafer 5. Mirror 7X is formed from a plane parallel glass plate and, extending in the scanning direction (Y-direction), is disposed at one end portion of the Zθ-axis drive stage 4 that faces in the X-direction. Mirror 7Y is formed from a plane parallel glass plate and, extending in the non-scanning direction, is disposed at one end portion of the Zθ-axis drive stage 4 that faces in +Y-direction. Thus, the mirror 7X and mirror 7X extend in orthogonal directions.

The reflecting surface of the mirror 7X is irradiated with measuring laser beams LWX1, LWX2 emitted by the interferometers 13X1, 13X2, such that the laser beams LWX1, LWX2 extend substantially parallel with each other and are spaced a distance L3 from each other in the Y-direction. The reflecting surface of the mirror 7Y is irradiated with measuring laser beams LWY1, LWY2 emitted by the interferometers 13Y1 and 13Y2, such that the laser beams LWY1, LWY2 extend substantially parallel with each other and are spaced a distance L4 from each other in the X-direction. In addition, the interferometer 13FX is disposed at a position that is symmetrical with that of the interferometer 13X2, with respect to the interferometer 13X1, and a measuring beam BFX emitted by this interferometer 13FX is incident upon the mirror 7X, such that the measuring beams BFX is spaced the distance L3 from the measuring beam LWX1 in the Y-direction.

The mirrors 7X, 7Y are formed with a sufficiently large length to prevent the measuring beams from failing to be incident upon the mirrors 7X, 7Y during the scanning exposure of the wafer 5 or stepping of the wafer stage. Furthermore, the measuring beams LWX1, LWX2 are equally spaced apart in the Y-direction from the line passing through the center (optical-axis AX) of the slit-like exposure region 62. During the exposure, the position (X-coordinate) XW of the wafer 5 in the non-scanning direction, is obtained by calculating the average of measurement values XW1, XW2 of the interferometers 13X1, 13X2, according to equation (20) below. The position (Y-coordinate) YW of the wafer 5 in the scanning directions is obtained by calculating the average of measurement values YW1, YW2 of the interferometers 13Y1, 13Y2, according to equation (12) below. Also, the yawing amount (rotation angle) $\theta_{WX}$ of the wafer 5 is obtained by dividing a difference of the measurement values XW1, XW2 by the above spacing L3, according to equation 22, and the rotation angle $\theta_{WY}$ is obtained by dividing a difference of the measurement values YW1, YW2 by the spacing L4. In addition, an orthogonal error $\Delta\omega R$ of the mirrors 7X, 7Y is obtained from a difference between the rotation angle $\theta_{WY}$ and the yawing amount $\theta_{WX}$, as indicated in equation (23) below.

$$XW=(XW1+XW2)/2 \qquad (20)$$

$$YW=(YW1+YW2)/2 \qquad (21)$$

$$\theta_{WX}=(XW1-XW2)/L3 \qquad (22)$$

$$\Delta\omega W=(YW1-YW2)/L4-(XW1-XW2)/L3 \qquad (23)$$

In the present embodiment, the measuring beams LWX1, BFX are equally spaced in Y-direction from the line passing through the center of detection of the off-axis type alignment sensor 34. When alignment is performed using the alignment sensor 34, the position (X-coordinate) XW' of the wafer 5 in the non-scanning direction is obtained from the average of measurement values XW1, XWF' of the interferometers 31X1, 13FX, as indicated in equation (24) below, and the wafer stage is driven based the thus obtained X-coordinate XW'.

$$XW'=(XW1+XWF)/2 \qquad (24)$$

Since the spacing between the measuring beams LWX1, LWX2 is equal to the spacing between the measuring beams BFX, LWX1, the X-coordinate of the wafer stage that is obtained according to equation (24) rather than equation (20) is less likely to be affected by deflection or warp, if any, of the mirror 7X.

The center of the exposure region 62 (optical-axis AX of the optical projection system 8) is spaced a distance IL from the optical axis of the alignment sensor 34 in the Y-direction, and this spacing IL represents a base line parameter of the Y-direction.

Also, the spacing between the center of the region 62 and the optical-axis of the sensor 34 in the X-direction (which is 0 in this embodiment) represents a base line parameter of the X-direction. Furthermore, observation regions 19R, 20R of the RA microscopes 19, 20 are set in the opposite end portions of the slit-like illuminated region 61 of FIG. 11(a), as viewed in the X-direction. Observation region 19W, 20W, that are in a conjugate relationship with the observation regions 19R, 20R are set in the opposite end portions of the slit-like exposure region 62 of FIG. 11(b) as viewed in the X-direction.

In FIG. 11(b), the mirror 7X and interferometers 13X1, 13X2, 13FX constitute a three-axis laser interferometric system for detecting the position of the wafer stage in the non-scanning direction and the mirror 7Y and interferometers 13Y1, 13Y2 constitute a two-axis laser interferometric system for detecting the position in the scanning direction. The X-coordinate XW (XW' during alignment) measured by the interferometers 13X1, 13X2, and the Y-coordinate YW measured by the interferometers 13Y1, 13Y2 are defined in a coordinate system referred to as coordinate system (XW, YW) of the wafer stage. Although this coordinate system may also differ to some extent from an ideal rectangular coordinate system designed with orthogonal X-axis and Y-axis, the scanning and stepping of the wafer 5 are conducted based on the coordinate system (XW, YW) of the wafer stage. Where correction based on the orthogonal error $\Delta\omega W$ represented by equation (23) is not conducted, for example, stepping of the Xθ-axis drive stage 4, along with the wafer 5, in the scanning direction is performed in a direction parallel to the reflecting surface of the mirror 7X (i.e., in the direction in which the X-coordinate XW does not change). Stepping of the stage 4 in the non-scanning direction is performed in a direction parallel to the reflecting surface of the mirror 7Y (i.e., in the direction in which the Y-coordinate YW does not change).

The coordinate system of the reticle stage is coordinated or associated with the coordinate system of the wafer stage by use of the reference mark plate 6. To this end, a plurality of alignment marks are formed on the reticle 12 and reference marks corresponding to the alignment marks and reference marks for measurement of the base line are formed on the reference mark plate 6.

FIG. 13(a) is a plane view showing the reticle 12. In FIG. 13(a), a frame-like shield zone 31 is formed around a rectangular pattern region at the center of the reticle 12.

Rough alignment marks 27, 28 in the form of straight lines are formed in the Y-direction, on the opposite sides of the shield zone 31, as viewed in the non-scanning direction (±X-direction). Each of the rough alignment marks 27 is crossed at its opposite ends. Between the shield zone 31 and the rough alignment marks 27, 28 fine alignment marks 29A–29D and 30A–30D are respectively formed and arranged in the Y-direction. In this case, the fine alignment marks 29A, 29D, 30A, 30D are located at four corners of an accurate rectangle and the fine alignment marks 29B, 29C, 30B, 30C are located symmetrically on the sides of the rectangle. Furthermore, each of the fine alignment marks 29A–29D, 30A–30D has a common configuration, as shown info FIG. 13(c), in which three-line shielding patterns are symmetrically arranged at four locations on a frame. Lateral lines of those crosses at the opposite end portions of the rough alignment marks 27, 28 pass through the centers of the fine alignment marks 29A, 29D and the centers of the fine alignment marks 30A, 30D, respectively. Although the reticle 12 of the present embodiment is moved in the Y-direction over a broad range, the fine alignment marks 29A–29D, 30A–30D can be easily detected by using the rough alignment marks 27, 28.

FIG. 13(b) illustrates the observation regions 19R, 20R of the RA microscopes 19, 20 of FIG. 1. In FIG. 13(b), the slit-like illuminated region 61 is positioned so as to touch a circular region 33R internally, which is conjugate with an effective exposure field of the optical projection system 8 of FIG. 1. The observation regions 19R, 20R are positioned in the vicinity of the opposite edges of the illuminated region 61 as viewed in the non-scanning direction. By moving the reticle in the Y-direction, the fine alignment marks 29D, 30D are located substantially at the centers of the observation regions 19R, 20R, respectively, as shown in FIG. 13(b). In this state, the reticle 12 is further moved in the Y-direction, so that the fine alignment marks 29C–29A, and 30C–30A are successively located substantially at the centers of the observation regions 19R, 20R.

FIG. 15(a) illustrates a reticle image 12W obtained by projecting the reticle 12 of FIG. 13(a) onto the reference mark plate 6 of FIG. 11(b). In FIG. 15(a), mark images 29AW–29DW, that are conjugate with the fine alignment marks 29A–29D, and mark images 30AW–30DW, that are conjugate with the fine alignment marks 30A–30D, are illustrated. Each of the mark images 29AW–29DW and 30AW–30DW is shaped such that patterns of three straight lines are arranged into the shape of a frame, as shown in FIG. 15(b).

FIG. 15(c) illustrates the location of the reference marks on the reference mark plate 6. On the reference mark plate 6 of FIG. 15(c), reference marks 35A–35D and 36A–36D are formed at substantially the same locations as the mark images 29AW–29DW and 30AW–30DW of FIG. 15(a). Namely, the reference marks 35A, 35D, 36A, 36D are located at corners of an accurate rectangle, and the other reference marks 35B, 35C, 36B, 36D are located symmetrically on the sides of the rectangle. The reference mark plate 6 is formed of a material, such as quartz, or glass ceramic, ZERODUR (SCHOTT BLASWERE TRADE MARK), which transmits light, and has a low coefficient of thermal expansion. These reference marks are illuminated by illuminating light having the same wavelengths as the exposure light, from the rear or bottom side of the reference mark plate 6, or from an illuminating system disposed within the reticle alignment microscopes 19, 29 above the reticle 12. In addition, a reference mark 37A is formed at a position that is spaced distance IL from the middle point of the reference marks 35A and 36A in the Y-direction as the scanning direction. This spacing IL is equal to the base line parameter of the Y-direction of the off-axis alignment sensor 34 of FIG. 1. Similarly, reference marks 37B, 37C and 37D are formed at positions that are spaced the distance IL in the Y-direction from the middle point of the reference marks 35B, 36B, middle point of reference marks 35C, 36C, and middle point of reference marks 35D, 36D, respectively.

As shown in FIG. 15(d), each of the reference marks 35A–35D has a pattern of straight lines of 7 columns and 7 rows and has a size that fits within each of the mark images 29AW–30DW as shown in FIG. 15(b). The reference marks 37A–37D are defined as grating points in a grating pattern formed at predetermined pitches in the X-direction and the Y-direction, as shown in FIG. 15(e).

The basic operations of the projection exposure, apparatus of the present embodiment when performing alignment, scanning exposure, and stepping will now be describe. Initially, reticle alignment is conducted using the reference mark plate 6 of FIG. 15(c). More specifically, the wafer Y-axis drive stage 2 and wafer X-axis drive stage 3, as shown in FIG. 1, are drive so that the reference marks 35A, 36A of the reference mark plate 6 are moved into the opposite observation regions 19W, 20W of the exposure region 62, as shown in FIG. 11(b) and brought to rest. The reticle Y-axis drive stage 10 is driven so that the fine alignment marks 29A, 30A on the reticle 12 of FIGS. 13(a)–(c) are moved into the opposite observation regions 19R, 20R of the illuminated region 61, as shown in FIG. 11(a). Then, positional deviations of the fine alignment marks 29A, 30A from the corresponding reference marks 35A, 36A are detected by the RA microscopes 19, 20, of FIG. 1. The article Y-axis drive stage 10 and reticle minute drive stage 11 are driven so that the centers of the images of the reference marks 35A, 36A are aligned with the centers of the fine alignment marks 29A, 30A, and the deviations of the alignment marks 29A and 30A, with respect to the images of the reference marks 35A, 36A, are made symmetrical with each other. In this manner, the position and rotation angle of the reticle 12 are adjusted on the basis of the reference mark plate 6. In this condition, measurement values of the 4-axis interferometer 14 on the side of the reticle stage and measurement values of the 5-axis interferometer 13 on the side of the wafer stage are reset (or set to 0), so as to correct offset of the origins of the coordinate system (XR, YR) of the reticle stage determined by equations (15) and (17) and the coordinate system (XW, YW) of the wafer stage determined by equations (20) and (21).

Before the actual exposure operation, the scanning direction of the Zθ-axis drive stage 4 of the wafer stage during scanning exposure is made parallel with the direction in which the reference marks are arranged on the reference mark plate 6. To this end, the direction of the array of the reference marks 35A–35D (the longitudinal direction of the reference mark 6) may be mechanically made parallel with the direction of the reflecting surface of the mirror 7X (running direction of the wafer stage). In the present embodiment, the angle of inclination of the running direction of the wafer stage, with respect to the direction of the reference mark plate 6 may be easily measured in a manner that will be described later. Where mechanical adjustment errors are still present, therefore, the scanning direction of the Zθ-axis drive stage 4 may be corrected by a software program so that each time the Y-coordinate YW of the wafer stage changes by a predetermined number of steps. The X-coordinate YW of the wafer stage changes by a predetermined number of steps. The X-coordinate XW changes only by an amount corresponding to the change in the Y-coordinate.

In the following description, a coordinate system with the Y-axis extending in the scanning direction corrected in this manner will be referred to as coordinate system (XW, YW) of the wafer stage. The Zθ-axis drive stage 4 on the side of wafer stage and the reticle minute drive stage 11 are then moved in synchronization with each other in the same manner as in a scanning exposure operation, with no exposure light incident on these stages. At the same time, positional deviations between the reference marks 35A–35D, on the reference mark plate 6, and the corresponding fine alignment marks 29A–29D, on the reticle 12, are successively determined by the RA microscopes 19, 20. Based on the average value of these positional deviations, the angle formed by the scanning direction of the reticle 2 and the scanning direction of the wafer 5, i.e., angle of rotation of the axis of the scanning direction between the coordinate system (XR, YR) of the reticle stage and the coordinates system (XY, YW) of the wafer stage, is detected. When the reticle 12 is scanned after detection of this rotation angle, the scanning direction of the reticle 12 is made to be parallel with the direction of the array of the reference marks on the reference mark plate 6 by the software program, by driving the reticle Y-axis drive stage 10 and the reticle minute drive stage 11. Thus, while the Y-coordinate YR is shifted by a given distance, the X-coordinate XR is laterally shifted by an amount corresponding to the change of the Y-coordinate.

In the following description, the coordinate system with the Y-axis extending in the scanning direction thus corrected will be referred to as coordinate system (XR, YR) of the reticle stage. Consequently, the axis of the scanning direction in the coordinate system (XW, YW) of the wafer stage is paralleled with that in the coordinate system (XR, YR) of the reticle stage, on the basis of the reference mark plate 6. Thus, the reticle 12 and wafer 5 are scanned in parallel directions in scanning exposure operations.

Therefore, movement of each stage is based on its guide face. When the projection exposure apparatus is assembled together and adjusted, the parallelism between the guide face of the reticle Y-axis drive stage 10 and the guide face of the wafer Y-axis drive stage 2 is mechanically controlled to be equal to or less than several hundreds of a micron ($\mu$) rad. Furthermore, the mirrors and reference mark plate 6 are fixed in position, with respect to these guide faces, so as to reduce the amount of the program correction made by driving each stage in the non-scanning direction during scanning exposure, thus assuring improved control accuracy. When the reticle 12 is actually mounted on the thus adjusted reticle minute drive stage 11, with the reticle 12 positioned based on its outline or contour, only the fine alignment marks 29A–30D on the reticle 12 may be substantially rotated, with respect to each mirror and the reference mark plate 6. In some cases a positional deviation between the contour of the reticle 12 and a pattern to be transferred may be as large as about 0.5 mm.

When the positional deviation between the contour of the reticle 12 of FIG. 11(a) and the pattern to be transferred is large, as described above, positional deviations between the fine alignment marks 29A–29D of the reticle 12 and the reference marks 35A–35D are measured as if the reticle 12 or reference mark plate 6 were largely rotated or offset relative to the other. Since the reference mark plate 6 is fixed to extend in parallel with the directions in which the mirrors 7X, 7Y extend, the correction is made by rotating or shifting the reticle minute drive stage 11. If the reticle minute drive stage 11 is rotated in this case, the mirror 21X is also rotated with the stage 11, and thus the mirror 21X is inclined with respect to the running direction of the reticle 12. Even with the mirror 21X is inclined with respect to the running direction of the reticle 12. Even with the mirror 21X thus inclined, the fine alignment marks 29A–29D on the reticle 12 are arranged parallel with the reference marks 35A–35D on the reference mark plate 6. The running direction of the reticle 12 and that of the wafer 5 are, therefore, manipulated to be parallel with each other during scanning exposure.

Subsequently, wafer alignment is performed so as to determine an array of shot areas of the wafer 5 on the coordinate system (XW, YW) of the wafer stage. As one example of the alignment, coordinates of wafer marks of a certain number of shot areas (sample shots) selected from the wafer 5 are measured using the alignment sensor 34, of FIG. 1. Coordinates of all of the shot areas arranged on the wafer 5 are calculated by statistically processing the measurement results according to EGA (enhanced global alignment) method. Also, a base-line measuring process (interval base line check) as will be described later, is carried out using the reference mark plate 6 so as to calculate a base line parameter of the alignment sensor 34 and store this amount in the main control system 22A. Based on the relationship among the coordinates of respective shot areas arranged on the wafer 5, the base line parameter of the alignment sensor 34, the coordinate system (XW, YW) of the wafer stage and the coordinate system (XR, YR) of the reticle stage, the shot area on the wafer 5 that is to be exposed is positioned at the scanning start position and the reticle 12 are also positioned at their corresponding positions.

The scanning exposure operations are performed after the wafer alignment based on the coordinate system (XW, YW) of the wafer stage and coordinate system (XR, YR) of the reticle stage, which are determined upon reticle alignment as described above. Since these coordinate systems were corrected by the software program, on the basis of the reflecting surfaces of the respective mirrors 7X, 7Y, 21X and corner cubes 21Y1, 21Y2, the shape of each shot area and the shot array are influence by shifts or changes in the positions of theses mirrors and others relative to the reticle 12 and wafer 5. In the present embodiment scanning exposure and stepping are performed as described below, so that accurate, rectangular short areas and a rectangular grid-like shot array can be formed even in such cases.

Suppose ($XR_0$, $YR_0$) represent coordinates of the coordinate system (XR, YR) of the reticle stage when the shot area to be exposed and the reticle are positioned, with respect to each other, by wafer alignment and ($XW_0$, $YW_0$) represent coordinates of the coordinate system (XW, YW) of the wafer stage obtained by the same alignment. With the projection magnification of the optical projection system 8 set to 1/M, synchronization errors $\Delta X$, $\Delta Y$ in the scanning direction and non-scanning direction between the reticle minute drive stage 11 and the Zθ-axis drive stage 4 after the wafer alignment, are represented by equations (25), (26) below. It is, however, to be noted that these synchronization errors are those as calibrated on the reticle 12. While the optical projection system 8, as shown in FIG. 1, is a reversal projection system, measurements of the interferometers on the side of the reticle stage and measurements of the interferometers on the side of the wafer stage are implemented in reverse directions, as shown in FIGS. 11(a)–(b). Therefore, the synchronization errors may be obtained simply by calculating differences of moving amounts as corrected by the magnification. However, as viewed in the scanning direction, the mirrors of both of the stages are located in the same direction and therefore, the signs of measurement values of the interferometers 14Y1, 14Y2 are determined so that the value are reduces as the distance between the reticle minute drive stage 11 and the interferometers 14Y1, 14Y2 is increased.

$$\Delta X = (XW - XW_0) \cdot M - (XR - XR_0) \quad (25)$$

$$\Delta Y = (YW - YW_0) \cdot M - (YR - YR_0) \quad (26)$$

In the present embodiment, a difference between the angle of rotation $\theta_{WX}$, as viewed in the non-scanning direction of the Z$\theta$-axis drive stage 4 as represented by equation (22), and the angle of rotation $\theta_{RX}$, as viewed in the non-scanning direction of the reticle minute drive stage 11 as represented by equation (16), is defined as a synchronization error $\Delta\theta$ in the rotating direction, as indicated by the following equation (27).

$$\Delta\theta = \theta_{WX} - \theta_{RX} \quad (27)$$
$$= (XW1 - XW2)/L3 - (XR1 - XR2)/L1$$

In the scanning exposure operation, the reticle Y-axis drive stage 10 and wafer Y-axis drive stage 2, as shown in FIG. 1, start to be accelerated and after these stages 10, 2 reach predetermined scanning speeds, synchronization control is performed by driving the reticle minute drive stage 11 so that each of the above-indicated synchronization errors $\Delta X$, $\Delta Y$ and $\Delta\theta$ becomes zero. After a lapse of a predetermined setting time in this state, the illuminated region 61 on the reticle 12 starts being irradiated with exposure light and an exposure operation is performed.

When the wafer 5 is stepped to the next shot area to expose this area to exposure light the stepping direction, of the Z$\theta$-axis drive stage in the non-scanning direction, is corrected by the orthogonal error $\Delta\omega W$ represented by equation (23), so as to maintain the rectangular grid-like shot array (in which the shot areas are arranged in orthogonal directions) even if the orthogonal relationship between the mirrors 7X, 7Y on the wafer stage has deteriorated.

Where the orthogonal error $\Delta\omega W$ represented by equation (23) or the orthogonal error $\Delta\omega R$ represented by equation (19) changes to a such an extent that it exceeds an allowable predetermined value, there may be a problem in either the accuracy of the base line parameter of the off-axis type alignment sensor 34 or its mechanical stability. Where the orthogonal error $\Delta\omega W$ or $\Delta\omega R$ changes to such an extent that it exceeds the allowed value, the reticle alignment or the base line check is performed again upon replacement of wafers. In this manner, the overlap accuracy between the pattern of the reticle and each shot area of the wafer can be improved.

Referring to the flow chart of FIG. 12, an example of the base line check (interval base line check) performed at regular intervals in the projection exposure apparatus of the present embodiment will now be described. In this embodiment, dynamic reticle alignment is also performed in parallel with the base line check.

Figure 12:
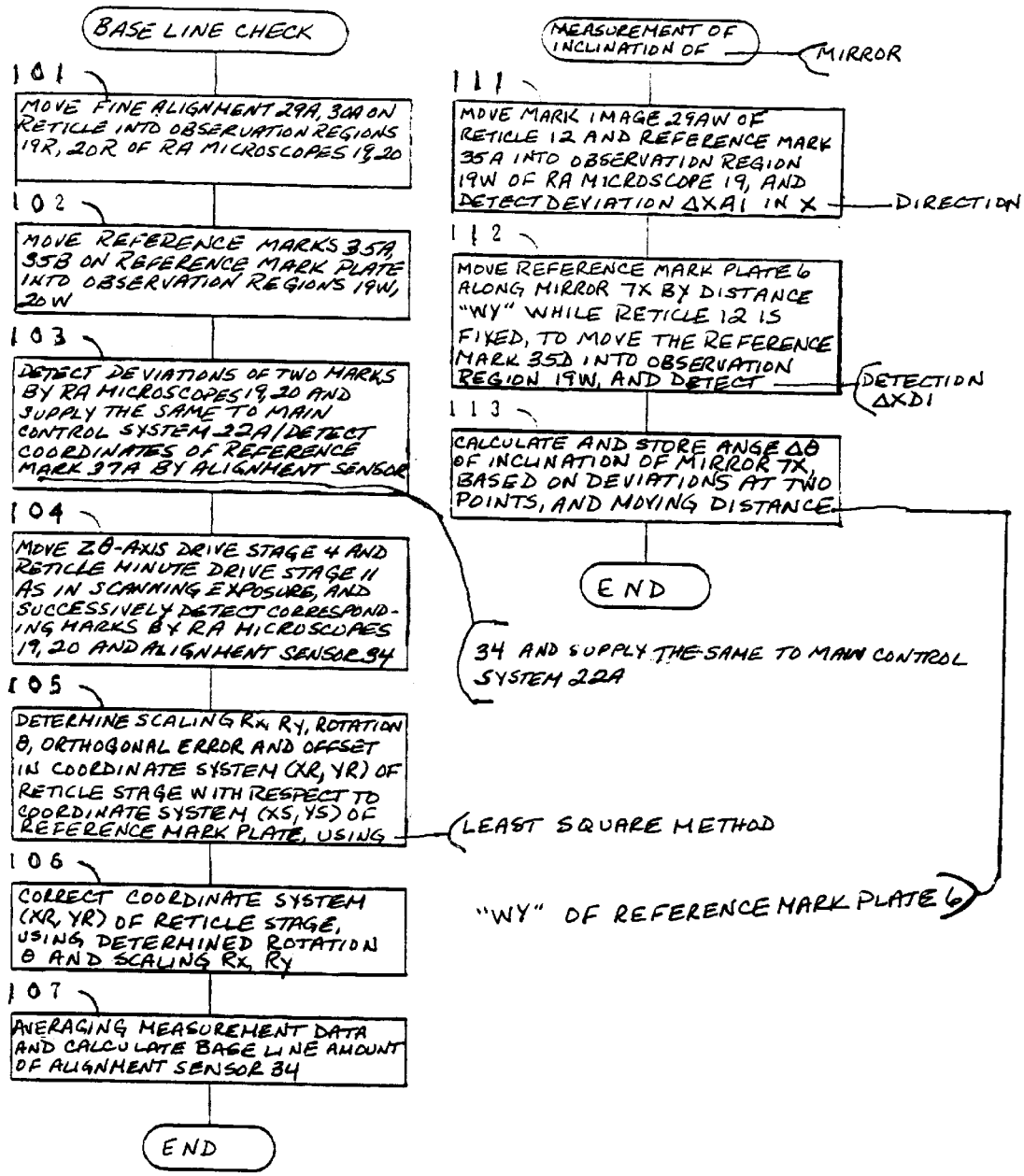
FIG. 12 is a flow chart illustrating one example of the operation of measuring a base line, and the operation of measuring an angle of inclination of the running direction of the wafer stage.
Figure 13:
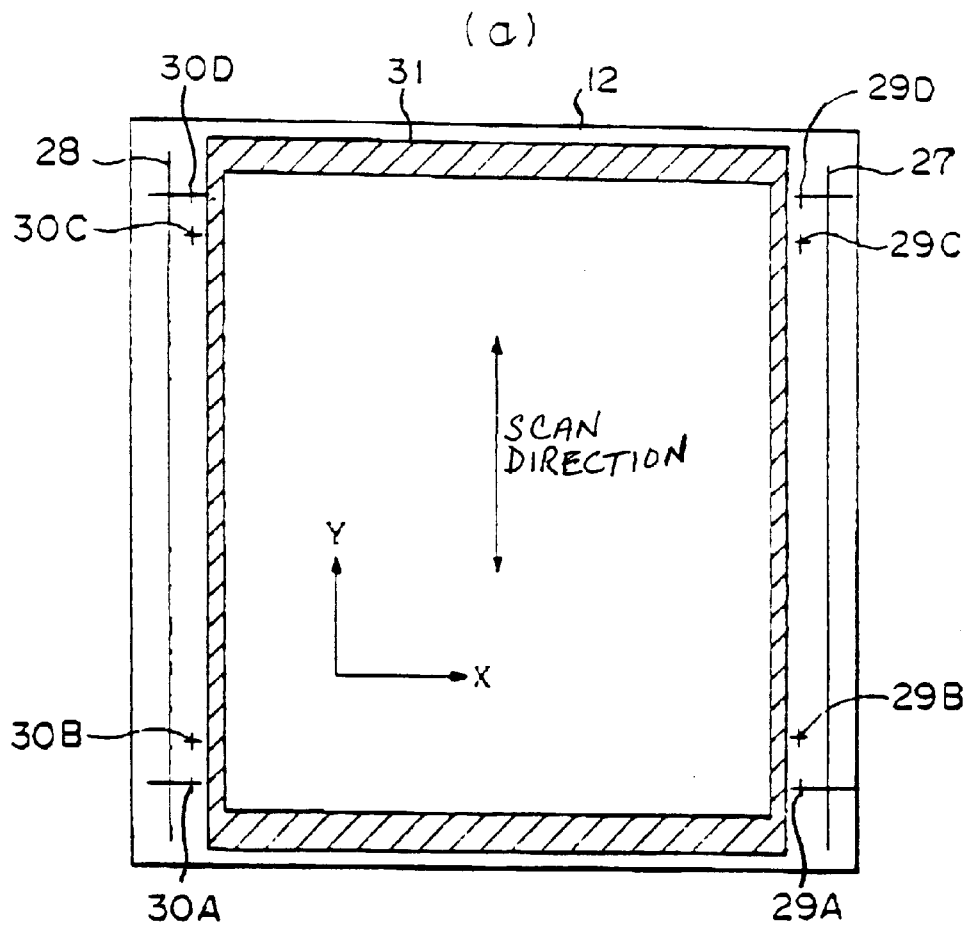
FIG. 13(a) is a plan view illustrating alignment marks of a reticle 12 of FIG. 1.
FIG. 13(b) is a plan view illustrating the relationship between observation regions of reticle alignment microscopes 19, 20 of FIG. 1 and the illuminated region on the reticle 12.
FIG. 13(c) is an enlarged plan view illustrating the configuration or pattern of each of fine alignment marks 29A–30D.
Figure 13:
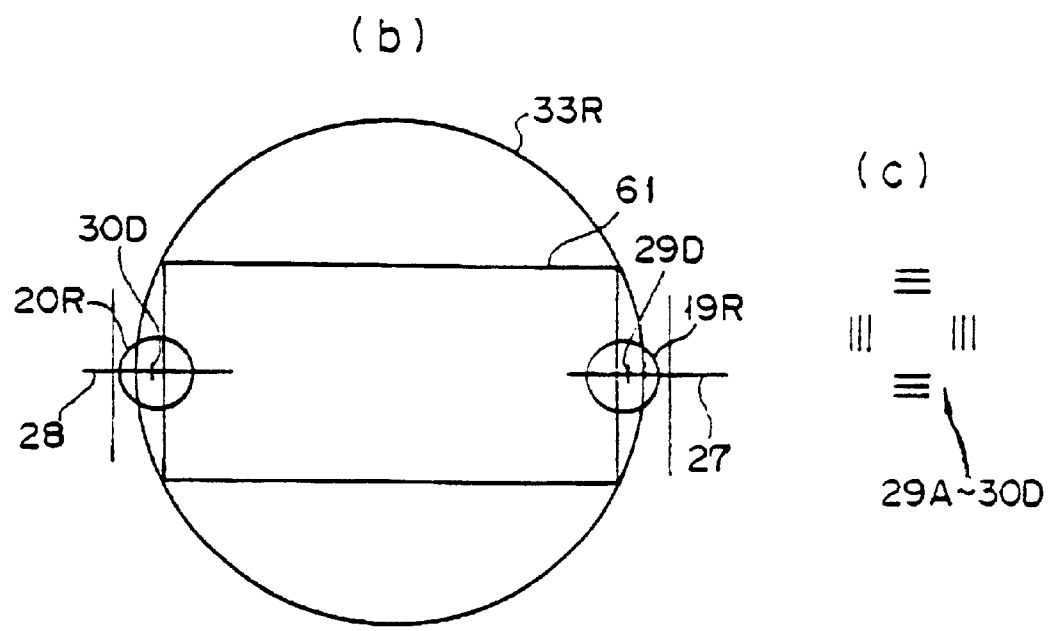
Figure 14:
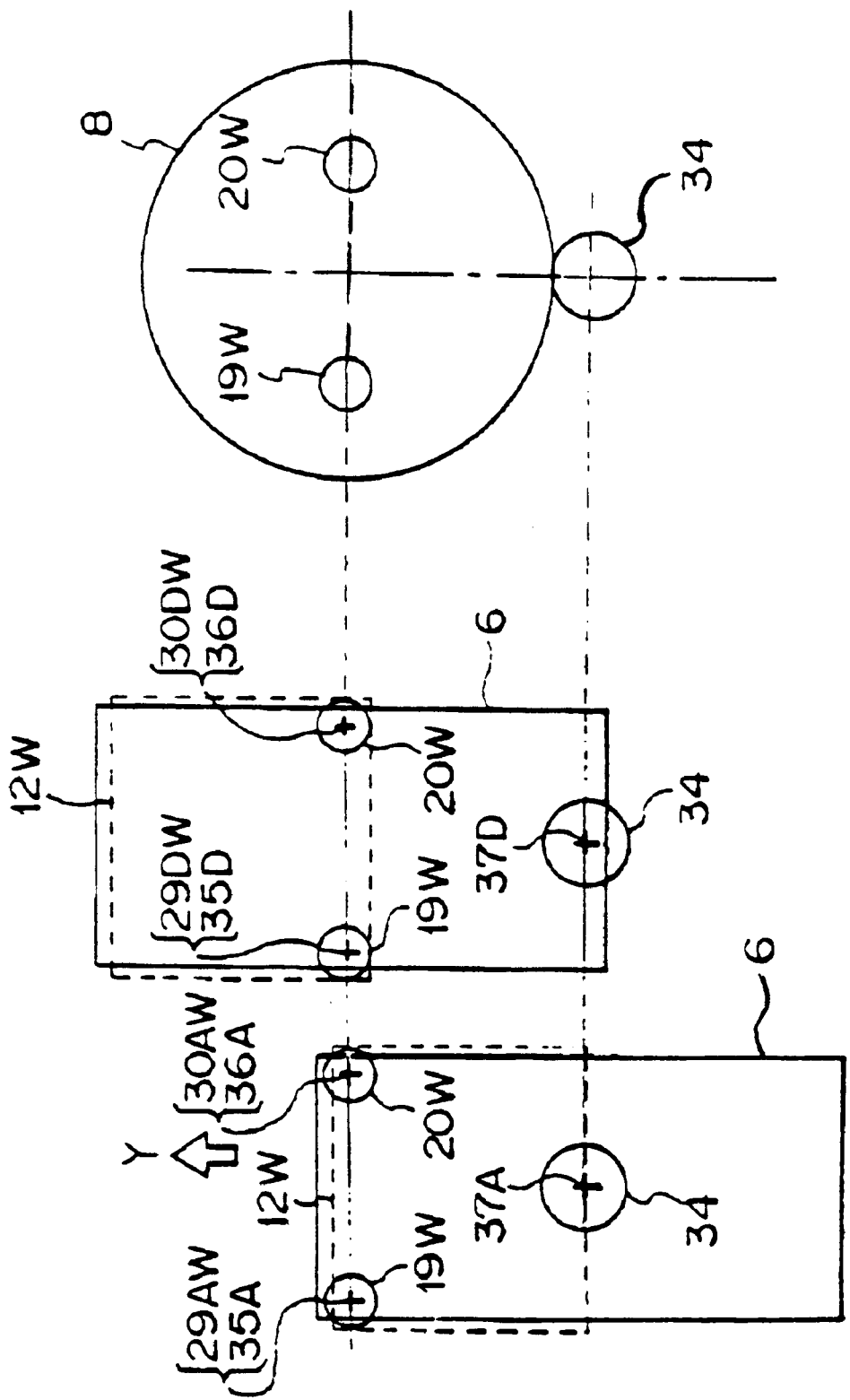
FIGS. 14(a)–(c) are explanatory views illustrating the positional relationships between the reference mark plate 6 and the reticle 12W when they are scanned relative to each other.
Figure 15:
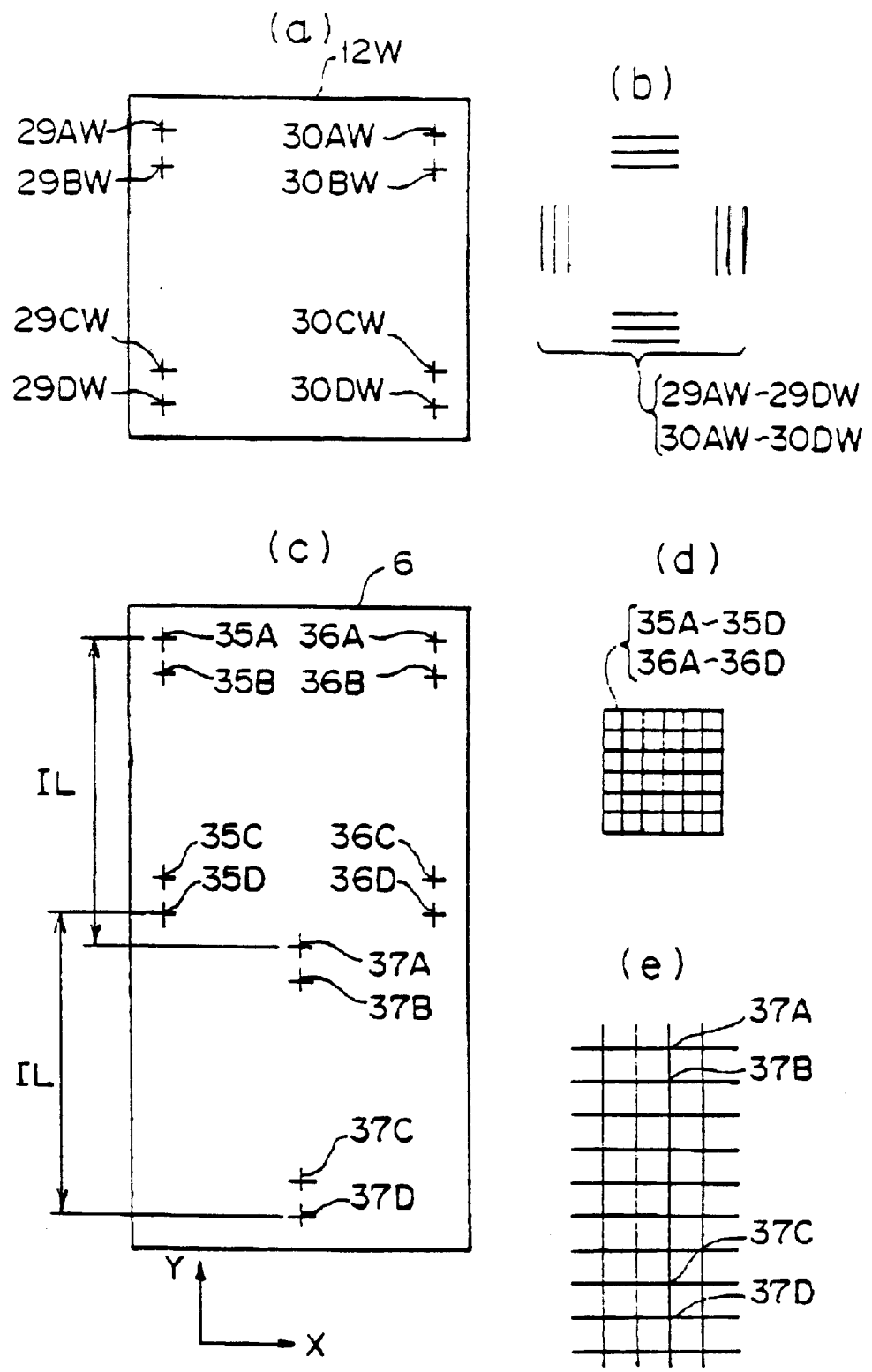
FIG. 15(a) is a plan view illustrating an image of the reticle 12 projected on the wafer stage.
FIG. 15(b) is an enlarged plan view illustrating an image of fine alignment marks projected on the reticle 12.
FIG. 15(c) is a plan view illustrating the array of reference marks on the reference mark plate 15.
FIG. 15(d) is an enlarged plan view illustrating the reference marks 35A–35D, 36A–36D.
FIG. 15(e) is an enlarged plan view illustrating reference marks 37A–37D.
Figure 16:
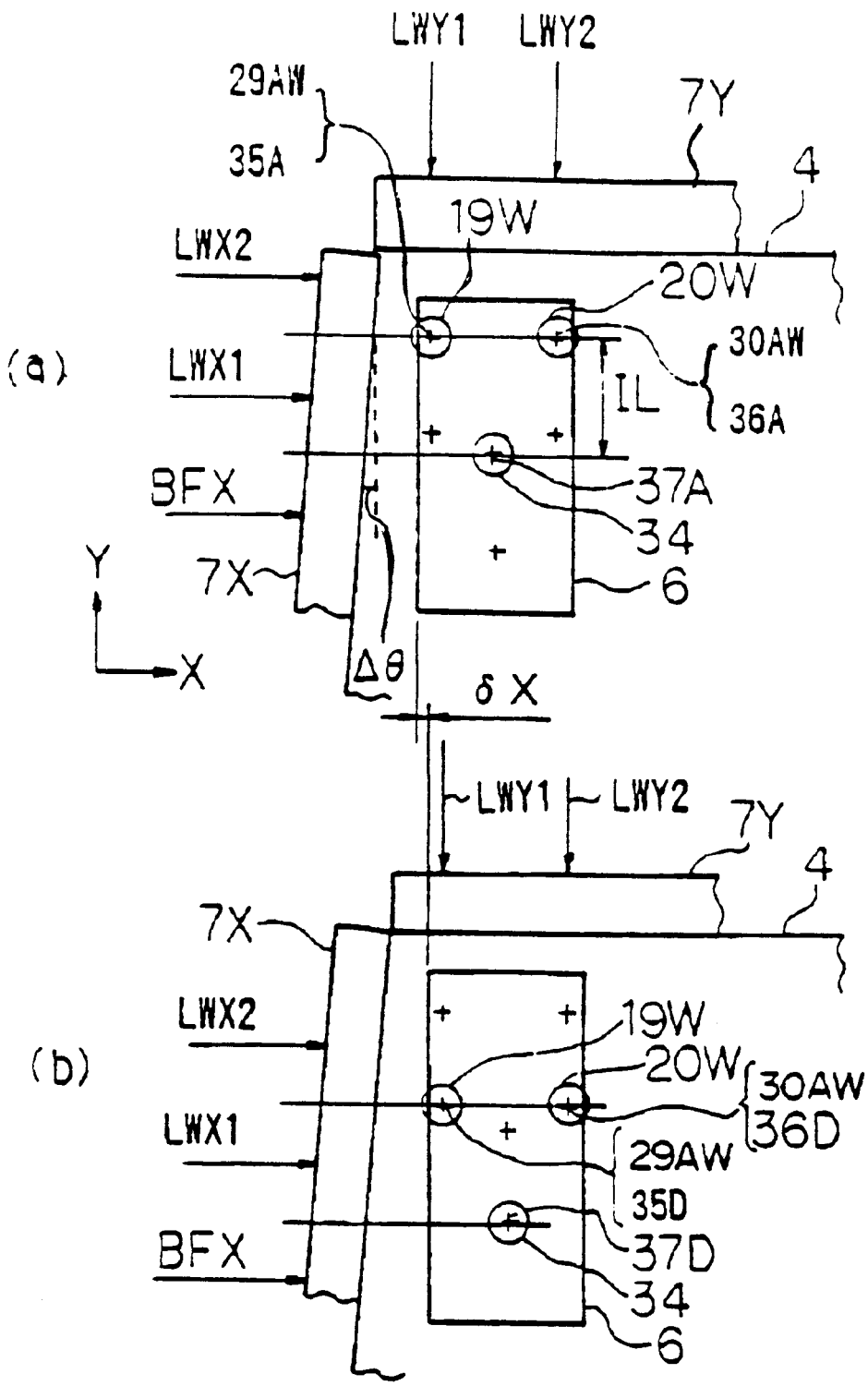
FIGS. 16(a) and (b) are views illustrating a method of measuring an inclination angle $\Delta\theta$ between a mirror 7X on the side of the wafer stage and the reference mark plate 6.

Initially, in step 101 of FIG. 12, the fine alignment marks 29A, 30A on the reticle 12 of FIG. 13(a) are moved into the respective observation regions 19R, 20R of the RA microscopes 19, 20 of FIG. 13(b). In the next step 102, the reference marks 35A, 36A on the reference mark plate 6 of FIG. 15(c) are moved into the respective observation regions 19W, 20W, as shown in FIG. 11(b), on the wafer stage, which regions are conjugate with the observation regions 19R, 20R, respectively.

FIG. 14(a) illustrates the state in which the marks of the reticle 12 and the reference marks on the reference mark plate 6 are moved into the corresponding observation regions. As shown in FIG. 14(a), the mark image 29AW and the reference mark 35A can be simultaneously observed within the observation region 19W and the mark image 30AW, and the reference mark 36A can be simultaneously observed within the observation region 20W. As shown in FIG. 14(c), the observation regions 19W, 20W are located in the positions that traverse the optical-axis in the exposure field of the optical projection system 8 and the reference mark 37A is contained in the observation region of the off-axis type alignment sensor 34. In step 103 images observed by the RA microscopes 19 and 20 are converted into image signals are then processed to calculate a positional deviation of the mark image 20AW from the reference mark 35 and to calculate a positional deviation of the mark image 30AW from the reference mark 36A. The thus obtained positional deviations are then supplied to the main control system 22A of FIG. 1. Simultaneously, the off-axis alignment sensor 34 captures an image of the reference mark 37A and processes the image signal to obtain a positional deviation of the reference mark 37A from the center of detection (e.g., center of index mark), which deviation is then fed to the main control system 22A.

In step 104, the Z$\theta$-axis drive stage 11 of FIG. 11(b) is moved in +Y-direction and the reticle minute drive stage 11 of FIG. 11(a) is moved in the Y-direction in synchronization with the movement of the Z$\theta$-axis drive stage 4 in the same manner as in the scanning exposure operation. In fact, the Z$\theta$-axis drive stage 4 is moved in a direction in which the value of the coordinate XW in the coordinate system (XW, YW) of the wafer stage does not change, and the reticle minute drive stage 11 is moved in a direction in which the value of the coordinate XR in the coordinate system (XR, YR) of the reticle stage does not change. In this manner, the reference mark plate 6 and reticle image 12W are both moved in +Y-direction, as shown in FIG. 14(b). Since the observation regions 19W, 20W of the RA microscopes 19, 20 and the observation region of the off-axis type alignment sensor 34 are fixed, the mark images and reference marks are successively moved into the observation regions 19W, 20W and the observation region of the alignment sensor 34 in the order from a group of marks with the letter "A" (mark images 29AW, 30AW, and reference marks 35A, 36A, 37A) to a group of marks with the letter "D" (mark images 29DW, 30DW and reference marks 35D, 36D, 37D). When each of a group of marks with the letter "B", a group of marks with the letter "C", and the group of marks with the letter "D" enters the observation regions 19W, 20W and observation region of the alignment sensor 34, the Z$\theta$-axis drive stage 4 and reticle minute drive stage 11 are stopped and the position of each mark is detected.

If the state of FIG. 14(a) is referred to as the first rest position, the second rest position is established when the group of marks with the letter "B", mark images 29BW, 30BW of FIG. 15(a), and reference marks 35B, 36B, 37B of FIG. 6(c), are present in the observation regions 19W, 20W and observation region of the alignment sensor 34. In this position the RA microscopes 19, 20 obtain positional deviations of the mark images 29BW, 30BW from the reference marks 35B, 36B and supply the results to the main control system 22A. The alignment sensor 34 then obtains a positional deviation of the reference mark 37B and supplies the result to the main control system 22A. The same sequence is repeated with respect to the third rest position and the fourth rest position the state depicted in FIG. 14(b), so that the positions of the group of marks with the letter "C" (mark images 29CW, 30CW and reference marks 35C, 36C, 37C), and those of the group of marks with the letter "D" are measured by the RA microscopes 19, 20 and alignment sensor 34. The positional deviations in the coordinate system of the wafer stage, which are measured by the RA microscopes 19, 20 with respect to eight mark images 29AW–30DW, are represented as $(\Delta Xn, \Delta Yn)(n=1-8)$. Positional deviations from the center of detection in the coordinate system of the wafer stage, which are measured by the alignment sensor 34 with respect to four reference marks, are represented as $(\Delta Axi, \Delta Ayi)(i=1-4)$.

In step 105, dynamic reticle alignment is performed by processing obtained measurement data. In the present embodiment, reticle alignment is carried out on the basis of a coordinate system (hereinafter called "coordinate system of reference mark plate") that is determined by the direction of the array of the reference marks on the reference mark plate 6 of FIG. 15(c), so as to improve the measurement accuracy. For example, the coordinate system of the reference mark plate 6 consists of a coordinate system (XS, YS) having the axis of abscissas (which will be called "XS-axis") that is a straight line passing the reference marks 35A and 36A of the reference mark plate 6, and the axis of ordinates (which will be called "YS-axis") that is a straight line passing the reference marks 35A and 35D. In equation (29) below, Rx, Ry represent ratios of scaling (linear expansion) in XS-direction and YS-direction of the coordinate system (XR, YR) of the reticle stage as projected on the reference mark plate 6, with respect to the coordinate system (XS, YS) of the reference mark plate, θ represents the angle of rotation, ω represents an orthogonal error, and Ox, Oy represents offsets in XS-direction and YS-direction. The rotation θ in this case is the angle of rotation of the YR-axis of the coordinate system of the reticle stage when projected onto the YS-axis, namely, rotational error in the scanning direction of the reticle stage. The rotation θ corresponds to the relative rotation angle θ2 of the present invention.

In addition, (Dxn, Dyn)(n=1–8) represent coordinates of a coordinate system designed by projecting the coordinate system of the reticle stage of FIG. 15(a) defining the mark images 29AW–30DW onto the reference mark plate 6, and (Exn, Eyn) represent coordinates on the coordinate system (XS, YS) defining the corresponding reference marks 35A–36D. Then, coordinates (Dxn', Dyn') of the mark images 29AW–30DW actually measured on the coordinate system (XS, YS) of the reference mark plate 6 will be approximately obtained according to the following equation (28), using the positional deviations $(\Delta Xn, \Delta Yn)$ measured by the RA microscopes 19, 20.

$$Dxn' = Exn + \Delta Xn$$

$$Dyn' = Eyn + \Delta yn \tag{28}$$

In this case, the coordinates (Fxn, Fyn) of the mark images 29AW–30DW on the coordinate system (XS, YS) of the reference mark plate, which are given by calculation based on the above six conversion parameters (Rx, Ry, θ, ω, Ox, Oy) and the coordinates (Dxn, Dyn) of the mark images 29AW–30DW as designed, are represented as follows $$\begin{bmatrix} Fxn \\ Fyn \end{bmatrix} = \begin{bmatrix} Rx & -Rx \cdot (\omega + \theta) \\ Ry \cdot \theta & Ry \end{bmatrix} \begin{bmatrix} Dxn \\ Dyn \end{bmatrix} + \begin{bmatrix} Ox \\ Oy \end{bmatrix} \tag{29}$$

Differences between the coordinates (Fxn, Fyn) in XS-direction and YS-direction of the mark images 29AW–30DW given by calculation and the actually measured coordinates (Dxn', Dyn'), non-linear errors (εxn, εyn), are represented as follows.

$$\begin{bmatrix} exn \\ eyn \end{bmatrix} = \begin{bmatrix} Fxn \\ Fyn \end{bmatrix} - \begin{bmatrix} Dxn' \\ Dyn' \end{bmatrix} \tag{30}$$

Then, the main control system 22A of FIG. 1, determines the values of the above-indicated six conversion parameters Rx, Ry, κ, ω, Ox, Oy, using the least square method. Thus, the sum of squares of the non-linear errors (εxn, εyn), with respect to the eight mark images 29AW–30DW, is minimized.

In step 106, a new coordinate system (XR, YR) of the reticle stage is established that has coordinates obtained by multiplexing the coordinates of the coordinate system (XR, YR) of the reticle stage by the determined scaling Rx, Ry, and is obtained by rotating the coordinate system (XR, YR) of the reticle stage so that the determined rotation θ becomes 0. After execution of this step, the reticle minute drive stage 11 is scanned or moved along the new coordinate system. This means that the reticle 12 is scanned so that the fine alignment marks 29A–29D of FIG. 13(a) are moved along the direction of the array of the reference marks 35A–35D on the reference mark plate 6 of FIG. 15(c). The offsets OX, Oy need not be corrected since they are corrected during wafer alignment. Also, particular correction is not needed for the orthogonal error ω.

As a result, the pattern of the reticle 12 is scanned along the reference marks 35A–36D located in a rectangular shape on the reference mark plate 6 and a shot area exposed on the wafer is formed into an accurate rectangular shape. Furthermore, even where the angle formed by the mirror 7X on the side of the wafer stage and the reference mark plate 6 is changed, the reticle pattern is scanned based on the reference marks on the reticle mark plate 6 without being influenced by such a change of the angle.

In step 107, the main control system 22A processes positional deviations $(\Delta Xn, \Delta Yn)$ (n=1–8) measured by the RA microscopes 19, 20 and positional deviations $(\Delta Axi, \Delta Ayi)$ (i=1–4) measured by the alignment sensor 34, so as to calculate a base line amount (BX, BY) in the X-direction and the Y-direction of the alignment sensor 34. Specifically, the base line amount (BX1, BY1) with respect to the group of marks with the letter "A", is represented by equation (31), where $(\Delta X1, \Delta Y1)$, $(\Delta X2, \Delta Y2)$ represents positional deviations of the mark images 29AW, 30AW from the reference marks 35A, 36A of FIG. 15(c) and $(\Delta AX1, \Delta Ay1)$ represents a positional deviation measured by the alignment sensor 34 with respect to the corresponding reference mark 37A.

$$BX1 = (\Delta X1 + \Delta X2)/2 - \Delta AX1 \tag{31}$$

$$BY1 = IL + (\Delta Y1 + \Delta Y2)/2 - \Delta AY1$$

Similarly, the base line parameters (BX2, BY2)–(BX4, BX4) are calculated with respect to the other three groups of marks. Then, the obtained four based line parameters are averaged, to obtain the base line parameter (BX, BY) in the X-direction and the Y-direction of the alignment sensor 34. Thus, the base line parameter is obtained by averaging measurement data for the four groups of marks, thereby assuring high accuracy in measurement of the base line parameters.

In the present embodiment, the base line parameter is obtained no on the basis of measurement values of the laser interferometers, but by using the reference mark plate 76 as the "basis for length measurement." Since the reference mark plate 6 is formed of a material, such as quartz or glass ceramic, having a low coefficient of thermal expansion, the base line parameter can be measured with a high accuracy without suffering from influences of turbulence of the air as experienced by the laser interferometers.

In the present embodiment, the positions of a plurality of the reference marks 37A–37D are detected by the alignment sensor 34, so as to improve the averaging effect. If the alignment sensor 34 has a sufficiently high measurement accuracy, however, the base line parameter of the alignment sensor 34 may be obtained only based on measurement data with respect to one reference mark 37A.

When the base line parameter is obtained from measurement data of the plural reference marks 37A–37D, an error arises in the base line parameter BX in the X-direction if the angle formed by the mirror 7X on the side of the wafer stage and the reference mark plate 6 is changed in FIG. 11(b). It is therefore desirable to measure the angle of inclination of the mirror 7X with respect to the direction of the array of the reference marks in advance and correct the base line based on this angle of inclination.

FIG. 16(a) illustrates when the mirror 7X on the side of the wafer stage is inclined with respect to the reference mark plate 6. In FIG. 16(a), the direction in which the reflecting surface of the mirror 7X extends (running direction of the Zθ-axis drive stage 4) is inclined clockwise by an angle Δθ, with respect to the direction in which the reference marks are arranged on the reference mark plate 6. This inclination angle Δθ corresponds to the relative rotation angle θ1 of the present invention. The reference marks 35A, 36A, 37A are respectively observed in the observation regions 19W, 20W of the RA microscopes and the observation region of the alignment sensor 34. If the Zθ-axis drive stage 4 position, as shown in FIG. 7(a), is moved in +Y-direction by a distance WY along the mirror 7X, the stage 4 is placed in the position as showing FIG. 16(b). The reference marks 35D, 36D, 37D are observed in the observation regions 19W, 20W and the observation region of the alignment sensor 34.

In the state depicted in FIG. 16(b), a shift amount δX of the Zθ-axis drive stage 4 in X-direction is approximately calculated according to the following equation (32).

$$\delta X = \Delta\theta \cdot WY \qquad (32)$$

Since the reticle 12 is scanned in the direction in which the reference marks are arranged on the reference mark plate 6, the actual base line parameter BX4' is obtained by subtracting the above shift amount δX from the base line parameter BX4 in X-direction, which is obtained from measurement date of the reference marks 35D, 36D, 37D (BX4-δX). Similarly, the base line parameters in the X-direction are corrected with respect to the other groups of marks (35B, 36B, 37B) and (35C, 36C, 37C) of FIG. 15(c), and the final base line parameter is obtained by averaging the thus corrected base line parameters.

Referring to the flow chart of FIG. 12, an example of the method for measuring the angle θ of inclination of the mirror 7X with respect to the reference mark plate 6 will be now described.

In step 111 of FIG. 12, the reticle minute drive stage 11 is driven so that the image 29AW of the fine alignment mark 29A on the reticle 12 is moved into the observation region 19W of the RA microscope 19, as shown in FIG. 16(a), and then the reticle minute drive stage 11 is brought to rest. In this state, the Zθ-axis drive stage 4 is driven so that the reference mark 35A on the reference mark plate 6 is moved into the observation region 19W and the RA microscope 19 detects a positional deviation ΔXA1 of the reference mark 35A in X-direction with respect to the mark image 29AW, and supplies the detected deviation to them and control system 22A.

In the next step 112, the Zθ-axis drive stage 4 (reference mark plate 76) is moved by the distance WY along the mirror 7X while the reticle 12 is kept at rest, so that the reference mark 35D is moved into the observation region 19W, as shown in FIG.16(b). Then, the RA microscope 19 detects a positional deviation ΔXD1 of the reference mark 35D in the X-direction with respect to the mark image 29AW, and supplies the detected deviation to the man control system 22A. In response to this, step 113 is executed in which the main control system 22A calculates the angle Δθ of inclination of the mirror 7X, with respect to the reference mark plate 6 according to equation (33), based on the positional deviations ΔXA1 at two points and distance WY, and stores the calculated inclination angle Δθ in a memory portion of the main control system 22A. By using the stored inclination angle Δθ in equation (32), an error depending on the inclination angle Δθ is corrected.

$$\Delta\theta = (\Delta XA1 - \Delta XD1)/WY \qquad (33)$$

In scanning exposure operations, the Zθ-axis drive stage 4 of the wafer stage is scanned in the direction of the array of the reference marks on the reference mark plate 6, so as to cancel the inclination angle Δθ. Also, the stepping from one shot area to another in the scanning direction is carried out in the direction of the array of the reference marks, and the stepping in the non-scanning direction is carried out in a direction perpendicular to the direction of the array. Thus, a shot array having a rectangular grid-like shape can be obtained even if the angle formed by the mirror 7X and reference mark plate 5 is varied. In this case, the scanning direction of the Zθ-axis drive stage 4 may be corrected to that each time the Zθ-axis drive stage 4 is moved a predetermined distance in the Y-direction, the position of the stage 4 in the X-direction is corrected by a corresponding amount. The position of the Zθ-axis drive stage may be easily controlled by this driving method.

Since the distance WY used for measuring the above inclination angle Δθ is short, it is desirable to repeat the measurement of steps 111–113 a plurality of times and average these measurement results.

It is also possible to perform a sequence of measuring the angle of inclination of the mirror, only when the orthogonal error ΔωW, calculated according to equation (23) using the measurement data of the four-axis laser interferometer on the side of the wafer stage, is greater than a predetermined allowed value. To calculate the inclination angle Δθ with higher accuracy, reference marks for this measurement may be formed on the opposite ends of the reference mark plate 6 in the scanning direction, so that the distance WY used in equation (33) can be increased. In this manner, the inclination angle Δθ can be obtained with a high accuracy without measuring the angle a plurality of times.

In the present embodiment, during an interval base line check, reticle alignment and measurement of the base line parameter can be carried out at high speeds. Furthermore, a sequence of measuring the inclination angle Δθ may be executed only when the orthogonal error ΔωW becomes large and there is a possibility of drift of the inclination angle Δθ of the mirror 7X, so that the base line parameter can be measured with a high accuracy without lowering the throughput in the exposure step.

Although the angle of inclination of the mirror 7X on the side of the wafer stage with respect to the reference mark plate 6 is measured in the illustrated embodiment, the angle of inclination of the pattern on the reticle with respect to the running direction of the reticle stage (the direction parallel with the reflecting surface of the mirror 21X) may be also measured. To this end, in a step corresponding to step 111 of FIG. 12, after the reference mark 35A on the reference mark plate 6, is moved into the observation region 19W of the RA microscope 19 and the reference mark plate 6 is brought to rest, as shown in FIG. 16(a), the mark image 29AW of the reticle 12 is moved into the observation region 19W. A position deviation of the mark image 29AW, from the reference mark 35A, is then measured by the RA microscope 19.

In the next step corresponding to step 112, the reticle minute drive stage 11 is driven along the mirror 21X of FIG. 11(a) a predetermined distance, so that the mark image 29DW of FIG. 15(a), is moved into the observation region 19W and a positional deviation of the image 29DW is measured by the RA microscope 19. A difference between the positional deviations, measured at two points, is then divided by the predetermined distance so as to calculate the angle of inclination $\Delta\theta_R$ of the direction in which the fine alignment marks 29A and 29D are arranged (namely, the direction in which the pattern on the reticle 12 extends) with respect to the running direction of the reticle minute drive stage 11. This inclination angle $\Delta\theta_R$ corresponds to the relative rotation angle $\theta 3$ of the present invention.

In this case, the dynamic reticle alignment is performed in advance so as to correct the rotation angle of the reticle minute drive stage 11 so that the direction of the pattern on the reticle 12 is parallel with the direction of the array of the reference marks on the reference mark plate 6. In the following scanning exposure operation the reticle minute drive stage 11 is scanned along the direction of the pattern on the reticle 12 so as to cancel the inclination angle $\Delta\theta_R$. Thus, the rotation of each shot area (shot rotation) on the wafer is eliminated and an accurately rectangular shot region located in a rectangular grid-like shot array is exposed. Also, in this case, the scanning direction of the reticle minute drive stage 11 may be corrected so that each time the reticle minute drive stage 11 is moved a predetermined distance in the Y-direction, the position of the stage 11 in the X-direction is corrected by a corresponding amount.

Referring to FIGS. 17(a)–(b), another embodiment of the present invention will now be described. In this embodiment the mirrors on the side of the wafer stage and the reference mark plate are formed as an integral unit, so as to prevent appearance of the angle $\Delta\theta$ of inclination of the mirror 7X. While a projection exposure apparatus similar to that shown in FIG. 1 and FIGS. 2(a) and (b) is used in the present embodiment. The structure of the Z$\theta$-axis drive stage of the wafer stage is different from that of the apparatus of the previous embodiment.

FIG. 17(a) is a plan view illustrating the construction of the upper part of a wafer stage of the projection exposure apparatus according to the present embodiment and FIG. 17(b) is a side view of this wafer stage. As shown in FIG. 17(a), a wafer 5 is mounted on a Z$\theta$-axis drive stage 4A corresponding to the Z$\theta$-axis drive stage 4 of FIG. 1. X-axis mirror 41X, consisting of a plane parallel glass plate and extending in the Y-direction, and Y-axis mirror 41Y, consisting of a parallel glass plate and extending in the X-direction, are fixed to end faces of the Z$\theta$-axis drive stage 4A that face in the X-direction in +Y-direction, respectively. The mirrors 41X, 41Y used in this embodiment are formed of glass ceramic (for example, _____ available from _____ may be used) having a low coefficient of thermal expansion. Outer side faces of these mirrors 41X, 41Y provide respective reflecting surfaces. The upper surfaces of the mirrors 41X, 41Y are flush with the surface of the wafer 5. Furthermore, a plurality of reference marks are formed on the upper surfaces of the mirrors 41X, 41Y by deposition of chromium.

A straight-line pattern 42X parallel with the reflecting surface of the mirror 41X and a reference pattern 35A, 35D, 36A, 36D, 37A, 37D, having the same configuration and arrangement as the reference pattern on the reference mark plate 6, of FIG. 15(c), are formed on the mirror 41X. On the mirror 41Y are formed a straight-line pattern 42Y parallel with the reflecting surface of the mirror 41Y and a crossed reference pattern 43X, 44X that are arranged with the same spacing as that of the observation regions 19W, 20W of the RA microscopes 19, 20, of FIG. 11(b). The X-axis mirror 41X is irradiated with measuring beams LWX1, LWX2, BFX emitted by three interferometers 13X1, 13X2, 13FX (not shown in FIGS. 17(a)–(b)) of FIG. 11(c) and is also irradiated with a measuring beam LTX emitted by an additional interferometer 13TX. The measuring beam LTX passes the middle position of two measuring beams LWX1, LWX2 as viewed in the Y-direction. While the three measuring beams LWX1, LWX2, BFX have the same height (the same position in the Z-direction), the height of the measuring beam LTX is shifted from that of the other three beams by a distance "H", as shown in FIG. 17(b).

Figure 17:
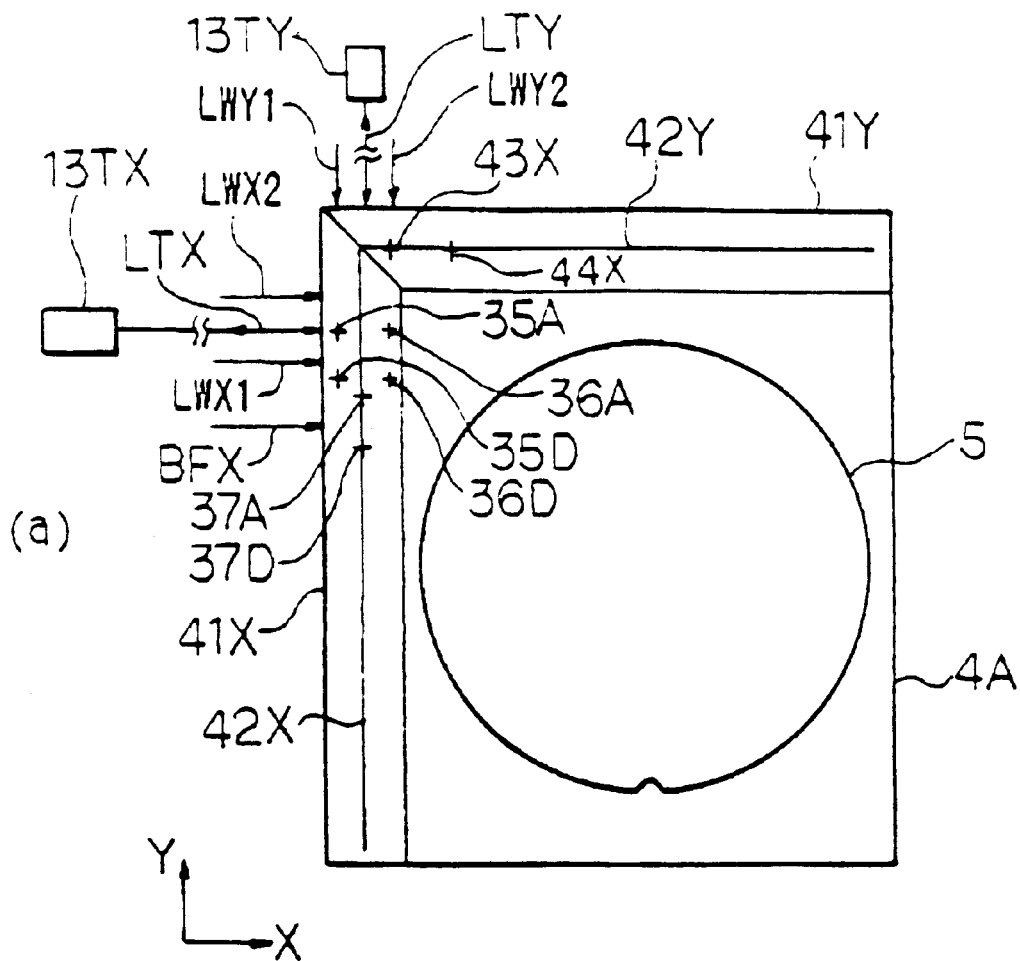
FIG. 17(a) is a plan view illustrating a principal part of a wafer stage of a projection exposure apparatus used in another embodiment of the present invention.
FIG. 17(b) is a side view of FIG. 17(a).
Figure 17:
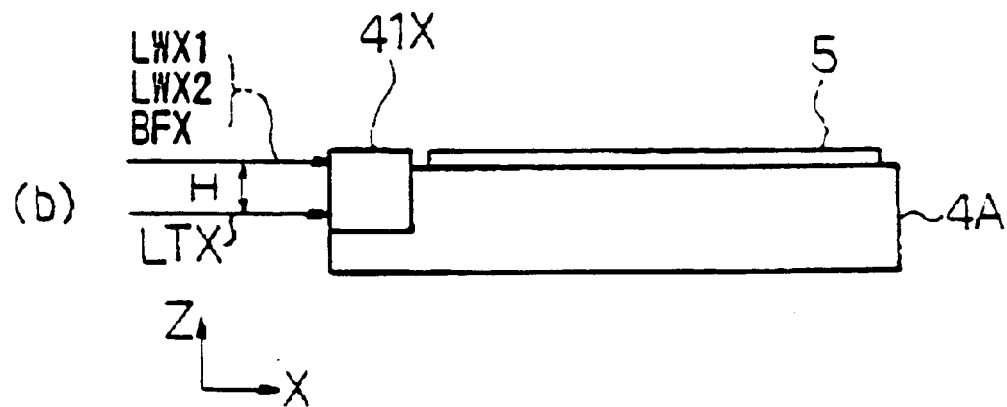

Y-axis mirror 41X is irradiated with measuring beams LWY1, LWY2 emitted by two interferometers 13Y1, 13Y2 of FIG. 11(c)(not shown in FIGS. 17(1)–(b)), and is further irradiated with a measuring beam LTY emitted by an additional interferometer 13TY that is located at the middle position of these interferometers 13Y1, 13Y2. Like the measuring beam LTX, the height of the measuring beam LTY is shifted from that of the other measuring beams LWY1, LWY2 by the distance "H". The other construction of the present embodiment is identical with that of FIG. 1 and FIGS. 11(a)–(b), and thus will not be explained.

In measuring the base line parameter in the present embodiment, the reference marks 35A, 36A on the mirror 41X of FIG. 17(a) are observed by the RA microscopes 19, 20, of FIG. 1, and at the same time the reference 37A is observed by the alignment sensor 34 of FIG. 1, so as to measure positional deviations of the respective marks. Then, the Z$\theta$-axis drive stage 4A and reticle minute drive stage 11 are moved so that positional deviations corresponding to the reference marks 35D, 36D, 37D on the mirror 41X are measured by the RA microscopes 19, 20 and alignment sensor 34. Since the mirror 41X also serves as a reference mark plate in this case, the direction of the reflecting face of the mirror 41X and the direction of the array of the reference marks will not change even if the wafer stage is deformed by heat. Accordingly, the base line parameter can be measured with a high accuracy.

When the amount of deflection of the mirror 41X is measured, the straight-line pattern 42X on the mirror 41X is moved to the position on which the mark image 29AW of the reticle of FIG. 15(a) is projected. The RA microscope 19, of FIG. 1, measures a positional deviation of the straight-line pattern 42X from the mark image 29AW. Then, the Z$\theta$-axis drive stage 4A is moved along the mirror 41X, and, in this stage, a change in the positional deviation of the straight-line pattern 42X from the mark image 29AW can be measured by the RA microscope 19. In this case, the amount of deflection of the mirror 41X may be directly and easily measured. The other RA microscope 20, of FIG. 1, or the alignment sensor 34 may be used for measurement of the amount of deflection of the mirror. Similarly, the amount of deflection of the Y-axis mirror 41Y also may be easily measured using the straight-line pattern 42Y.

In the present embodiment a change in the orthogonal relationship between the mirror 41X and the mirror 41Y also can be measured. Upon assembling and adjustment of the apparatus, the mirror 41X and mirror 41Y are brought into a relationship having a certain range of orthogonality. In this state, the reference marks 43X, 44X on the mirror 41Y of FIG. 17(a) are observed by the RA microscopes 19, 20, of FIG. 1, so as to detect respective positional deviations of these marks 43X, 44Y from given reference points. A difference of the positional deviations of these two marks is obtained and stored. Therefore, after each predetermined time the RA microscopes 19, 20 detect a difference of the positional deviations of the reference marks 43X, 44X. The result of the detection is divided by the spacing between the observation regions of the RA microscopes 19, 20. In this manner, an orthogonal error due to a change in the angle of inclination of the mirror 41Y can be detected.

In the present embodiment the upper faces of the mirrors 41X, 41Y and the surface of the wafer 5 need to be the same height. In this case, since the height of the measuring beams LWX1. LWY1 and others are not equal to the height of the surface of the wafer 5, a measurement error called Abbe error may arise due to pitching or rolling of the Zθ-axis drive stage 4A. To correct this measurement error the interferometers 13TX, 13TY are configured as tiH interferometers in the present embodiment. More specifically, where XW1, XW2, XTW represented values of the X-coordinates measured by the measuring beams LWX1, LWX2, LTX, respectively, and YW1, YW2, YTW represent values of the Y-coordinates measured by the measuring beams LWY1, LWY2, LTY, respectively, the angel Tθx (which will be called "tilt angle") of rolling of the Zθ-axis drive stage 4A about the Y-axis during scanning exposure and the angle Tθy (tilt angle) of pitching of the stage 4A about X-axis are represented as follows.

$$T\theta x = \{(XW1 + XW2)/2 - XTW\}/H \quad (34)$$

$$T\theta y = \{(YW1 + YW2)/2 - YTW\}/H$$

Although the X-coordinate of the Zθ-drive stage 4A during normal exposure is represented as (XW1+XW2)/2 before it is corrected, a value of (Tθx·H/2), is added to this coordinate to give a new coordinate and a value of (Tθ·H/2), is added to the Y-coordinate so as to correct or eliminate the Abbe error.

In the embodiment of FIGS. 17(a)–(b), the mirror 41X serves as a mirror and a reference mark plate. When the mirror 7X and reference mark plate 6 of FIG. 11(b) are used, the mirror 7X and reference mark plate 6 may be directly joined to each other to provide almost the same effect as described above.

It will be apparent to those skilled in the art that various modifications and variations can be made in the scanning exposure apparatus and method of the present invention without departing from the spirit or scope of the invention. Thus, it is intended that the present invention cover the modifications and variations of this invention disposed they come within the scope of the appended claims and their equivalents.

What is claimed is:

1. A scanning exposure apparatus that sequentially transfers a pattern formed on a mask onto a substrate by scanning the mask and the substrate in synchronization with each other in scanning directions different from each other, with scanning velocity different from each other while a part of the pattern on the mask that is illuminated by an exposure light is projected onto the substrate or a substrate stage, the scanning apparatus, comprising:

at least a one-axis interferometric system, which is disposed on a side of a substrate, and which measures a position of a substrate stage in a scanning direction;

a plural-axis interferometric system, which is disposed on the side of the substrate, and which measures a position of a substrate stage in a non-scanning direction while the substrate stage is moving in the scanning direction, wherein the non-scanning direction is substantially perpendicular to the scanning direction, and wherein the plural-axis interferometric system measures the position of a substrate in the non-scanning direction at plural measurement points of the substrate stage that are spaced apart in the scanning direction, the plural-axis interferometric system outputs measurement values for each measurement points; and a rotation angle controller, which is electrically connected to the plural-axis interferometric system, and which corrects a relative rotation angle of the substrate stage and a mask stage based on the measurement values for said each measurement points of the plural-axis interferometric system.

2. The scanning exposure apparatus of claim 1, further comprising:

a second one-axis interferometric system, which is disposed on the side of the substrate, and which cooperates with the at least a one-axis interferometric system to measure the position of the substrate stage in the scanning direction at two points of the substrate stage that are spaced apart in the non-scanning direction; and a moving direction controller that corrects a moving direction of the substrate stage, based on a difference between measurement values of the plural-axis interferometric system for measuring the position of the substrate stage in the non-scanning direction and measurement values of the at least a one-axis interferometric system and the second one-axis interferometric system for measuring the position of the substrate stage in the scanning direction.

3. The scanning exposure apparatus according to claim 2, further comprising:

a positional discriminator that measures a positional relationship between the mask stage and the substrate stage when a difference of measurement values, measured by a plural-axis interferometric system for measuring the position of each one of the substrate stage and the mask stage in a non-scanning direction that is substantially perpendicular to the scanning direction, exceed a predetermined threshold value.

4. The scanning exposure apparatus according to claim 1, further comprising:

a positional discriminator that measures a positional relationship between the mask stage and the substrate stage when a difference of measurement values measured by a plural-axis interferometric system for measuring the position of each one of the substrate stage and the mask stage in a non-scanning direction that is substantially perpendicular to the scanning direction, exceeds a predetermined threshold value.

5. A scanning exposure apparatus that sequentially transfers a pattern formed on a mask onto a substrate by scanning the mask and the substrate in synchronization with each other in scanning directions different from each other, with scanning velocity different from each other while a part of the pattern on the mask that is illuminated by an exposure light is projected onto the substrate or a substrate stage, the scanning apparatus comprising:

a plural-axis interferometric system, which is disposed on a side of a substrate, and which measures a position of a substrate stage in a non-scanning direction perpendicular to a scanning direction while the substrate stage is moving in the scanning direction, wherein the plural-axis interferometric system measures the position of the substrate in the non-scanning direction at two points of the substrate stage that are spaced apart in the scanning direction, the plural-axis interferometric system outputs measurement values for each measurement points;

a plural-axis interferometric system, which is disposed on the side of a mask, and which measures a position of the mask stage in the non-scanning direction perpendicular to the scanning direction while the mask stage is moving in the scanning direction, wherein the plural-axis interferometric system measures the position of the mask in the non-scanning direction at plural measurement points of the mask stage which are spaced apart in the scanning direction, the plural-axis interferometric system outputs measurement values for each measurement points; and a rotating angle controller, which is electrically connected to the plural-axis interferometric system on the side of the substrate and the plural-axis interferometric system on the side of the mask, and which controls a relative rotation angle between the substrate stage and the mask stage based on the measurement values for said each measurement points of the plural-axis interferometric system on the side of the substrate and the measurement values for said each measurement points of the plural-axis interferometric system on the side of the mask.

6. The scanning exposure apparatus according to claim 5, further comprising:

a positional discriminator that measures a positional relationship between the mask stage and the substrate stage when a difference of measurement values measured by a plural-axis interferometric system for measuring the position of each one of the substrate stage and the mask stage in a non-scanning direction that is substantially perpendicular to the scanning direction, exceeds a predetermined threshold value.

7. A scanning exposure apparatus, comprising:

a first plural-axis interferometric system that measures a position of one of a substrate stage and a mask stage in a scanning direction, wherein the plural-axis interferometric system measures the position at two points of one of the stages, the position being spaced apart in a non-scanning direction that is perpendicular to the scanning direction, the first plural-axis interferometric system outputs measurement values for each measurement points;

a second plural-axis interferometric system that measures a position of the corresponding one of the substrate stage or the mask stage in the non-scanning direction while one of the stages is moving in the scanning direction, wherein the second plural-axis interferometric system measures the position at two points of the corresponding one of the stages that are spaced apart in the scanning direction, the second plural-axis interferometric system outputs measurement values for each measurement points;

a mirror deflection amount calculator which is electrically connected to the first and second plural-axis interferometric systems, and which detects an angle of rotation of the corresponding one of the substrate stage and the mask stage, based on a difference of measurement values for said each measurement points of the first plural-axis interferometric system, and which calculates an amount of deflection of a mirror of the second plural-axis interferometric system, based on the detected angle of rotation, and a difference of measurement values for said each measurement points of the second plural-axis interferometric system; and a stage controller which is electrically connected to said mirror deflection amount calculator, and which controls the stage operation during scanning exposure operation based on the calculated mirror deflection amount.

8. The scanning exposure apparatus according to claim 7, further comprising:

a positional discriminator that measures a positional relationship between the mask stage and the substrate stage when a difference of measurement values measures by a plural-axis interferometric system for measuring the position of each one of the substrate stage and the mask stage in a non-scanning direction that is substantially perpendicular to the scanning direction, exceeds a predetermined threshold value.

9. A scanning exposure method for sequentially transferring a pattern on a mask onto each shot area on a photosensitive substrate, by scanning the mask and the substrate in synchronization with each other in corresponding scanning directions while a part of the pattern on the mask illuminated by exposure light is projected onto the substrate on a substrate stage, wherein a plurality of measurement marks are formed on the mask along the scanning direction thereof, and a reference mark member on which a plurality of reference marks are formed is disposed on the substrate stage, the reference marks having substantially a same positional relationship with the plurality of measurement marks, the exposure method comprising the steps of:

successively measuring a positional deviation of each of the plurality of measurement marks on the mask from a corresponding one of the plurality of reference marks on the reference mark member while moving the substrate stage in the scanning direction thereof;

detecting a relative rotation angle $\theta 1$ between a direction of an array of the plurality of reference marks and a running direction of the substrate stage, based on results of the positional deviation measurement; and successively measuring a positional deviation of each of the plurality of measurement marks on the mask from a corresponding one of the plurality of reference marks on the reference mark member while moving the mask and the substrate in synchronization with each other in the corresponding scanning directions, and detecting a relative rotation angle $\theta 2$ between the scanning direction of the mask and the scanning direction of the substrate stage, based on results of the measurement, wherein a stepping direction of the substrate stage is determined based on information of the relative rotation angle $\theta 1$, and the scanning direction of the mask is determined based on information of the relative rotation angle $\theta 2$.

10. A scanning exposure method for sequentially transferring a pattern on a mask onto each shot area on a photosensitive substrate, by scanning the mask and the substrate in synchronization with each other in corresponding scanning directions while a part of the pattern on the mask illuminated by an exposure light is projected onto the substrate on a substrate stage, wherein a plurality of measurement marks are formed on the mask along the scanning direction thereof, and a reference mark member on which a plurality of reference marks are formed is disposed on the substrate stage, the reference marks having substantially the same positional relationship with the plurality of measurement marks, the scanning exposure method comprising the steps of:

successively measuring a positional deviation of each of the plurality of measurement marks on the mask from a corresponding one of the plurality of reference marks on the reference mark member while moving the substrate stage in the scanning direction thereof;

detecting a relative rotation angle $\theta 1$ between a direction of an array of the plurality of reference marks and a running direction of the substrate stage, based on results of the positional deviation measurement; and successively measuring a positional deviation of each of the plurality of measurement marks on the mask from a corresponding one of the plurality of reference marks on the reference mark member while moving the mask and the substrate in synchronization with each other in the corresponding scanning directions and detecting a relative rotation angle $\theta 2$ between the scanning direction of the mask and the scanning direction of the substrate stage, based on results of the positional deviation measurement, wherein an angle of rotation of the mask is corrected based on a difference between the relative rotation angle $\theta 1$ and the relative rotation angle $\theta 2$.

11. A scanning exposure method for sequentially transferring a pattern on a mask onto each shot area on a photosensitive substrate, by scanning the mask and the substrate in synchronization with each other in corresponding scanning directions while a part of the pattern on the mask illuminated by an exposure light is projected onto the substrate on a substrate stage, wherein a plurality of measurement marks are formed on the mask along the scanning direction thereof, and a reference mark member on which a plurality of reference marks are formed is disposed on the substrate stage, the reference marks having substantially the same positional relationship with the plurality of measurement marks, the scanning exposure method comprising the steps of:

successively measuring a positional deviation of each of the plurality of measurement marks on the mask from a corresponding one of the plurality of reference marks on the reference mark member while moving the substrate state in a scanning direction thereof;

detecting a relative rotation angle $\theta 1$ between a direction of an array of the plurality of reference marks and a running direction of the substrate stage, based on results of the positional deviation measurement, and successively measuring a positional deviation of each of the plurality of measurement marks on the mask from a corresponding one of the plurality of reference marks on the reference mark member while scanning the mask in the scanning direction and detecting a relative rotation angle $\theta 3$ between a direction of an array of the plurality of measurement marks and a running direction of the mask, based on results of the measurement, wherein correcting a position of the substrate stage during scanning exposure, based on the relative rotation angle $\theta 1$; and correcting a position of the mask during scanning exposure, based on the relative rotation angle $\theta 3$.

12. A scanning exposure method for sequentially transferring a pattern on a mask onto each shot area on a photosensitive substrate, by scanning the mask and the substrate in synchronization with each other in corresponding scanning directions while a part of the pattern on the mask illuminated by an exposure light is projected onto the substrate on a substrate stage through an optical projection system, wherein an off-axis alignment system is disposed in a vicinity of the optical projection system, for detecting a positioning mark on the substrate, and a plurality of measurement marks are formed on the mask along a scanning direction thereof, while a reference mark member on which first and second reference marks are formed is disposed on the substrate stage, the first and second reference marks being spaced apart from each other by a distance corresponding to a spacing between a reference point in an exposure field of the optical projection system and a reference point of the off-axis alignment system, the scanning exposure method comprising the steps of:

moving a mask in a scanning direction thereof while a second reference mark on a reference mark member is being observed by an off-axis alignment system, and successively measuring a positional deviation of each of a plurality of measurement marks on a mask from a first reference mark on the reference mark member; and calculating a spacing between a reference point in an exposure field of the optical projection system and a reference point of the off-axis alignment system, based on an average value of a positional deviation of each of the plurality of measuring marks from the first reference mark, a relative rotation error of the mask with respect to the scanning direction, which is calculated based on the positional deviation of each the measurement marks, and a shift of the second reference mark observed by the off-axis alignment system.

13. A scanning exposure method for sequentially transferring a pattern on a mask onto each shot area on a photosensitive substrate, by scanning the mask and the substrate in synchronization with each other in corresponding scanning directions while a part of the pattern on the mask illuminated by an exposure light is projected onto the substrate on a substrate stage through an optical projection system, wherein an off-axis alignment system is disposed in a vicinity of the optical projection system, for detecting positioning marks on the substrate, and a plurality of measurement marks are formed on the mask along a scanning direction thereof, and wherein a reference mark member is disposed on the substrate stage, the reference mark member having a plurality of first reference marks corresponding to the plurality of measurement marks on the mask, and a plurality of second reference marks that are spaced from the respective first reference marks by a distance corresponding to a spacing between a reference point in an exposure field of the optical projection system and a reference point in the off-axis alignment system, the method comprising the steps of:

measuring a positional deviation of one of the plurality of measurement marks on the mask from a corresponding one of first reference marks on the reference mark member, and simultaneously measuring positional deviations of second reference marks by the off-axis alignment system, while moving the mask and a substrate in synchronization with each other in their scanning directions, and repeating the positional deviation measuring with respect to each of a plurality of first reference marks on the reference mark member; and correcting a relative rotation error between the corresponding scanning directions of the mask and the substrate, based on the positional deviation obtained with respect to each of the plurality of first and second reference marks, and correcting a relative rotation angle between a direction of an array of the first and second reference marks on the reference mark member and the scanning direction of the substrate stage.

14. A scanning exposure method for sequentially transferring a pattern on a mask onto each shot area on a photosensitive substrate, by scanning the mask and the substrate in synchronization with each other in corresponding scanning directions while a part of the pattern on the mask illuminated by an exposure light is projected onto the substrate on a substrate stage through an optical projection system, wherein an off-axis alignment system is disposed in a vicinity of the optical projection system, for detecting positioning marks on the substrate, and a mirror for measuring a coordinate position is fixed to the substrate stage, while a plurality of measurement marks are formed on the mask along the scanning direction thereof, and wherein a plurality of first reference marks corresponding to the plurality of measurement marks on the mask are formed on an upper face of the mirror, and a plurality of second reference marks are formed with a spacing from the respective plurality of first reference marks, which spacing corresponds to a spacing between a reference point in an exposure field of the optical projection system and a reference point of the off-axis alignment system, the exposure method comprising:

measuring a positional deviation of one of the plurality of measurement marks on the mask from a corresponding one of first reference marks on a mirror, and simultaneously measuring positional deviations of second reference marks by an alignment system, while moving the mask and a substrate in synchronization with each other in corresponding scanning directions, and repeating the positional deviation measuring with respect to each of the plurality of first reference marks on the mirror; and correcting a relative rotation error between the corresponding scanning directions of the mask and the substrate, based on the positional deviation obtained with respect to each of the plurality of first and second reference marks, and correcting a spacing between a reference point in an exposure field of the optical projection system and a reference point of the alignment system.

15. A scanning exposure apparatus that sequentially transfers a pattern formed on a mask onto a substrate by scanning the mask and the substrate in synchronization with each other in corresponding scanning directions different from each other, with scanning velocity different from each other while a part of the pattern on the mask that is illuminated by an exposure light is projected onto the substrate on a substrate stage, the scanning apparatus comprising:

a mask stage that moves in the scanning direction while holding the mask; and a first plural-axis interferometric system, which is disposed on a side of the mask, and which measures a position of the mask stage in a non-scanning direction perpendicular to the scanning direction while the mask stage is moving in the scanning direction, wherein the first plural-axis interferometric system measures positions of the mask in the non-scanning direction at plural measurement points of the mask stage at the same time which are spaced apart in the scanning direction, and the first plural-axis interferometric system outputs measurement values for each measurement points.

16. The scanning exposure apparatus according to claim 15, wherein the respective measurement points of the first plural-axis interferometric system are disposed apart from each other in the scanning direction with the center of an illuminated area of the exposure light on the mask located in between the measurement points.

17. The scanning exposure apparatus according to claim 15, further comprising:

a rotation angle controller, which is electrically connected to the first plural-axis interferometric system, and which controls a rotation angle of the mask stage based on a measurement value of the first plural-axis interferometric system.

18. The scanning exposure apparatus according to claim 17, wherein the rotation angle controller comprises:

a plurality of actuators respectively connected to the side surfaces of the mask stage in J the scanning direction to drive the mask stage between a plurality of positions separated from each other in the non-scanning direction.

19. The scanning exposure apparatus according to claim 15, further comprising:

a second plural-axis interferometric system, which is disposed on a side of the mask, and which measures the position of the mask stage in the scanning direction, wherein the second plural-axis interferometric system measures the position of the mask in the scanning direction at two measurement points of the mask stage which are spaced apart from each other in the non-scanning direction.

20. The scanning exposure apparatus according to claim 19, further comprising:

a mirror deflection amount calculator, electrically connected to both the first plural-axis interferometric system and the second plural-axis interferometric system, which detects an angle of rotation of the mask stage based on a difference of measurement values of the second plural-axis interferometric system, and which calculates an amount of deflection of a mirror of the first plural-axis interferometric system based on the detected angle of rotation as well as a difference of measurement values of the first plural-axis interferometric system.

21. The scanning exposure apparatus according to claim 19, wherein the respective measurement points of the second plural-axis interferometric system are disposed apart from each other in the non-scanning direction with the center of an illuminated area of the exposure light on the mask located in between the measurement points.

22. The scanning exposure apparatus according to claim 15, further comprising:

a third plural-axis interferometric system, which is disposed on the side of the substrate, and which measures the position of the substrate stage in the non-scanning direction, wherein the third plural-axis interferometric system measures the position of the substrate in the non-scanning direction at two measurement points of the substrate stage which are spaced apart in the scanning direction, and a rotation angle controller, which is electrically connected to the first plural-axis interferometric system and the third plural-axis interferometric system, and which controls a relative rotation angle between the mask stage and the substrate stage based on measurement values of the first plural-axis interferometric system and the third plural-axis interferometric system.

23. A scanning exposure method for sequentially transferring a pattern formed on a mask onto a substrate by scanning the mask and the substrate in synchronization with each other in corresponding scanning directions different from each other, with scanning velocity different from each other while a portion of the pattern on the mask illuminated by an exposure light is projected onto the substrate on a substrate stage, the method comprising the steps of:

moving a mask stage in the scanning direction, the mask stage holding the mask; and simultaneous measuring positions of the mask stage in a non-scanning direction perpendicular to the scanning direction using a first plural-axis interferometric system disposed on a non-scanning side of the mask stage while the mask stage is moving in the scanning direction, at plural measurement points of the mask stage which are spaced apart in the scanning direction, and outputting measurement values for each measurement points.

24. The scanning exposure method of claim 23, further comprising the step of controlling a rotation angle of the mask stage on the basis of measurement values of the first plural-axis interferometric system.

25. The scanning exposure method of claim 23, further comprising the step of measuring the position of the mask in the scanning direction using a second plural-axis interferometric system disposed in the scanning direction of the mask stage.

26. The scanning exposure method of claim 25, further comprising the steps of:

detecting a rotation angle of the mask stage on the basis of the difference in the measurement values of the second plural-axis interferometric system; and calculating the amount of deflection of a mirror included in the first plural-axis interferometric system and extending along the scanning direction on the basis of the detected rotation angle as well as the difference in the measurement values of the first plural-axis interferometric system.

27. The scanning exposure method of claim 25, further comprising the steps of:

measuring the position of the substrate stage in the non-scanning direction using the third plural-axis interferometric system disposed on the side of the substrate in the non-scanning direction; and controlling the relative rotation angle between the mask stage and the substrate stage on the basis of measurement values of the first plural-axis interferometric system and the third plural-axis interferometric system.

28. A method of transferring a pattern formed on a mask onto a substrate comprising the steps of:

scanning the mask and the substrate in synchronization with each other in corresponding scanning directions different from each other, with scanning velocity different from each other;

projecting a portion of the pattern on the mask onto the substrate by illuminating the portion of the pattern on the mask with an exposure light;

moving a mask stage holding the mask in the scanning direction; and simultaneous measuring positions of the mask stage in a non-scanning direction perpendicular to the scanning direction using a first plural-axis interferometric system disposed on a non-scanning side of the mask stage while the mask stage is moving in the scanning direction, at plural measurement points of the mask stage which are spaced apart in the scanning direction, and outputting measurement values for each measurement points.

29. A method for manufacturing a scanning exposure apparatus that sequentially transfers a pattern formed on a mask onto a substrate by scanning the mask and the substrate in synchronization with each other in corresponding scanning directions different from each other, with scanning velocity different from each other while a part of the pattern on the mask illuminated by an exposure light is projected onto the substrate on a substrate stage, the method comprising the steps of:

providing a mask stage that moves in the scanning direction while holding the mask;

providing a first plural-axis interferometric system which is disposed on a side of the mask; and taking simultaneous measurements of the position of the mask while the mask stage is moving in the scanning direction, using the first plural-axis interferometric system, in the non-scanning direction perpendicular to the scanning direction at plural measurement points of the mask stage which are spaced apart in the scanning direction, and the first plural-axis interferometric system outputs measurement values for each measurement points.

* * * * *